United States Patent
Woo et al.

(10) Patent No.: US 9,871,149 B2
(45) Date of Patent: Jan. 16, 2018

(54) SOLAR CELL AND SOLAR CELL MODULE

(71) Applicant: LG ELECTRONICS INC., Seoul (KR)

(72) Inventors: Taeki Woo, Seoul (KR); Daehee Jang, Seoul (KR); Bojoong Kim, Seoul (KR); Minpyo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 307 days.

(21) Appl. No.: 14/524,620

(22) Filed: Oct. 27, 2014

(65) Prior Publication Data
US 2015/0114453 A1  Apr. 30, 2015

(30) Foreign Application Priority Data

Oct. 29, 2013 (KR) ........................ 10-2013-0129415

(51) Int. Cl.
*H01L 31/0224* (2006.01)
*H01L 31/05* (2014.01)
*H01L 31/048* (2014.01)
*H01L 31/068* (2012.01)

(52) U.S. Cl.
CPC .... *H01L 31/022441* (2013.01); *H01L 31/048* (2013.01); *H01L 31/05* (2013.01); *H01L 31/0516* (2013.01); *H01L 31/0682* (2013.01); *Y02E 10/52* (2013.01); *Y02E 10/547* (2013.01)

(58) Field of Classification Search
CPC . H01L 31/0516; H01L 31/0682; H01L 31/05; H01L 31/048; H01L 31/022441
See application file for complete search history.

(56) References Cited

U.S. PATENT DOCUMENTS

| | | | | |
|---|---|---|---|---|
| 5,660,646 A | * | 8/1997 | Kataoka | B32B 17/10018 136/244 |
| 5,998,729 A | * | 12/1999 | Shiomi | H01L 27/142 136/251 |
| 8,952,240 B2 | * | 2/2015 | Nakatani | H01L 31/042 136/251 |
| 9,112,080 B1 | * | 8/2015 | Corneille | H01L 31/0465 |

(Continued)

FOREIGN PATENT DOCUMENTS

| | | |
|---|---|---|
| EP | 2423973 A1 | 2/2012 |
| EP | 2439784 A1 | 4/2012 |

(Continued)

*Primary Examiner* — Golam Mowla
(74) *Attorney, Agent, or Firm* — Birch, Stewart, Kolasch & Birch, LLP

(57) ABSTRACT

A solar cell module includes first and second solar cells and an interconnector for electrically connecting the first and second solar cells. The first solar cell and the second solar cell each include a plurality of first electrodes formed on a back surface of a semiconductor substrate, a plurality of second electrodes formed on the back surface of the semiconductor substrate, a first auxiliary electrode connected to the plurality of first electrodes, a second auxiliary electrode connected to the plurality of second electrodes, and an insulating member positioned on back surfaces of the first auxiliary electrode and the second auxiliary electrode. Each of the first solar cell and the second solar cell is formed as an individual integrated type element by connecting one semiconductor substrate and one insulating member.

20 Claims, 53 Drawing Sheets

(56) References Cited

U.S. PATENT DOCUMENTS

| | | |
|---|---|---|
| 2010/0018565 A1 | 1/2010 | Funakoshi |
| 2010/0108123 A1 | 5/2010 | Åsberg et al. |
| 2010/0200058 A1 | 8/2010 | Funakoshi |
| 2012/0103408 A1 | 5/2012 | Moslehi et al. |
| 2013/0298988 A1 | 11/2013 | Fukuda et al. |
| 2014/0190546 A1 | 7/2014 | Fukumochi et al. |

FOREIGN PATENT DOCUMENTS

| | | |
|---|---|---|
| EP | 2575184 A2 | 4/2013 |
| EP | 2615146 A2 | 7/2013 |
| JP | 5-37108 A | 2/1993 |
| JP | 2002-246628 A | 8/2002 |
| JP | 2005-11869 A | 1/2005 |
| JP | 2007-19334 A | 1/2007 |
| JP | 2009-88145 A | 4/2009 |
| JP | 2010-517315 A | 5/2010 |
| JP | 2010-157530 A | 7/2010 |
| JP | 2010-182877 A | 8/2010 |
| JP | 2011-3938 A | 1/2011 |
| JP | 2012-178430 A | 9/2012 |
| JP | 2013-8785 A | 1/2013 |
| JP | 2013-48166 A | 3/2013 |
| JP | 2013-73971 A | 4/2013 |
| JP | 2013-131698 A | 7/2013 |
| WO | WO 2008/090718 A1 | 7/2008 |
| WO | WO 2009/025147 A1 | 2/2009 |
| WO | WO 2012/081613 A1 | 6/2012 |
| WO | WO 2013/031384 A1 | 3/2013 |

\* cited by examiner (a)   (b)

FIG. 34G
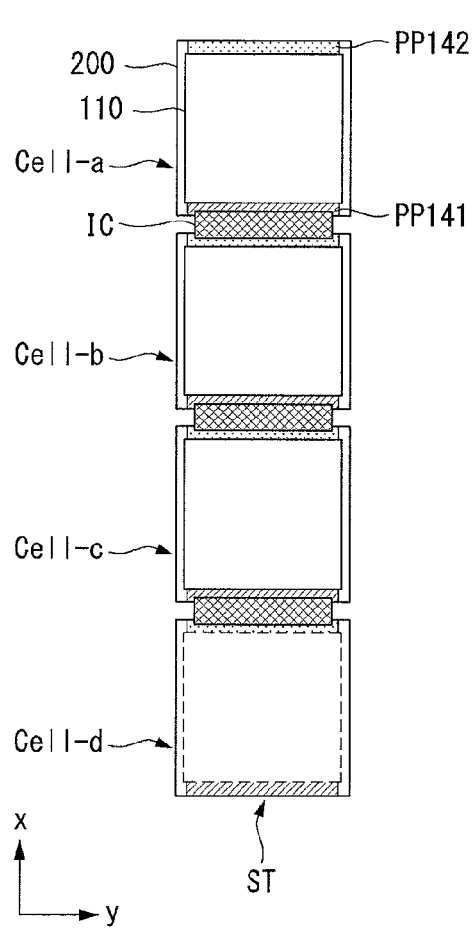
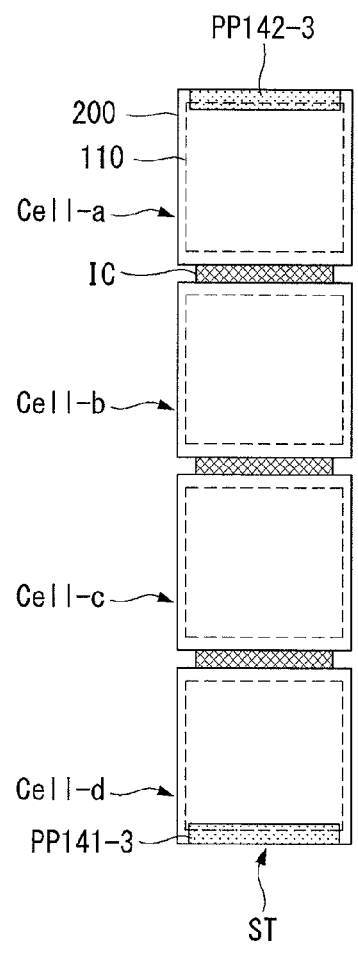
(a)  (b)

SOLAR CELL AND SOLAR CELL MODULE

CROSS-REFERENCE TO RELATED APPLICATION

This application claims priority to and the benefit of Korean Patent Application No. 10-2013-0129415 filed in the Korean Intellectual Property Office on Oct. 29, 2013, the entire contents of which are incorporated herein by reference.

BACKGROUND OF THE INVENTION

Field of the Invention

Embodiments of the invention relate to a solar cell and a solar cell module.

Description of the Related Art

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

In particular, a solar cell, in which electrodes are not formed on a light receiving surface of a silicon substrate and n-type electrodes and p-type electrodes are formed only on another surface of the silicon substrate, has been continuously studied and developed so as to increase efficiency of the solar cell. Further, a module technology for electrically connecting the plurality of solar cells has been continuously studied and developed.

Examples of the module technology typically include a method for electrically connecting the plurality of solar cells using metal interconnectors and a method for electrically connecting the plurality of solar cells using a wiring substrate, on which wirings are previously formed.

SUMMARY OF THE INVENTION

In one aspect, there is a solar cell module including a first solar cell and a second solar cell each of the first solar cell and the second solar cell including a substrate, a plurality of first electrodes formed on a back surface of a semiconductor substrate, a plurality of second electrodes formed on the back surface of the semiconductor substrate, a first auxiliary electrode connected to the plurality of first electrodes, a second auxiliary electrode connected to the plurality of second electrodes, and an insulating member positioned on back surfaces of the first auxiliary electrode and the second auxiliary electrode, wherein each of the first solar cell and the second solar cell is formed as an individual integrated type element by a connection of one semiconductor substrate and one insulating member, and an interconnector configured to electrically connect the first solar cell and the second solar cell.

The solar cell module may further include a front glass substrate positioned on a front surface of a cell string formed by electrically connecting the first solar cell and the second solar cell through the interconnector, an upper encapsulant positioned between the front glass substrate and the cell string, a lower encapsulant positioned on a back surface of the cell string, and a back sheet positioned on a back surface of the lower encapsulant.

The interconnector and the semiconductor substrate of the first solar cell or the semiconductor substrate of the second solar cell may not overlap each other and may be separated from each other. The insulating member of each of the first solar cell and the second solar cell may overlap the interconnector. The insulating member of the first solar cell may be separated from the insulating member of the second solar cell.

The insulating member of the first solar cell may not overlap the semiconductor substrate of the second solar cell, and the insulating member of the second solar cell may not overlap the semiconductor substrate of the first solar cell.

In each of the first solar cell and the second solar cell, an area of the insulating member may be equal to or greater than an area of the semiconductor substrate and may be less than two times the area of the semiconductor substrate. For example, a length of the insulating member in a first direction corresponding to an extension direction of the first and second auxiliary electrodes may be equal to or longer than a length of the semiconductor substrate in the first direction and may be less than two times the length of the semiconductor substrate in the first direction.

In each of the first solar cell and the second solar cell, each of the first auxiliary electrode and the second auxiliary electrode may extends in a first direction, the first auxiliary electrode may have a first auxiliary electrode pad extending in a second direction crossing the first direction at an end extending in the first direction, and the second auxiliary electrode may have a second auxiliary electrode pad extending in the second direction at an end extending in the first direction.

In each of the first solar cell and the second solar cell, each of the first auxiliary electrode pad and the second auxiliary electrode pad may include a first area overlapping the semiconductor substrate and a second area not overlapping the semiconductor substrate.

The first auxiliary electrode pad included in the first solar cell and the second auxiliary electrode pad included in the second solar cell may be separated from each other. In this instance, the interconnector may electrically connect the first auxiliary electrode pad of the first solar cell to the second auxiliary electrode pad of the second solar cell, or may electrically connect the second auxiliary electrode pad of the first solar cell to the first auxiliary electrode pad of the second solar cell.

More specifically, in each of the first solar cell and the second solar cell, the second area of the first auxiliary electrode pad and the second area of the second auxiliary electrode pad may overlap the interconnector and may be connected to the interconnector.

In each of the first solar cell and the second solar cell, a first conductive adhesive may electrically connect the interconnector to the first auxiliary electrode pad or may electrically connect the interconnector to the second auxiliary electrode pad. Alternatively, the interconnector and the first auxiliary electrode pad may physically contact each other and may be electrically connected to each other, or the interconnector and the second auxiliary electrode pad may physically contact each other and may be electrically connected to each other.

A front surface of the interconnector may be formed as an uneven surface, and a thickness of the interconnector may be non-uniform. Alternatively, a thickness of the interconnector may be uniform, and the interconnector has a zigzag shape.

The solar cell module may further include a first cell string and a second string, each of which is formed by connecting a plurality of solar cells, each of which is formed as the individual integrated type element, in series in a first direction through the interconnector, and a conductive ribbon configured to connect the first cell string and the second string in series in a second direction crossing the first direction.

More specifically, a first auxiliary electrode pad of a last solar cell of the first cell string may be connected to a second auxiliary electrode pad of a last solar cell of the second cell string through the conductive ribbon, or a second auxiliary electrode pad of the last solar cell of the first cell string may be connected to a first auxiliary electrode pad of the last solar cell of the second cell string through the conductive ribbon.

In this instance, the conductive ribbon may be connected to a front surface of the first auxiliary electrode pad or a front surface of the second auxiliary electrode pad of the last solar cell of the first cell string or the second string.

However, on the contrary, the first auxiliary electrode pad or the second auxiliary electrode pad of the last solar cell of the first cell string or the second string may cover a portion of a back surface of the insulating member. The conductive ribbon may be connected to the first auxiliary electrode pad or the second auxiliary electrode pad formed on the portion of the back surface of the insulating member.

In the last solar cell of the first cell string or the second string, the first auxiliary electrode pad or the second auxiliary electrode pad, to which the conductive ribbon is connected, may include a portion extending from an end of the insulating member, and the conductive ribbon may be connected to the portion.

The last solar cell of each of the first cell string and the second string may be a solar cell, in which the insulating member is removed in each of the first solar cell and the second solar cell. The conductive ribbon may be connected to a back surface of the first auxiliary electrode pad or a back surface of the second auxiliary electrode pad of the last solar cell.

An example of the solar cell applicable to the above-described solar cell module includes a semiconductor substrate, a plurality of first electrodes formed on a back surface of the semiconductor substrate, a plurality of second electrodes which are formed to be separated from the plurality of first electrodes in parallel with the plurality of first electrodes on the back surface of the semiconductor substrate, and an insulating member including a first auxiliary electrode connected to the plurality of first electrodes and a second auxiliary electrode connected to the plurality of second electrodes, wherein the solar cell is formed as an individual integrated type element by a connection of one semiconductor substrate and one insulating member.

An area of the insulating member may be equal to or greater than an area of the semiconductor substrate and may be less than two times the area of the semiconductor substrate. For example, a length of the insulating member in a first direction corresponding to an extension direction of the first and second auxiliary electrodes may be equal to or longer than a length of the semiconductor substrate in the first direction and may be less than two times the length of the semiconductor substrate in the first direction.

Each of the first auxiliary electrode and the second auxiliary electrode may extend in the first direction. The first auxiliary electrode may have a first auxiliary electrode pad extending in a second direction crossing the first direction at an end extending in the first direction, and the second auxiliary electrode may have a second auxiliary electrode pad extending in the second direction at an end extending in the first direction.

A thickness of each of the first auxiliary electrode and the second auxiliary electrode may be greater than a thickness of each of the first electrodes and the second electrodes.

The first electrodes may be electrically connected to the first auxiliary electrode using a first conductive adhesive, and the second electrodes may be electrically connected to the second auxiliary electrode using the first conductive adhesive. Further, an insulating layer may be formed between the first and second electrodes and between the first and second auxiliary electrodes.

More specifically, each of the first and second auxiliary electrodes may be formed in the plural and may extend in a first direction. The plurality of first electrodes and the plurality of second electrodes may extend in the first direction or a second direction crossing the first direction. At least a portion of each first auxiliary electrode and at least a portion of each first electrode may overlap each other and may be connected to each other in an overlap portion therebetween. At least a portion of each second auxiliary electrode and at least a portion of each second electrode may overlap each other and may be connected to each other in an overlap portion therebetween.

Each of the first and second auxiliary electrodes may be formed as a sheet electrode, and the first and second auxiliary electrodes may be separated from each other. In this instance, the first auxiliary electrode and the plurality of first electrodes may overlap each other and may be connected to each other in overlap portions therebetween using the first conductive adhesive, and the second auxiliary electrode and the plurality of second electrodes may overlap each other and are connected to each other in overlap portions therebetween using the first conductive adhesive. The first auxiliary electrode and the plurality of second electrodes may be insulated from each other in overlap portions therebetween through the insulating layer, and the second auxiliary electrode and the plurality of first electrodes may be insulated from each other in overlap portions therebetween through the insulating layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 34A to 34G illustrate an example of a method for manufacturing a solar cell as an individual integrated type element and an example of a method for manufacturing a cell string;

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that detailed description of known arts will be omitted if it is determined that the arts can mislead the embodiments of the invention.

In the following description, "front surface" may be one surface of a semiconductor substrate or one surface of a front glass substrate, on which light is directly incident, and "back surface" may be a surface opposite the one surface of the semiconductor substrate or the front glass substrate, on which light is not directly incident or reflective light may be incident.

Exemplary embodiments of the invention will be described with reference to FIGS. 1 to 37G.

Figure 1:
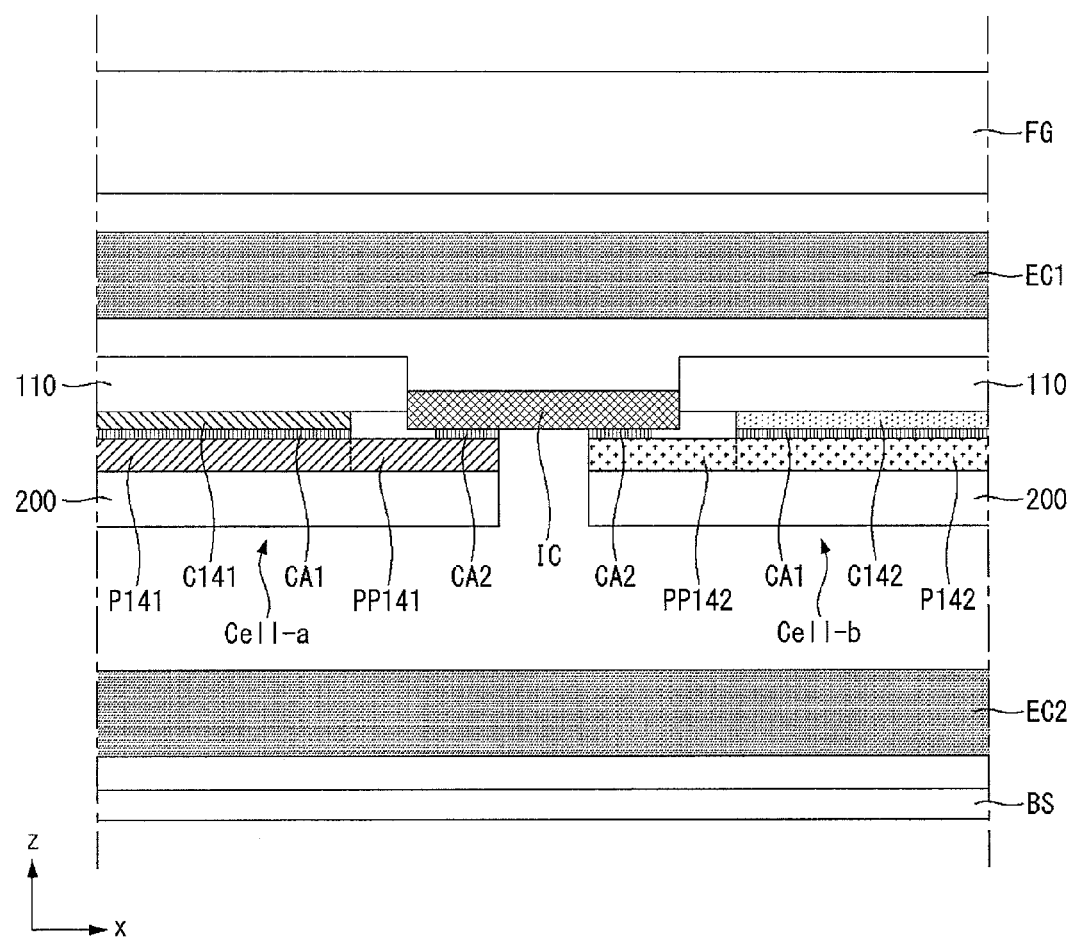
FIG. 1 illustrates a solar cell module according to an example embodiment of the invention.

FIG. 1 illustrates a solar cell module according to an example embodiment of the invention.

As shown in FIG. 1, a solar cell module according to an example embodiment of the invention may include a front glass substrate FG, an upper encapsulant EC1, a plurality of solar cells including a first solar cell Cell-a and a second solar cell Cell-b, an interconnector IC for electrically connecting the first solar cell Cell-a and the second solar cell Cell-b, a lower encapsulant EC2, and a back sheet BS.

In FIG. 1 which is a partial cross-sectional view of the solar cell module, the front glass substrate FG, the upper encapsulant EC1, the plurality of solar cells, the lower encapsulant EC2, and the back sheet BS are shown to be separated from one another for the sake of brevity and ease of reading. However, the components constituting the solar cell module may form one body by removing spaces between the components in a lamination process.

Each of the plurality of solar cells including the first solar cell Cell-a and the second solar cell Cell-b includes a plurality of first electrodes C141 formed on a back surface of a semiconductor substrate 110, a plurality of second electrodes C142 formed on the back surface of the semiconductor substrate 110, a first auxiliary electrode P141 connected to the plurality of first electrodes C141, a second auxiliary electrode P142 connected to the plurality of second electrodes C142, and an insulating member 200 positioned on back surfaces of the first auxiliary electrode P141 and the second auxiliary electrode P142. This is described in detail below.

In each of the plurality of solar cells including the first solar cell Cell-a and the second solar cell Cell-b, each semiconductor substrate 110 and each insulating member 200 may be connected to form each individual element.

Namely, in each of the first solar cell Cell-a and the second solar cell Cell-b, only one semiconductor substrate 110 may be attached and connected to one insulating member 200. Hence, each of the first solar cell Cell-a and the second solar cell Cell-b may be formed as an individual element, in which one semiconductor substrate 110 and one insulating member 200 are integrated.

Further, the first solar cell Cell-a and the second solar cell Cell-b, each of which is formed as the integrated type individual element, may be electrically connected to each other through the interconnector IC.

The plurality of solar cells including the first solar cell Cell-a and the second solar cell Cell-b may be electrically connected to each other through the interconnectors IC to form a cell string.

After the front glass substrate FG, the upper encapsulant EC1, the lower encapsulant EC2, and the back sheet BS are described, the detailed structure of each of the first solar cell Cell-a and the second solar cell Cell-b, a method for forming one individual element by integrating one semiconductor substrate 110 and one insulating member 200, and a detailed structure of the cell string formed by connecting the plurality of solar cells through the interconnectors IC are described in detail.

As shown in FIG. 1, the front glass substrate FG may be positioned on a front surface of the cell string, in which the first solar cell Cell-a and the second solar cell Cell-b are connected to each other through the interconnector IC. The front glass substrate FG may be formed of a tempered glass having a high transmittance and a damage prevention function. In this instance, the tempered glass may be a low iron tempered glass containing a small amount of iron. Although not shown, the front glass substrate FG may have an embossed inner surface so as to increase a scattering effect of light.

The upper encapsulant EC1 may be positioned between the front glass substrate FG and the cell string, and the lower encapsulant EC2 may be positioned on a back surface of the cell string, namely, between the back sheet BS and the cell string.

The upper encapsulant EC1 and the lower encapsulant EC2 may be formed of a material which prevents corrosion of a metal resulting from the moisture penetration and protects the solar cell module from an impact. For example, the upper encapsulant EC1 and the lower encapsulant EC2 may be formed of ethylene vinyl acetate (EVA). Other materials may be used.

As shown in FIG. 1, a lamination process is performed in a state where the upper encapsulant EC1 and the lower encapsulant EC2 are respectively positioned on and under the plurality of solar cells, and thus the upper encapsulant EC1 and the lower encapsulant EC2 and the plurality of solar cells may be integrated.

The back sheet BS of a sheet type may be positioned on a back surface of the lower encapsulant EC2 and may prevent the moisture from penetrating into a back surface of the solar cell module. A glass substrate may be used instead of the back sheet BS. However, when the back sheet BS is used, the manufacturing cost and the weight of the solar cell module may be further reduced.

When the back sheet BS is formed in the sheet type, the back sheet BS may be formed of an insulating material, for example, FP/PE/FP (fluoropolymer/polyester/fluoropolymer).

The detailed structure of each of the first solar cell Cell-a and the second solar cell Cell-b is described below.

Figure 2:
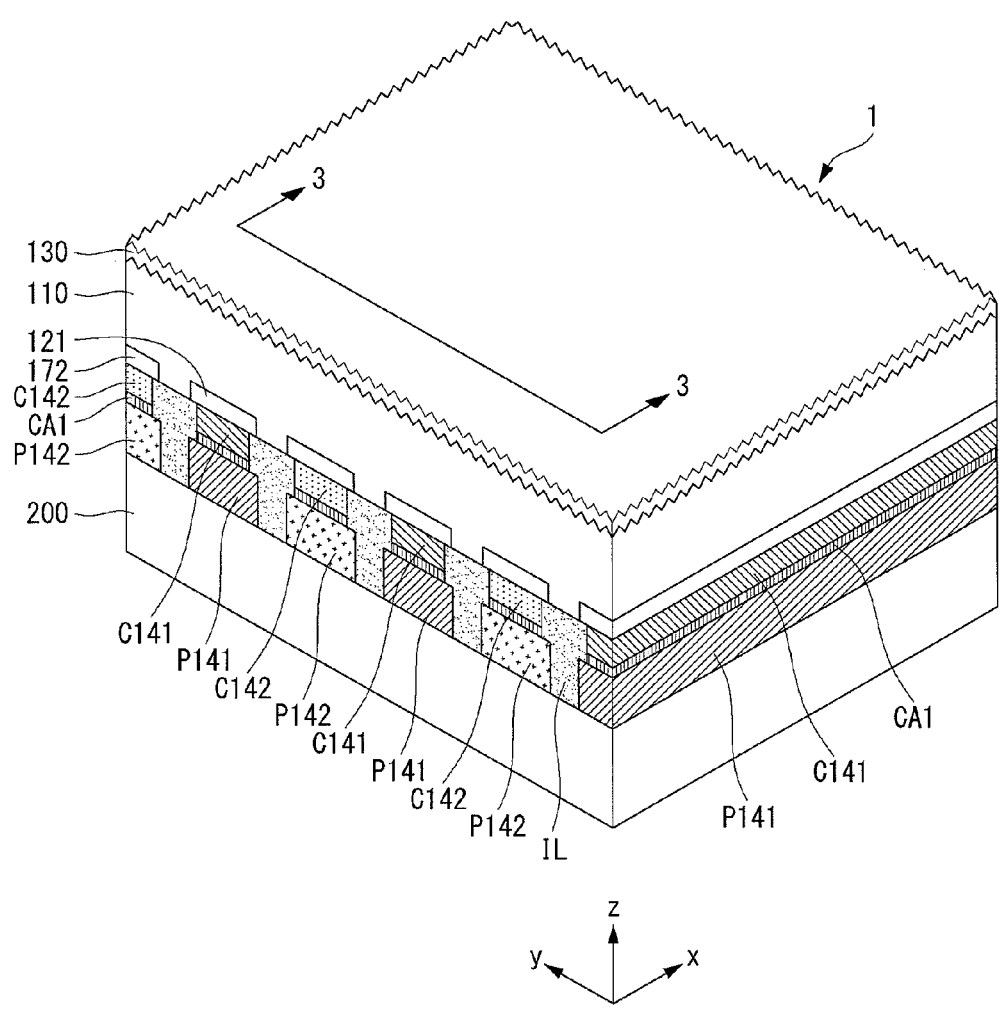
FIGS. 2 and 3 show an example of a solar cell applicable to the solar cell module shown in FIG. 1.
Figure 3:
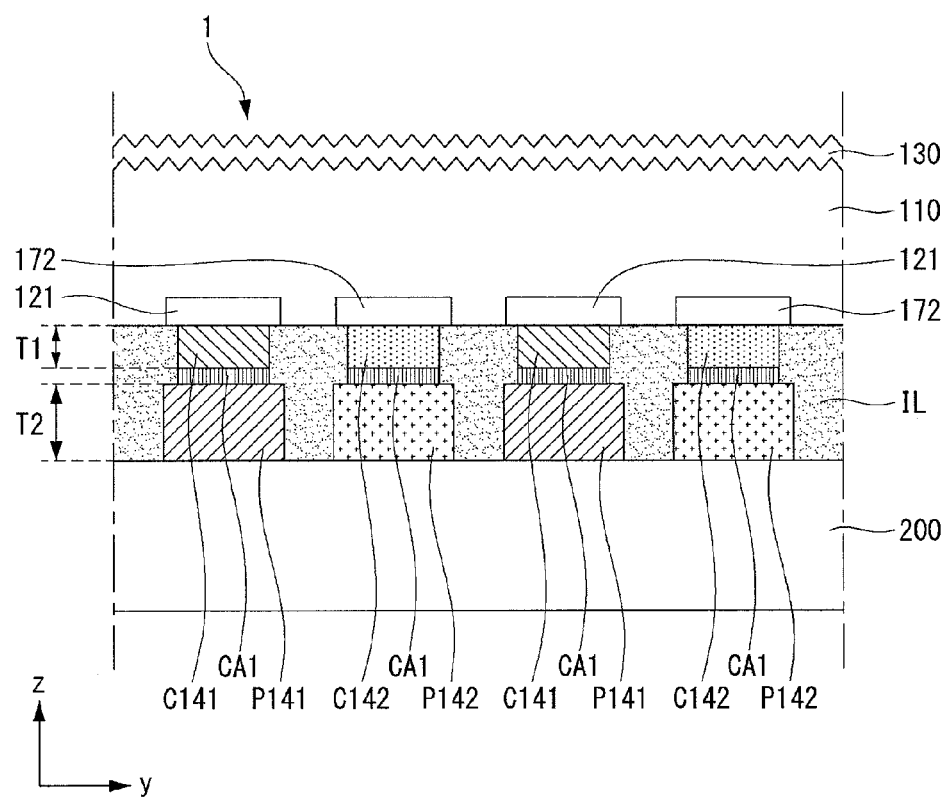

FIGS. 2 and 3 show an example of a solar cell applicable to the solar cell module shown in FIG. 1.

More specifically, FIG. 2 is a partial perspective view of a solar cell according to the embodiment of the invention, and FIG. 3 is a cross-sectional view taken along line 3-3 of FIG. 2.

As shown in FIGS. 2 and 3, a solar cell 1 according to the embodiment of the invention may include a semiconductor substrate 110, an anti-reflection layer 130, an emitter region 121, a back surface field (BSF) region 172, a plurality of first electrodes C141, a plurality of second electrodes C142, a first auxiliary electrode P141, a second auxiliary electrode P142, and an insulating member 200.

The anti-reflection layer 130 and the back surface field region 172 may be omitted in the embodiment of the invention. The solar cell 1 according to the embodiment of the invention may further include a front surface field region positioned between the anti-reflection layer 130 and the semiconductor substrate 110, on which light is incident. The front surface field region is an impurity region which is more heavily doped than the semiconductor substrate 110 with impurities of the same conductive type as the semiconductor substrate 110.

Hereinafter, the embodiment of the invention describes the solar cell including the anti-reflection layer 130 and the back surface field region 172 as an example as shown in FIGS. 2 and 3.

The semiconductor substrate 110 may be a semiconductor substrate formed of silicon containing impurities of a first conductive type, for example, an n-type, though not required. The semiconductor substrate 110 may be formed by doping a wafer formed of silicon material with impurities of the first conductive type.

A front surface of the semiconductor substrate 110 may be textured to form a textured surface corresponding to an uneven surface having a plurality of uneven portions or having uneven characteristics. The anti-reflection layer 130 may be positioned on the front surface of the semiconductor substrate 110 and may have one layer or a plurality of layers. The anti-reflection layer 130 may be formed of hydrogenated silicon nitride (SiNx:H). Other materials may be used. The front surface field region may be additionally formed at the front surface of the semiconductor substrate 110.

The emitter region 121 may be positioned to be separated from one another inside a back surface opposite the front surface of the semiconductor substrate 110 and may extend parallel with one another. Namely, the emitter region 121 may be in plural. The plurality of emitter regions 121 may be of a second conductive type (for example, p-type) opposite the first conductive type (for example, n-type) of the semiconductor substrate 110.

The plurality of emitter regions 121 may heavily contain impurities of the second conductive type (for example, p-type) opposite the first conductive type (for example, n-type) of the semiconductor substrate 110 formed of crystalline silicon and may be formed through a diffusion process.

The plurality of back surface field regions 172 may be positioned inside the back surface of the semiconductor substrate 110. The plurality of back surface field regions 172 may be positioned to be separated from one another in a direction parallel to the emitter regions 121 and may extend in the same direction as the emitter regions 121. Thus, as shown in FIGS. 2 and 3, the plurality of emitter regions 121 and the plurality of back surface field regions 172 may be alternately positioned at the back surface of the semiconductor substrate 110.

Each back surface field region 172 may be a region (for example, an $n^{++}$-type region) which is more heavily doped than the semiconductor substrate 110 with impurities of the same conductive type as the semiconductor substrate 110. The plurality of back surface field regions 172 may heavily contain impurities (for example, $n^{++}$-type impurities) of the same conductive type as the semiconductor substrate 110 formed of crystalline silicon and may be formed through the diffusion process.

The plurality of first electrodes C141 are physically and electrically connected to the plurality of emitter regions 121, respectively, and extend along the plurality of emitter regions 121.

Accordingly, when the emitter regions 121 are formed along a first direction, the first electrodes C141 may be formed along the first direction. Further, when the emitter regions 121 are formed along a second direction, the first electrodes C141 may be formed along the second direction.

The plurality of second electrodes C142 are physically and electrically connected to the semiconductor substrate 110 through the plurality of back surface field regions 172 and extend along the plurality of back surface field regions 172.

The first electrodes C141 and the second electrodes C142 are physically and electrically separated from each other on the back surface of the semiconductor substrate 110.

Accordingly, when the first electrodes C141 are formed in the first direction, the second electrodes C142 may be separated from the first electrodes C141 and may be formed in the first direction. Further, when the first electrodes C141 are formed in the second direction, the second electrodes C142 may be separated from the first electrodes C141 and may be formed in the second direction.

The first electrode C141 formed on the emitter region 121 collects carriers (for example, holes) moving to the emitter region 121, and the second electrode C142 formed on the back surface field region 172 collects carriers (for example, electrons) moving to the back surface field region 172.

The first auxiliary electrode P141 may be electrically connected to back surfaces of the plurality of first electrodes C141. Namely, the first auxiliary electrode P141 may be formed in the plural. Alternatively, the first auxiliary electrode P141 may be formed as a sheet electrode.

When the plurality of first auxiliary electrodes P141 are provided, the first auxiliary electrodes P141 may be formed in the same direction as the first electrodes C141 and also may be formed in a direction crossing the first electrodes C141.

The first auxiliary electrode P141 and the first electrode C141 may be electrically connected to each other in an overlap portion therebetween.

The second auxiliary electrode P142 may be electrically connected to back surfaces of the plurality of second electrodes C142.

Namely, the second auxiliary electrode P142 may be formed in the plural. Alternatively, the second auxiliary electrode P142 may be formed as a sheet electrode.

When the plurality of second auxiliary electrodes P142 are provided, the second auxiliary electrodes P142 may be formed in the same direction as the second electrodes C142 and also may be formed in a direction crossing the second electrodes C142.

The second auxiliary electrode P142 and the second electrode C142 may be electrically connected to each other in an overlap portion therebetween.

The first auxiliary electrode P141 and the second auxiliary electrode P142 may be formed of at least one of Cu, Au, Ag, and Al.

The first auxiliary electrode P141 may be electrically connected to the first electrode C141 using a first conductive adhesive CA1, and the second auxiliary electrode P142 may be electrically connected to the second electrode C142 using the first conductive adhesive CA1.

A material of the first conductive adhesive CA1 is not particularly limited as long as it is a conductive material. It is preferable, but not required, that the first conductive adhesive CA1 uses a conductive material having a melting point at a relatively low temperature of about 130° C. to 250° C. For example, a solder paste, a conductive adhesive including metal particles, carbon nanotube (CNT), conductive particles containing carbon, a wire needle, etc. may be used.

An insulating layer IL may be positioned between the first electrode C141 and the second electrode C142 and between the first auxiliary electrode P141 and the second auxiliary electrode P142, thereby preventing the short circuit. The insulating layer IL may be an epoxy resin.

FIGS. 2 and 3 show the overlap between the first electrode C141 and the first auxiliary electrode P141 and the overlap between the second electrode C142 and the second auxiliary electrode P142, as an example. However, the first electrode C141 may overlap the second auxiliary electrode P142, and the second electrode C142 may overlap the first auxiliary electrode P141. In this instance, the insulating layer IL for preventing the short circuit may be positioned between the first electrode C141 and the second auxiliary electrode P142 and between the second electrode C142 and the first auxiliary electrode P141.

Further, FIGS. 2 and 3 show the plurality of first auxiliary electrodes P141 and the plurality of second auxiliary electrodes P142 as an example. However, each of the first auxiliary electrode P141 and the second auxiliary electrode P142 may be formed as a sheet electrode.

The first auxiliary electrode P141 and the second auxiliary electrode P142 do not use a semiconductor manufacturing process and may be formed through a thermal process for applying heat of about 130° C. to 250° C. and a pressure to the first conductive adhesive CA1.

Further, in FIGS. 2 and 3, a first auxiliary electrode pad PP141 for the serial connection of the solar cells may be electrically connected to ends of the first auxiliary electrodes P141, and a second auxiliary electrode pad PP142 for the serial connection of the solar cells may be electrically connected to ends of the second auxiliary electrodes P142. A material and a thickness of the first auxiliary electrode pad PP141 may be substantially the same as the first auxiliary electrode P141, and a material and a thickness of the second auxiliary electrode pad PP142 may be substantially the same as and the second auxiliary electrode P142.

The insulating member 200 may be disposed on back surfaces of the first auxiliary electrode P141 and the second auxiliary electrode P142.

A material of the insulating member 200 is not particularly limited as long as it is an insulating material. It may be preferable, but not required, that a melting point of the insulating member 200 is higher than a melting point of the first conductive adhesive CA1. For example, the melting point of the insulating member 200 may be equal to or higher than about 300° C. More specifically, the insulating member 200 may be formed of at least one of polyimide, epoxy-glass, polyester, and bismaleimide triazine (BT) resin, each of which has a thermal resistance to a high temperature.

The insulating member 200 may be formed in the form of a flexible film or in the form of a hard plate which is not flexible.

In the solar cell according to the embodiment of the invention, each insulating member 200 and each semiconductor substrate 110 may be connected to each other to form each individual element. Namely, only one semiconductor substrate 110 may be attached and connected to one insulating member 200. In other words, one semiconductor substrate 110 and one insulating member 200 may be attached to each other to form an individual integrated type element, thereby forming a solar cell.

More specifically, the plurality of first electrodes C141 and the plurality of second electrodes C142 formed on a back surface of one semiconductor substrate 110 may be attached and electrically connected to the first auxiliary electrode P141 and the second auxiliary electrode P142 formed on a front surface of one insulating member 200 through a process for attaching one semiconductor substrate 110 to one insulating member 200 to form one individual integrated type element. This is described in detail below.

In the solar cell according to the embodiment of the invention, a thickness T2 of each of the first auxiliary electrode P141 and the second auxiliary electrode P142 may be greater than a thickness T1 of each of the first electrode C141 and the second electrode C142. For example, the thickness T2 of each of the first auxiliary electrode P141 and the second auxiliary electrode P142 may be about 10 μm to 900 μm.

When the thickness T2 of each of the first auxiliary electrode P141 and the second auxiliary electrode P142 is equal to or greater than about 10 μm, a minimum resistance may be properly secured. Further, when the thickness T2 of each of the first auxiliary electrode P141 and the second auxiliary electrode P142 is equal to or less than about 900 μm, an unnecessary increase in the thickness T2 may be prevented in a state where the minimum resistance is properly secured, thereby reducing the manufacturing cost.

When the thickness T2 of each of the first auxiliary electrode P141 and the second auxiliary electrode P142 is greater than the thickness T1 of each of the first electrode C141 and the second electrode C142, a process time required to manufacture the solar cell may be further reduced, and a thermal expansion stress of the semiconductor substrate 110 may be further reduced than when the first electrode C141 and the second electrode C142 are directly formed on the back surface of the semiconductor substrate 110. Hence, the efficiency of the solar cell may be further improved.

This is described in detail below.

In general, an emitter region, a back surface field region, a first electrode connected to the emitter region, and a second electrode connected to the back surface field region, which are formed on a back surface of a semiconductor substrate, may be formed through a semiconductor process. In the semiconductor process, the first electrode and the second electrode may directly contact the back surface of the semiconductor substrate or may be very close to the back surface of the semiconductor substrate, and may be generally formed through a plating method, a physical vapor deposition (PVD) method, or a thermal process of a high temperature.

In this instance, the first and second electrodes have to be sufficiently thick, so as to sufficiently reduce resistances of the first and second electrodes.

However, when thicknesses of the first and second electrodes increase, a thermal expansion coefficient of the first and second electrodes containing a conductive metal material may be excessively greater than a thermal expansion coefficient of the semiconductor substrate.

Accordingly, when the first and second electrodes contract during the process for forming the first and second electrodes on the back surface of the semiconductor substrate through the thermal process of the high temperature, the semiconductor substrate cannot stand a thermal expansion stress. Hence, a fracture or a crack may be generated in the semiconductor substrate. As a result, yield of the manufacturing process of the solar cell may be reduced, and the efficiency of the solar cell may be reduced.

Further, when the first electrode or the second electrode is formed using the plating method or the PVD method, a growth speed of the first electrode or the second electrode may be very low. Hence, the manufacturing time of the solar cell may excessively increase.

On the other hand, in the solar cell 1 according to the embodiment of the invention, the first and second auxiliary electrodes P141 and P142 each having the relatively large thickness T2 are formed on the front surface of the insulating member 200 to overlap the first and second electrodes C141 and C142 in a state where the first and second electrodes C141 and C142 each having the relatively small thickness T1 are formed on the back surface of the semiconductor substrate 110. Then, one semiconductor substrate 110 and one insulating member 200 may be attached to each other through the thermal process for applying heat of a relatively low temperature of about 130° C. to 250° C. and a pressure to the first conductive adhesive CA1 to form one individual integrated type element. Hence, a fracture or a crack may be prevented from being generated in the semiconductor substrate 110, and at the same time, the resistances of the electrodes formed on the back surface of the semiconductor substrate 110 may be greatly reduced.

Further, in the solar cell 1 according to the embodiment of the invention, time required in the semiconductor manufacturing process may be reduced by relatively reducing the thicknesses T1 of the first and second electrodes C141 and C142. The connection between the first electrodes C141 and the first auxiliary electrodes P141 and the connection between the second electrodes C142 and the second auxiliary electrodes P142 may be performed through one thermal process, and thus the manufacturing time of the solar cell 1 may be further reduced.

In this instance, the insulating member 200 functions to facilitate the performance of the process when the first auxiliary electrodes P141 and the second auxiliary electrodes P142 are attached to the first electrodes C141 and the second electrodes C142 formed on the back surface of the semiconductor substrate 110.

Namely, when the front surface of the insulating member 200, on which the first auxiliary electrodes P141 and the second auxiliary electrodes P142 are formed, is attached and connected to the back surface of the semiconductor substrate 110, on which the first electrodes C141 and the second electrodes C142 are formed through the semiconductor manufacturing process, the insulating member 200 may help in more easily performing an alignment process or an attachment process.

In the solar cell 1 according to the embodiment of the invention thus manufactured, holes collected by the first auxiliary electrodes P141 and electrons collected by the second auxiliary electrodes P142 may be used as electric power of an external device through an external circuit device.

An operation of the back contact solar cell having the above-described structure is described below.

When light irradiated to the solar cell 1 is incident on the semiconductor substrate 110 through the anti-reflection layer 130, a plurality of electron-hole pairs are generated in the semiconductor substrate 110 by light energy produced based on the incident light.

The electron-hole pairs are separated into electrons and holes due to a p-n junction of the semiconductor substrate 110 and the emitter regions 121. The electrons move to the n-type back surface field regions 172, and the holes move to the p-type emitter regions 121. The electrons moving to the back surface field regions 172 are collected by the second auxiliary electrodes P142, and the holes moving to the emitter regions 121 are collected by the first auxiliary electrodes P141. When the first auxiliary electrodes P141 are connected to the second auxiliary electrodes P142 using conductive wires, current flows therein to thereby enable use of the current for electric power.

So far, the embodiment of the invention described that the semiconductor substrate 110 is a single crystal silicon semiconductor substrate and the emitter regions 121 and the back surface field regions 172 are formed through a diffusion process, as an example.

However, on the contrary, the embodiment of the invention may be equally applied to a back contact hybrid solar cell, in which the emitter region 121 and the back surface field region 172 are formed of amorphous silicon, or a metal wrap through (MWT) solar cell, in which the emitter region 121 is formed on the front surface of the semiconductor substrate 110 and is connected to the first electrodes C141 formed on the back surface of the semiconductor substrate 110 through a plurality of via holes of the semiconductor substrate 110.

Hereinafter, various embodiments, in which one semiconductor substrate 110 and one insulating member 200 are attached and connected to each other to form an individual integrated type element, are described.

FIGS. 4 to 7C illustrate a first embodiment of an individual integrated type element formed by each semiconductor substrate and each insulating member in the solar cell module shown in FIG. 1.

Figure 4:
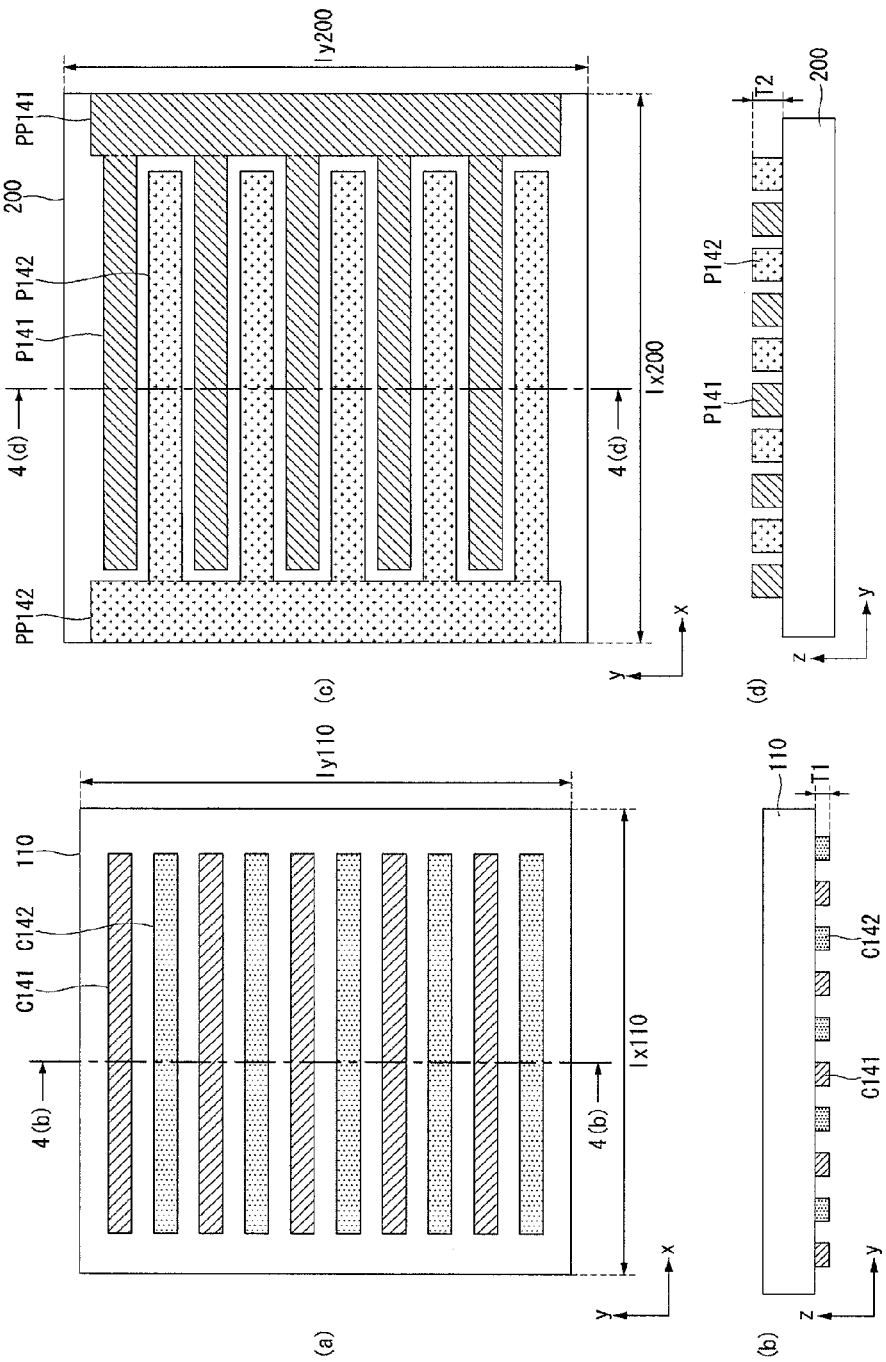
FIGS. 4 to 7C illustrate a first embodiment of an individual integrated type element formed by each semiconductor substrate and each insulating member in the solar cell module shown in FIG. 1.

In FIG. 4, (a) shows an example of a back surface of a semiconductor substrate 110, on which first electrodes C141 and second electrodes C142 are formed; (b) is a cross-sectional view taken along line 4(*b*)-4(*b*) of (a); (c) shows an example of a front surface of an insulating member 200, on which first auxiliary electrodes P141 and second auxiliary electrodes P142 are formed; and (d) is a cross-sectional view taken along line 4(*d*)-4(*d*) of (c).

The solar cell shown in FIGS. 4 to 7C may use the above-described solar cell shown in FIGS. 1 to 3. In addition, any solar cell, in which the first electrodes C141 and the second electrodes C142 are formed on the back surface of the semiconductor substrate 110, may be used.

The solar cell according to the embodiment of the invention may form an individual integrated type element by attaching and connecting the front surface of one insulating member 200 shown in (c) and (d) of FIG. 4 to the back surface of one semiconductor substrate 110 shown in (a) and (b) of FIG. 4.

In this instance, as shown in (a) and (b) of FIG. 4, the plurality of first electrodes C141 and the plurality of second electrodes C142 may be formed on the back surface of one semiconductor substrate 110 to be separated from each other and may extend in a first direction x (for example, x-axis direction).

(a) and (b) of FIG. 4 show that widths of the first electrode C141 and the second electrode C142 are substantially the same as each other. However, on the contrary, the widths of the first electrode C141 and the second electrode C142 may be different from each other.

Further, as shown in (c) and (d) of FIG. 4, the plurality of first auxiliary electrodes P141 and the plurality of second auxiliary electrodes P142 may be formed on the front surface of the insulating member 200 to be separated from each other and may extend in the first direction x.

A first auxiliary electrode pad PP141 extending in a second direction y (for example, y-axis direction) is formed at ends of the plurality of first auxiliary electrodes P141 formed along the first direction x on the front surface of the insulating member 200. The first auxiliary electrode pad PP141 may be connected to the ends of the plurality of first auxiliary electrodes P141.

Further, a second auxiliary electrode pad PP142 extending in the second direction y is formed at ends of the plurality of second auxiliary electrodes P142 formed along the first direction x on the front surface of the insulating member 200. The second auxiliary electrode pad PP142 may be connected to the ends of the plurality of second auxiliary electrodes P142.

As shown in (c) of FIG. 4, for example, an end of each of the first auxiliary electrode pad PP141 and the second auxiliary electrode pad PP142 in the first direction x may extend to an end of the insulating member 200. However, the embodiment of the invention is not limited thereto. For example, the end of each of the first auxiliary electrode pad PP141 and the second auxiliary electrode pad PP142 in the first direction x may protrude further than the end of the insulating member 200.

In the following description, second to fourth embodiments with respect to an individual integrated type element formed by each semiconductor substrate 110 and each insulating member 200 will take, as an example, the case where the end of each of the first auxiliary electrode pad PP141 and the second auxiliary electrode pad PP142 extends to the end of the insulating member 200, for the sake of brevity and ease of reading. However, in the second to fourth embodiments of the invention, the end of each of the first auxiliary electrode pad PP141 and the second auxiliary electrode pad PP142 may protrude further than the end of the insulating member 200, in the same manner as the first embodiment of the invention.

The structure, in which the end of each of the first auxiliary electrode pad PP141 and the second auxiliary electrode pad PP142 protrudes further than the end of the insulating member 200, is described in detail with reference to FIG. 24.

In the embodiment disclosed herein, the first auxiliary electrodes P141 may be separated from the second auxiliary electrode pad PP142, and the second auxiliary electrodes P142 may be separated from the first auxiliary electrode pad PP141.

Accordingly, the plurality of first auxiliary electrodes P141 and the first auxiliary electrode pad PP141 formed on the front surface of the insulating member 200 may have a comb shape, and the plurality of second auxiliary electrodes P142 and the second auxiliary electrode pad PP142 formed on the front surface of the insulating member 200 may have a comb shape. In this instance, the two combs may be positioned opposite each other.

Accordingly, the first auxiliary electrode pad PP141 may be formed in the second direction y at one end of both ends of the front surface of the insulating member 200 in the first direction x, and the second auxiliary electrode pad PP142 may be formed in the second direction y at the other end. An interconnector IC for connecting the solar cells or a ribbon for connecting cell strings of the plurality of solar cells, which are connected in series, may be electrically connected to the first auxiliary electrode pad PP141 and the second auxiliary electrode pad PP142.

A thickness T2 of each of the first auxiliary electrode P141 and the second auxiliary electrode P142 may be greater than a thickness T1 of each of the first electrode C141 and the second electrode C142.

Further, a thickness of each of the first auxiliary electrode pad PP141 and the second auxiliary electrode pad PP142 may be equal to or different from the thickness T2 of each of the first auxiliary electrode P141 and the second auxiliary electrode P142. In the following description, the case where the thickness of each of the first auxiliary electrode pad PP141 and the second auxiliary electrode pad PP142 may be equal to or different from the thickness T2 of each of the first auxiliary electrode P141 and the second auxiliary electrode P142 will be taken as an example.

The solar cell according to the embodiment of the invention may form an individual integrated type element by attaching and connecting the front surface of one insulating member 200 to the back surface of one semiconductor substrate 110. Namely, the insulating member 200 may be attached to or coupled with the semiconductor substrate 110 in one to one correspondence.

The insulating member 200 of one solar cell may not overlap the semiconductor substrate 110 of another solar cell adjacent to the one solar cell.

Accordingly, when the plurality of solar cells are connected to one another, the insulating member 200 included in each solar cell may not overlap other solar cell adjacent to each solar cell and may be separated from the other solar cell.

As described above, the solar cell according to the embodiment of the invention may form an individual integrated type element by coupling only one insulating member 200 to one semiconductor substrate 110, thereby more easily performing the manufacturing process of the solar cell module. Further, even if the semiconductor substrate 110 included in any one solar cell is broken or damaged in the manufacturing process of the solar cell module, only the corresponding solar cell forming the individual integrated type element using the broken or damaged semiconductor substrate 110 may be replaced. Hence, the process yield of the solar cell module may be further improved.

Further, the solar cell forming the individual integrated type element may minimize a thermal expansion stress applied to the semiconductor substrate 110 when the solar cell or the solar cell module is manufactured.

For this, an area of the insulating member 200 may be equal to or greater than an area of the semiconductor substrate 110 and may be less than two times the area of the semiconductor substrate 110.

For example, a length lx200 of the insulating member 200 in an extension (or longitudinal) direction of the first and second auxiliary electrodes P141 and P142, i.e., in the first direction x may be equal to or longer than a length lx110 of the semiconductor substrate 110 in the first direction x and may be less than two times the length lx110 of the semiconductor substrate 110.

Further, a length ly200 of the insulating member 200 in the second direction y may be equal to or longer than a length ly110 of the semiconductor substrate 110 in the second direction y and may be less than two times the length ly110 of the semiconductor substrate 110 under the condition that the area of the insulating member 200 is equal to or greater than the area of the semiconductor substrate 110 and is less than two times the area of the semiconductor substrate 110.

In the embodiment of the invention, a space of the front surface of the insulating member 200, to which the interconnector IC used to connect the solar cells is attached, may be sufficiently secured by setting the area of the insulating member 200 to be equal to or greater than the area of the semiconductor substrate 110.

Further, the thermal expansion stress applied to the semiconductor substrate 110 when the first and second auxiliary electrodes P141 and P142 formed on the front surface of the insulating member 200 are attached to the first and second electrodes C141 and C142 formed on the back surface of the semiconductor substrate 110 may be minimized by setting the area of the insulating member 200 to be less than two times the area of the semiconductor substrate 110.

For example, when the area of the insulating member 200 excessively increases, the length lx200 or ly200 of the insulating member 200 in a plane direction may increase. In this instance, when a thermal process for attaching the insulating member 200 to the back surface of the semiconductor substrate 110 is performed, an expansion and contraction length of the insulating member 200 may be excessively longer than an expansion and contraction length of the semiconductor substrate 110. Hence, because the thermal expansion stress applied to the semiconductor substrate 110 relatively increases, the crack may be generated in the semiconductor substrate 110. On the other hand, as in the embodiment of the invention, when the area of the insulating member 200 is set to be equal to less than two times the area of the semiconductor substrate 110, the thermal expansion stress applied to the semiconductor substrate 110 may be further reduced.

For this, while the area of the insulating member 200 is set to be equal to or less than two times the area of the semiconductor substrate 110, the length lx200 of the insulating member 200 in the first direction x corresponding to the longitudinal direction of the first and second auxiliary electrodes P141 and P142 may be longer than the length lx110 of the semiconductor substrate 110 in the first direction x, and also the length ly200 of the insulating member 200 in the second direction y crossing the first direction x may be equal to or longer than the length ly110 of the semiconductor substrate 110 in the second direction y.

As described above, the first electrodes C141 and the first auxiliary electrodes P141 may be connected to each other, and also the second electrodes C142 and the second auxiliary electrodes P142 may be connected to each other by attaching the front surface of the insulating member 200 to the back surface of the semiconductor substrate 110.

Figure 5:
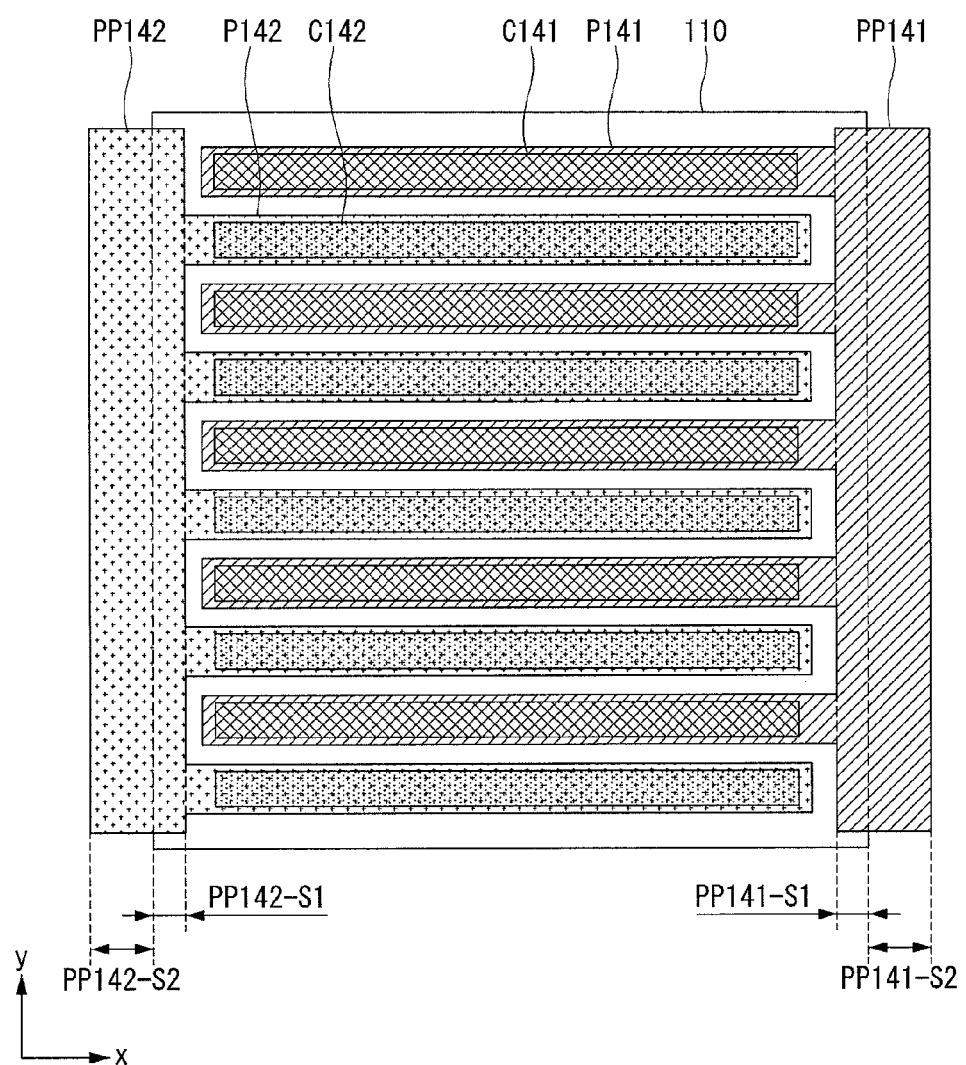

FIG. 5 shows that the first auxiliary electrodes P141, the first auxiliary electrode pad PP141, the second auxiliary electrodes P142, and the second auxiliary electrode pad PP142 are attached to the back surface of the semiconductor substrate 110 shown in FIG. 4 when viewed from the back surface of the semiconductor substrate 110. The insulating member 200 is omitted in FIG. 5 for the sake of brevity and ease of reading.

As shown in FIG. 5, on the back surface of the semiconductor substrate 110, each first electrode C141 and each first auxiliary electrode P141 may overlap each other and may be connected to each other in the first direction x, and each second electrode C142 and each second auxiliary electrode P142 may overlap each other and may be connected to each other in the first direction x.

The first auxiliary electrode pad PP141 may include a first area PP141-S1 overlapping the semiconductor substrate 110 and a second area PP141-S2 not overlapping the semiconductor substrate 110, and the second auxiliary electrode pad PP142 may include a first area PP142-S1 overlapping the semiconductor substrate 110 and a second area PP142-S2 not overlapping the semiconductor substrate 110.

The first auxiliary electrode pad PP141 may partially overlap the semiconductor substrate 110 and may be exposed to the outside of the semiconductor substrate 110, so as to secure a space where its first area PP141-S1 can be connected to the plurality of first auxiliary electrodes P141 and its second area PP141-S2 can be connected to the interconnector IC. Further, the second auxiliary electrode pad PP142 may partially overlap the semiconductor substrate 110 and may be exposed to the outside of the semiconductor substrate 110, so as to secure a space where its first area PP142-S1 can be connected to the plurality of second auxiliary electrodes P142 and its second area PP142-S2 can be connected to the interconnector IC.

Because the first auxiliary electrode pad PP141 and the second auxiliary electrode pad PP142 according to the embodiment of the invention respectively include the second areas PP141-S2 and PP142-S2 exposed to the outside of the semiconductor substrate 110, the first auxiliary electrode pad PP141 and the second auxiliary electrode pad PP142 may be more easily connected to the interconnector IC. Further, when the interconnector IC is connected to the solar cell, the thermal expansion stress of the semiconductor substrate 110 may be minimized.

Figure 6:
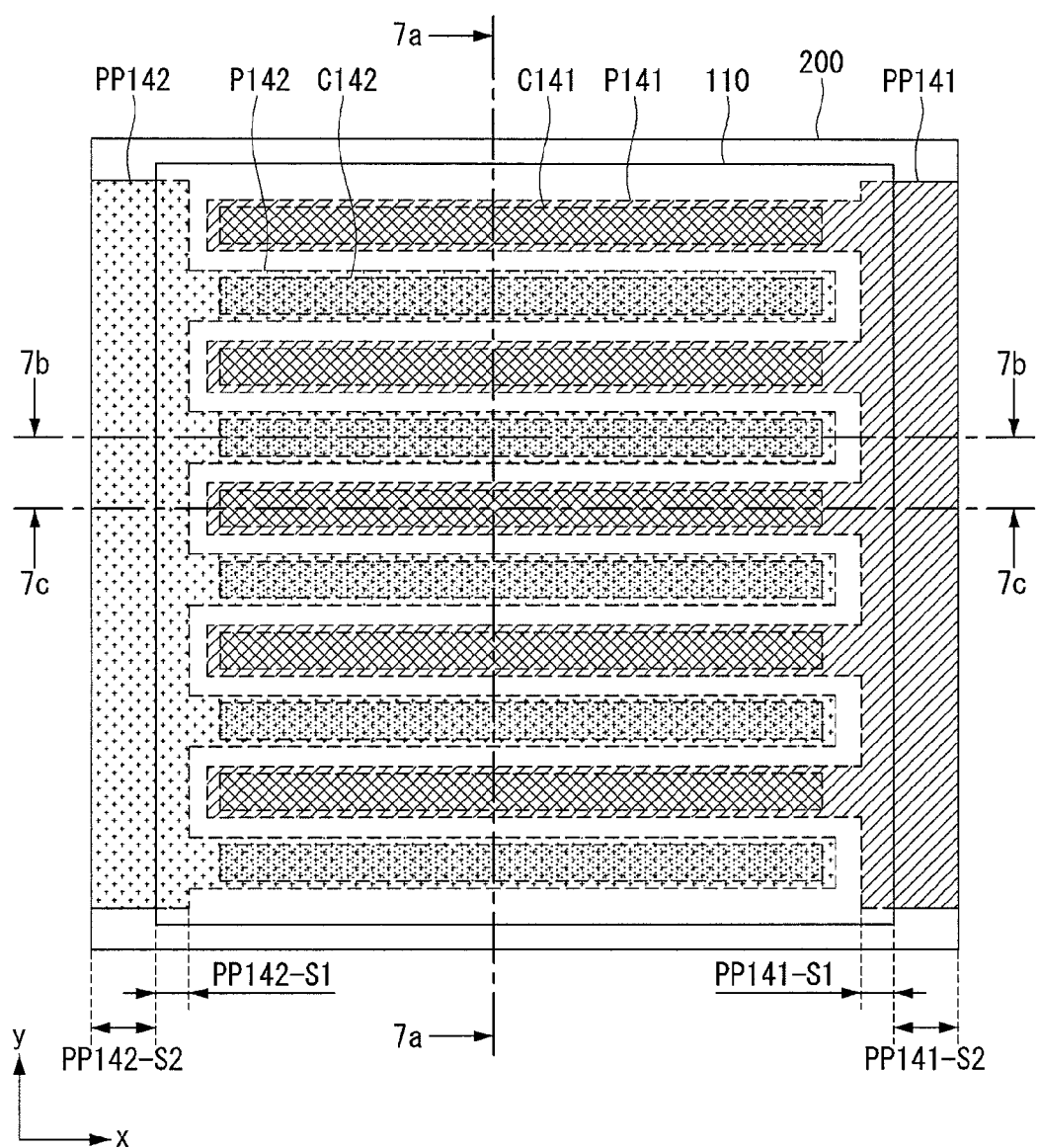
Figure 7A:
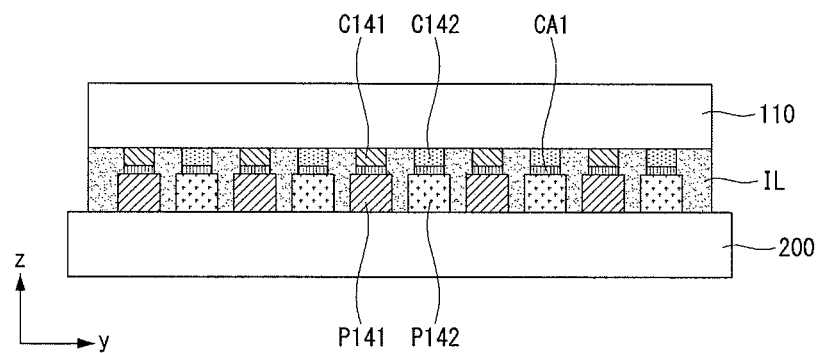
Figure 7B:
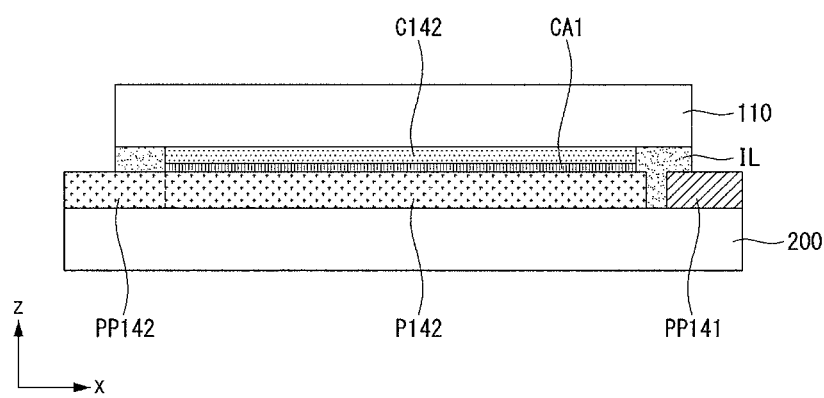
Figure 7C:
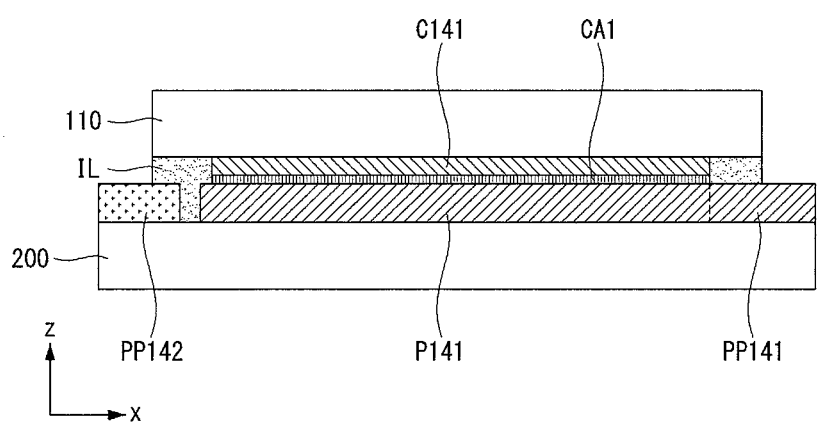

FIG. 6 shows that the insulating member 200 is added to the structure shown in FIG. 5. FIG. 7A is a cross-sectional view taken along line 7a-7a of FIG. 6 in the second direction y; FIG. 7B is a cross-sectional view taken along line 7b-7b on the second auxiliary electrode P142 of FIG. 6 in the first direction x; and FIG. 7C is a cross-sectional view taken along line 7c-7c on the first auxiliary electrode P141 of FIG. 6 in the first direction x.

As shown in FIG. 6, the semiconductor substrate 110 may completely overlap the insulating member 200 to form an individual solar cell element. Further, the first auxiliary electrode pad PP141 and the second auxiliary electrode pad PP142 respectively include the second areas PP141-S2 and PP142-S2, each of which does not overlap the semiconductor substrate 110 and is exposed to the outside of the semiconductor substrate 110. The interconnector IC may be connected to the second areas PP141-S2 and PP142-S2.

As shown in FIG. 7A, the first electrode C141 formed on the back surface of the semiconductor substrate 110 and the first auxiliary electrode P141 formed on the front surface of the insulating member 200 may overlap each other and may be electrically connected to each other using a first conductive adhesive CA1.

Further, the second electrode C142 formed on the back surface of the semiconductor substrate 110 and the second auxiliary electrode P142 formed on the front surface of the insulating member 200 may overlap each other and may be electrically connected to each other using the first conductive adhesive CA1.

A space between the first electrode C141 and the second electrode C142 may be filled with an insulating layer IL, and a space between the first auxiliary electrode P141 and the second auxiliary electrode P142 may be filled with the insulating layer IL.

As shown in FIG. 7B, a space between the second auxiliary electrode P142 and the first auxiliary electrode pad PP141 may be filled with the insulating layer IL. As shown in FIG. 7C, a space between the first auxiliary electrode P141 and the second auxiliary electrode pad PP142 may be filled with the insulating layer IL.

So far, the embodiment of the invention described that the first and second electrodes C141 and C142 formed on the semiconductor substrate 110 and the first and second auxiliary electrodes P141 and P142 formed on the insulating member 200 overlap each other and are connected to each other in a direction parallel to each other. However, the first and second electrodes C141 and C142 formed on the semiconductor substrate 110 and the first and second auxiliary electrodes P141 and P142 formed on the insulating member 200 may overlap each other and may be connected to each other in a cross direction therebetween. This is described in detail below.

FIGS. 8 to 10D illustrate a second embodiment of an individual integrated type element formed by each semiconductor substrate and each insulating member in the solar cell module shown in FIG. 1.

Description of structures and components identical or equivalent to those described above may be briefly made or may be entirely omitted in FIGS. 8 to 10D.

Figure 8:
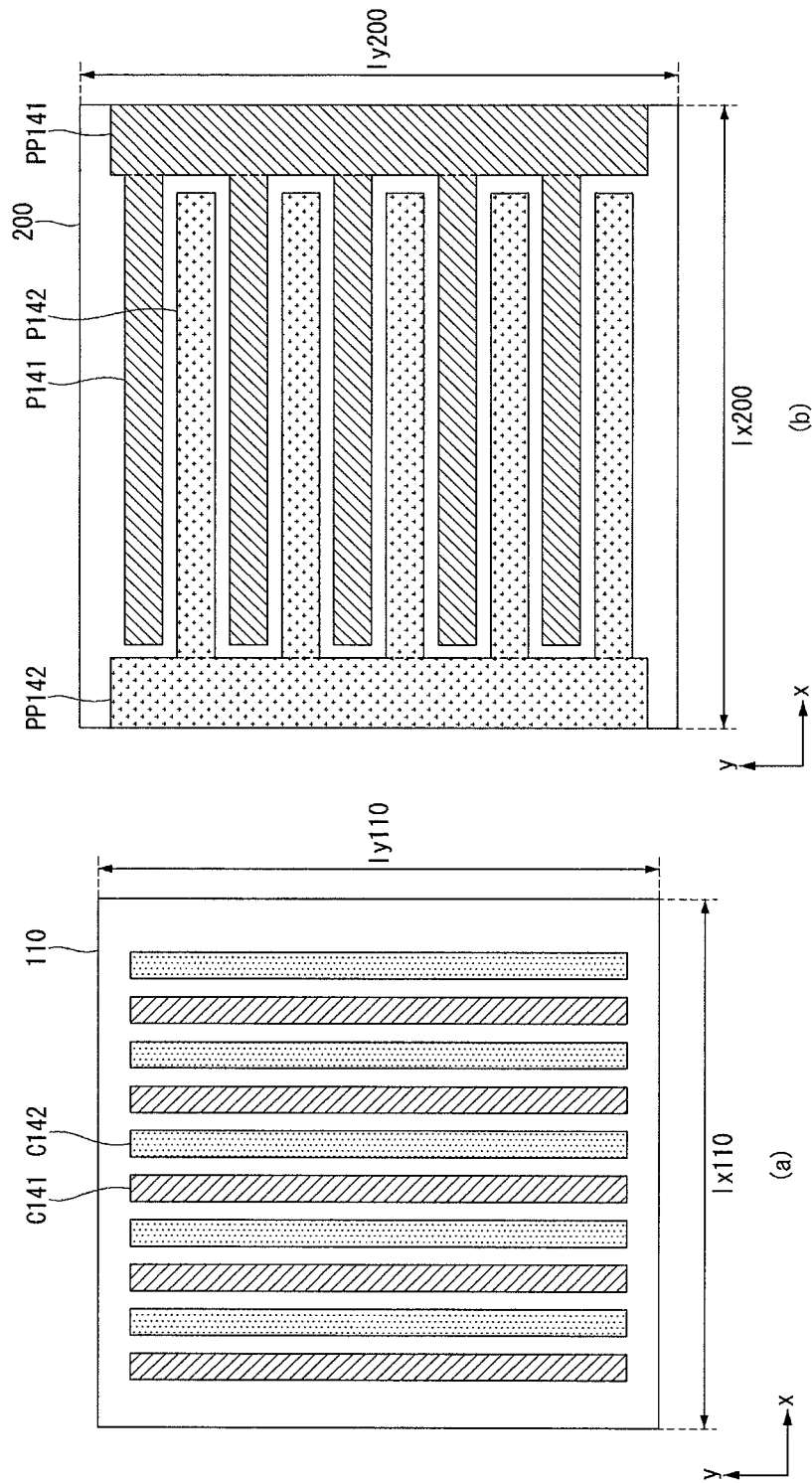
FIGS. 8 to 10D illustrate a second embodiment of an individual integrated type element formed by each semiconductor substrate and each insulating member in the solar cell module shown in FIG. 1.
Figure 9:
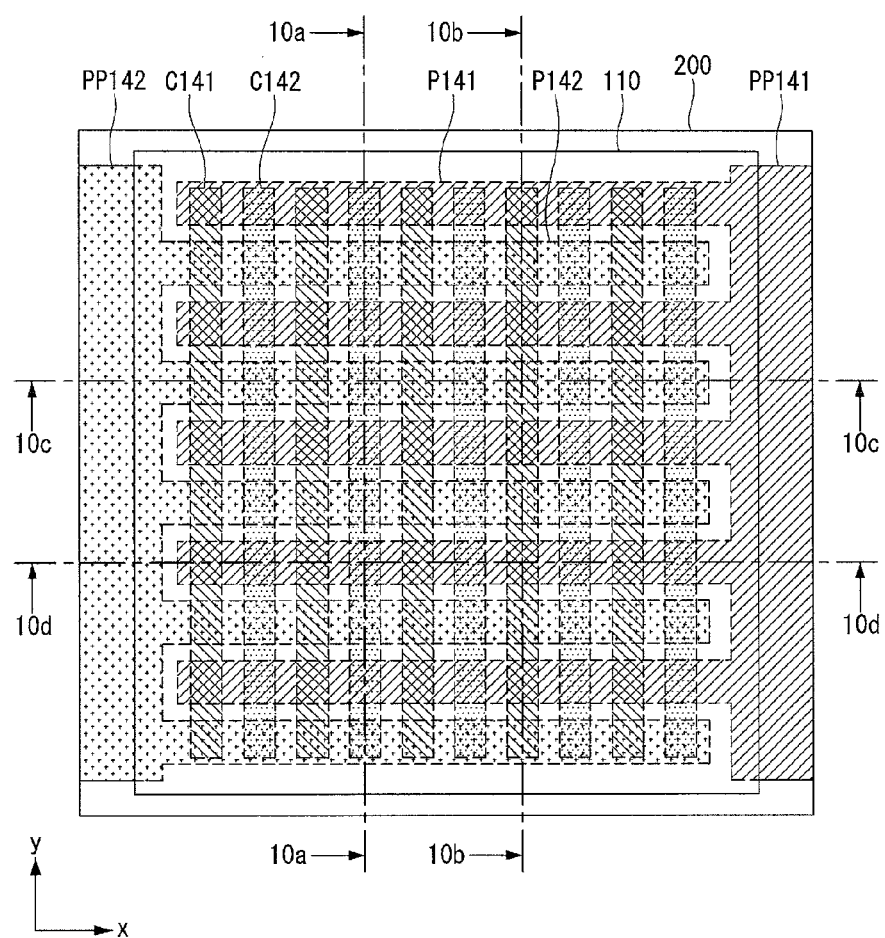
Figure 10A:
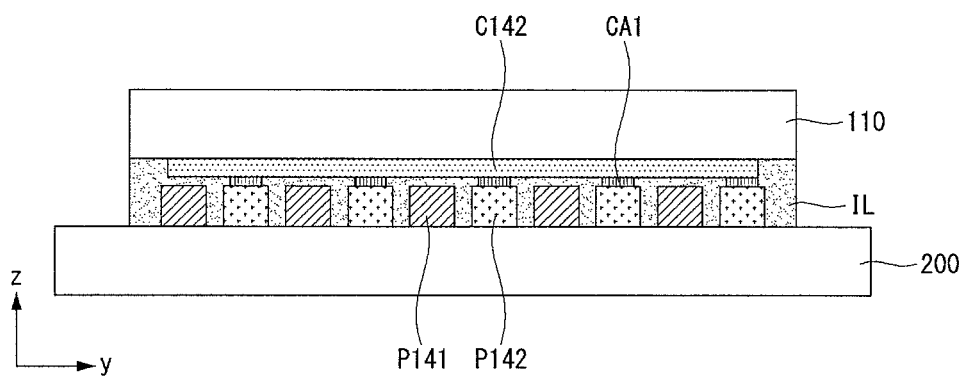
Figure 10B:
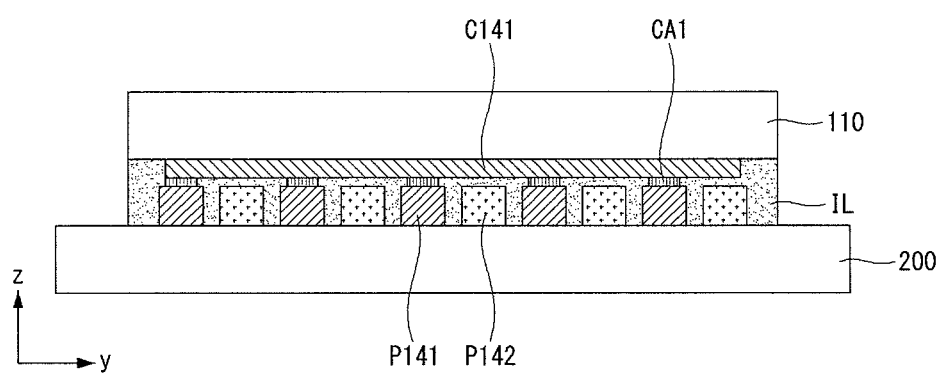
Figure 10C:
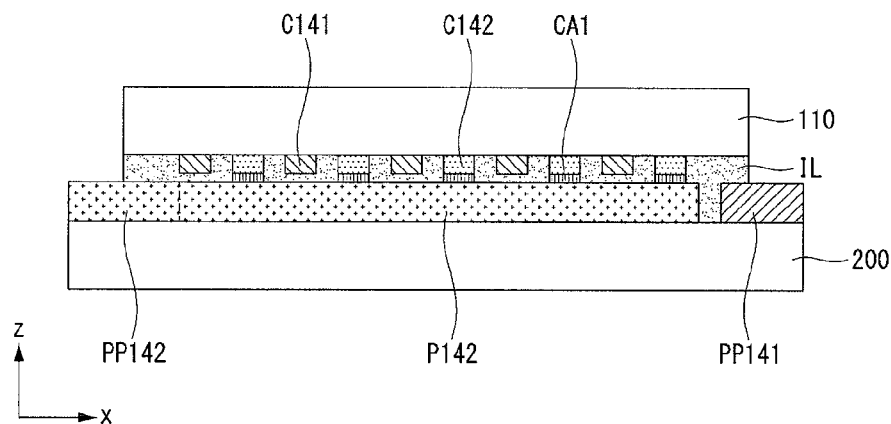
Figure 10D:
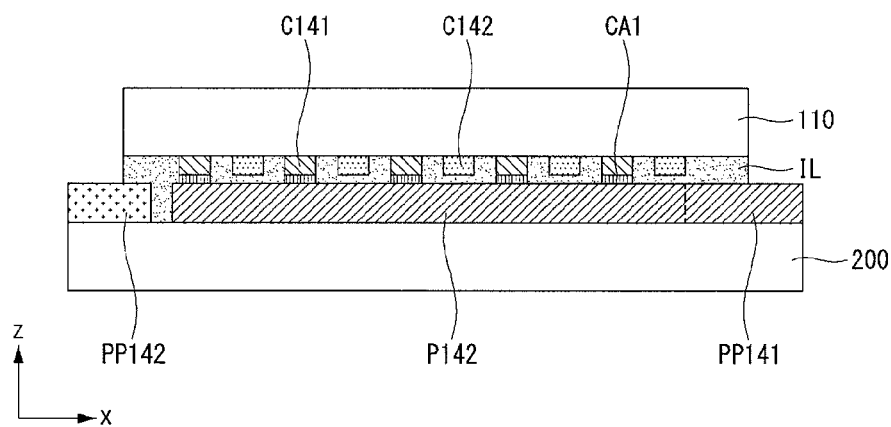

FIG. 9 is a plane view of a solar cell as an individual integrated type element formed by attaching an insulating member 200 to a back surface of a semiconductor substrate 110 shown in FIG. 8. FIG. 10A is a cross-sectional view taken along line 10a-10a on a second electrode C142 of FIG. 9 in the second direction y; FIG. 10B is a cross-sectional view taken along line 10b-10b on a first electrode C141 of FIG. 9 in the second direction y; FIG. 10C is a cross-sectional view taken along line 10c-10c on a second auxiliary electrode P142 of FIG. 9 in the first direction x; and FIG. 10D is a cross-sectional view taken along line 10d-10d on a first auxiliary electrode P141 of FIG. 9 in the first direction x.

The solar cell according to the embodiment of the invention forming an individual integrated type element by connecting each semiconductor substrate 110 to each insulating member 200 may be formed by attaching the front surface of the insulating member 200, on which the first auxiliary electrodes P141 and the second auxiliary electrodes P142 are formed in the first direction x, as shown in (b) of FIG. 8 to the back surface of the semiconductor substrate 110, on which the first electrodes C141 and the second electrodes C142 are formed in the second direction y, as shown in (a) of FIG. 8.

As shown in FIG. 9, when the semiconductor substrate 110 and the insulating member 200 are connected as described above, the first electrodes C141, the first auxiliary electrodes P141, the second electrodes C142, and the second auxiliary electrodes P142 may have a lattice shape when viewed from the front surface of the semiconductor substrate 110.

As shown in FIG. 10A, portions, in which the second electrodes C142 extending in the second direction y and the second auxiliary electrodes P142 extending in the first direction x overlap and cross each other, may be connected to one another through a first conductive adhesive CA1. Further, portions, in which the second electrodes C142 and the first auxiliary electrodes P141 overlap and cross each other, may be filled with an insulating layer IL and thus may be insulated from one another.

As shown in FIG. 10B, portions, in which the first electrodes C141 extending in the second direction y and the first auxiliary electrodes P141 extending in the first direction x overlap and cross each other, may be connected to one another through the first conductive adhesive CA1. Further, portions, in which the first electrodes C141 and the second auxiliary electrodes P142 overlap and cross each other, may be filled with the insulating layer IL and thus may be insulated from one another.

As shown in FIG. 10C, a space between the second auxiliary electrode P142 and a first auxiliary electrode pad PP141 may be filled with the insulating layer IL. A second area of a second auxiliary electrode pad PP142 not overlapping the semiconductor substrate 110 may be exposed to the outside.

As shown in FIG. 10D, a space between the first auxiliary electrode P141 and the second auxiliary electrode pad PP142 may be filled with the insulating layer IL. A second area of the first auxiliary electrode pad PP141 not overlapping the semiconductor substrate 110 may be exposed to the outside.

FIGS. 11 to 13D illustrate a third embodiment of an individual integrated type element formed by each semiconductor substrate and each insulating member in the solar cell module shown in FIG. 1.

Description of structures and components identical or equivalent to those described above may be briefly made or may be entirely omitted in FIGS. 11 to 13D.

Figure 11:
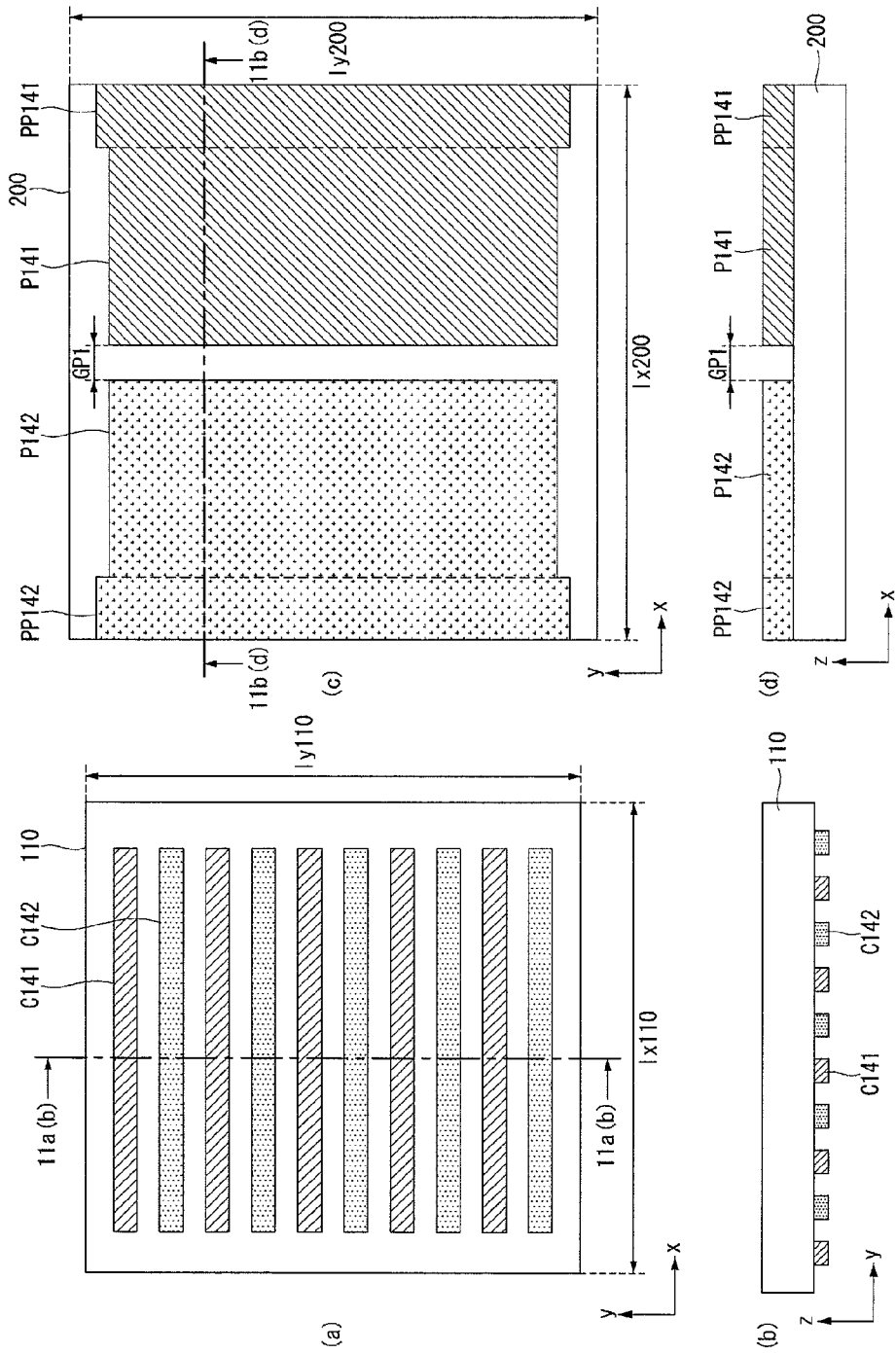
FIGS. 11 to 13D illustrate a third embodiment of an individual integrated type element formed by each semiconductor substrate and each insulating member in the solar cell module shown in FIG. 1.

In FIG. 11, (a) and (b) show that first electrodes C141 and second electrodes C142 are formed on a back surface of a semiconductor substrate 110 in the first direction x, and (c) and (d) show that each of a first auxiliary electrode P141 and a second auxiliary electrode P142 are formed as a sheet electrode on a front surface of an insulating member 200.

Figure 12:
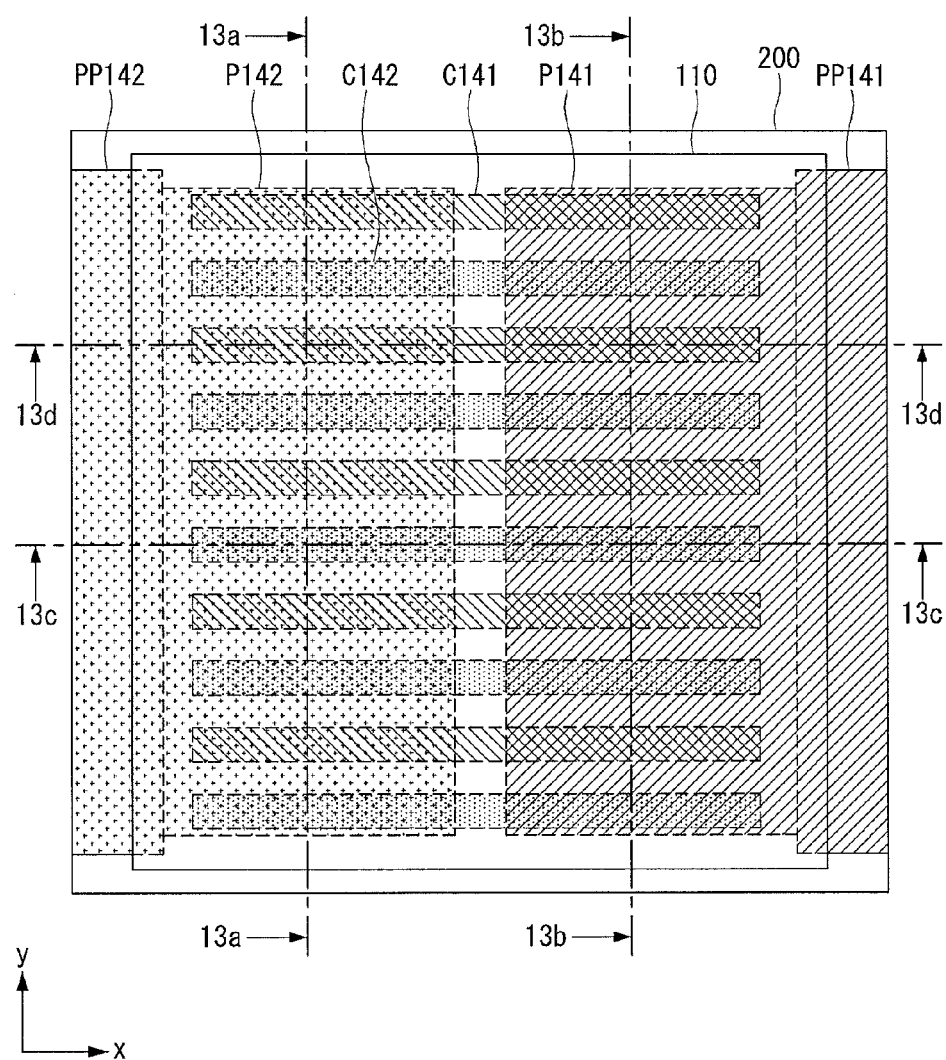
Figure 13A:
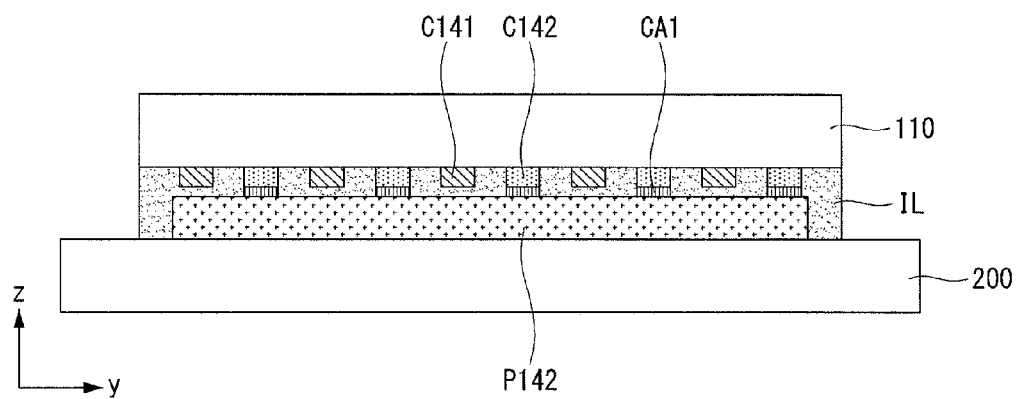
Figure 13B:
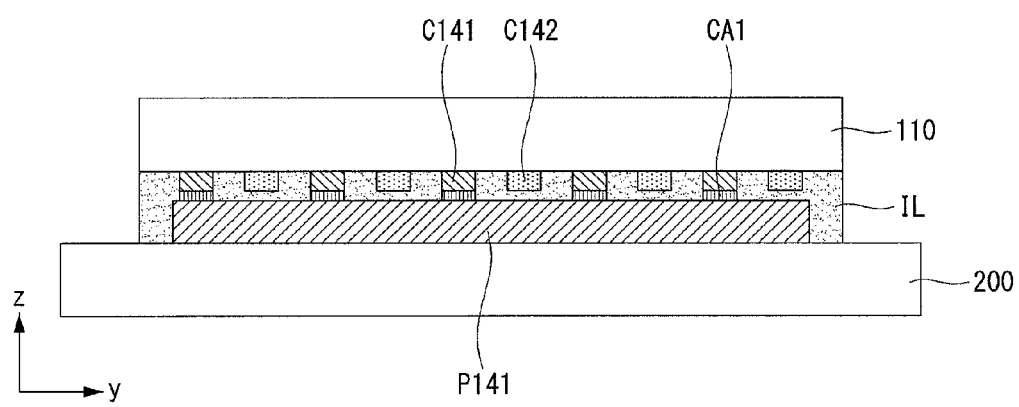
Figure 13C:
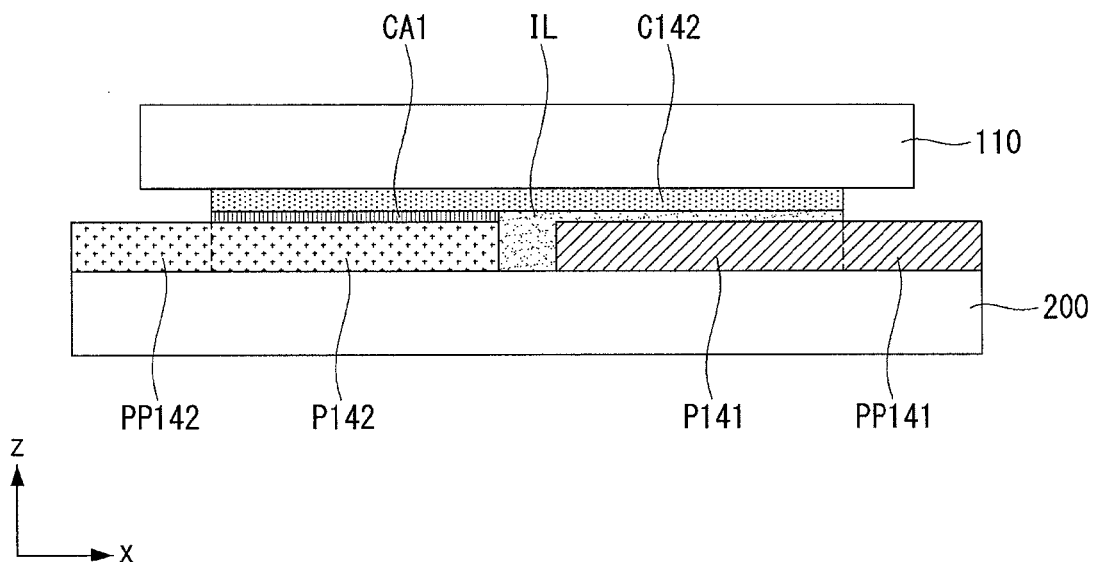
Figure 13D:
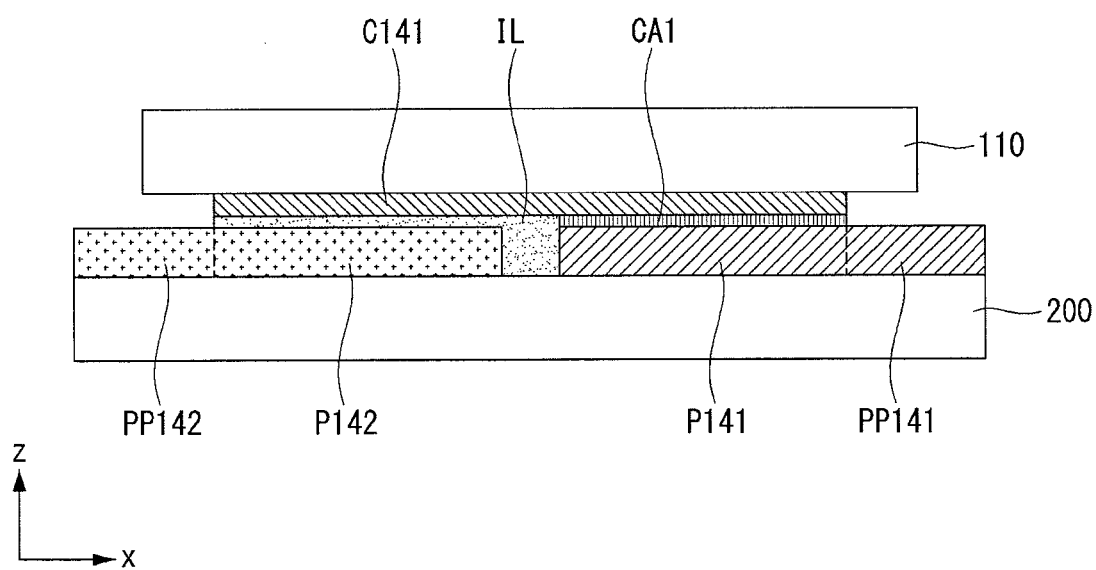

FIG. 12 is a plane view of a solar cell formed by attaching the insulating member 200 to the back surface of the semiconductor substrate 110 shown in FIG. 11. FIG. 13A is a cross-sectional view taken along line 13a-13a on the second auxiliary electrode P142 of FIG. 12 in the second direction y; FIG. 13B is a cross-sectional view taken along line 13b-13b on the first auxiliary electrode P141 of FIG. 12 in the second direction y; FIG. 13C is a cross-sectional view taken along line 13c-13c on the second electrode C142 of FIG. 12 in the first direction x; and FIG. 13D is a cross-sectional view taken along line 13d-13d on the first electrode C141 of FIG. 12 in the first direction x.

The solar cell according to the embodiment of the invention forming an individual integrated type element by connecting each semiconductor substrate 110 to each insulating member 200 may be formed by attaching the front surface of the insulating member 200, on which the first auxiliary electrode P141 and the second auxiliary electrode P142 are formed as the sheet electrode along the second direction y, as shown in (c) and (d) of FIG. 11 to the back surface of the semiconductor substrate 110, on which the first electrodes C141 and the second electrodes C142 are formed in the first direction x, as shown in (a) and (b) of FIG. 11.

As shown in (c) and (d) of FIG. 11, the first auxiliary electrode P141 and the second auxiliary electrode P142 may be positioned to be separated from each other by a distance GP1 in the direction parallel to the second direction y along the middle of the insulating member 200.

More specifically, as shown in FIG. 12, the insulating member 200 may be attached to the semiconductor substrate 110 in a state where a first conductive adhesive CA1 is applied to the first electrodes C141 and an insulating layer IL is applied to the second electrodes C142 in portions of the first and second electrodes C141 and C142 overlapping the first auxiliary electrode P141, and the first conductive adhesive CA1 is applied to the second electrodes C142 and the insulating layer IL is applied to the first electrodes C141 in portions of the first and second electrodes C141 and C142 overlapping the second auxiliary electrode P142.

FIG. 12 shows the plane of the configuration, in which the insulating member 200 is attached to the semiconductor substrate 110.

As shown in FIG. 13A, the second electrodes C142 and the second auxiliary electrode P142 may be electrically connected to each other through the first conductive adhesive CA1 in overlap portions therebetween. Further, the second auxiliary electrode P142 may be insulated from the first electrodes C141 through the insulating layer IL.

As shown in FIG. 13B, the first electrodes C141 and the first auxiliary electrode P141 may be electrically connected to each other through the first conductive adhesive CA1 in overlap portions therebetween. Further, the first auxiliary electrode P141 may be insulated from the second electrodes C142 through the insulating layer IL.

As shown in FIG. 13C, an overlap portion between the second electrode C142 extending in the first direction x and the second auxiliary electrode P142 may be electrically connected to the second auxiliary electrode P142 through the first conductive adhesive CA1. Further, an overlap portion between the second electrode C142 and the first auxiliary electrode P141 may be insulated from the first auxiliary electrode P141 through the insulating layer IL.

As shown in FIG. 13D, an overlap portion between the first electrode C141 extending in the first direction x and the first auxiliary electrode P141 may be electrically connected to the first auxiliary electrode P141 through the first conductive adhesive CA1. Further, an overlap portion between the first electrode C141 and the second auxiliary electrode P142 may be insulated from the second auxiliary electrode P142 through the insulating layer IL.

In the third embodiment of the invention, the insulating layer IL may be formed between the first auxiliary electrode P141 and the second auxiliary electrode P142.

FIGS. 14 to 16B illustrate a fourth embodiment of an individual integrated type element formed by each semiconductor substrate and each insulating member in the solar cell module shown in FIG. 1.

Description of structures and components identical or equivalent to those described above may be briefly made or may be entirely omitted in FIGS. 14 to 16B.

Figure 14:
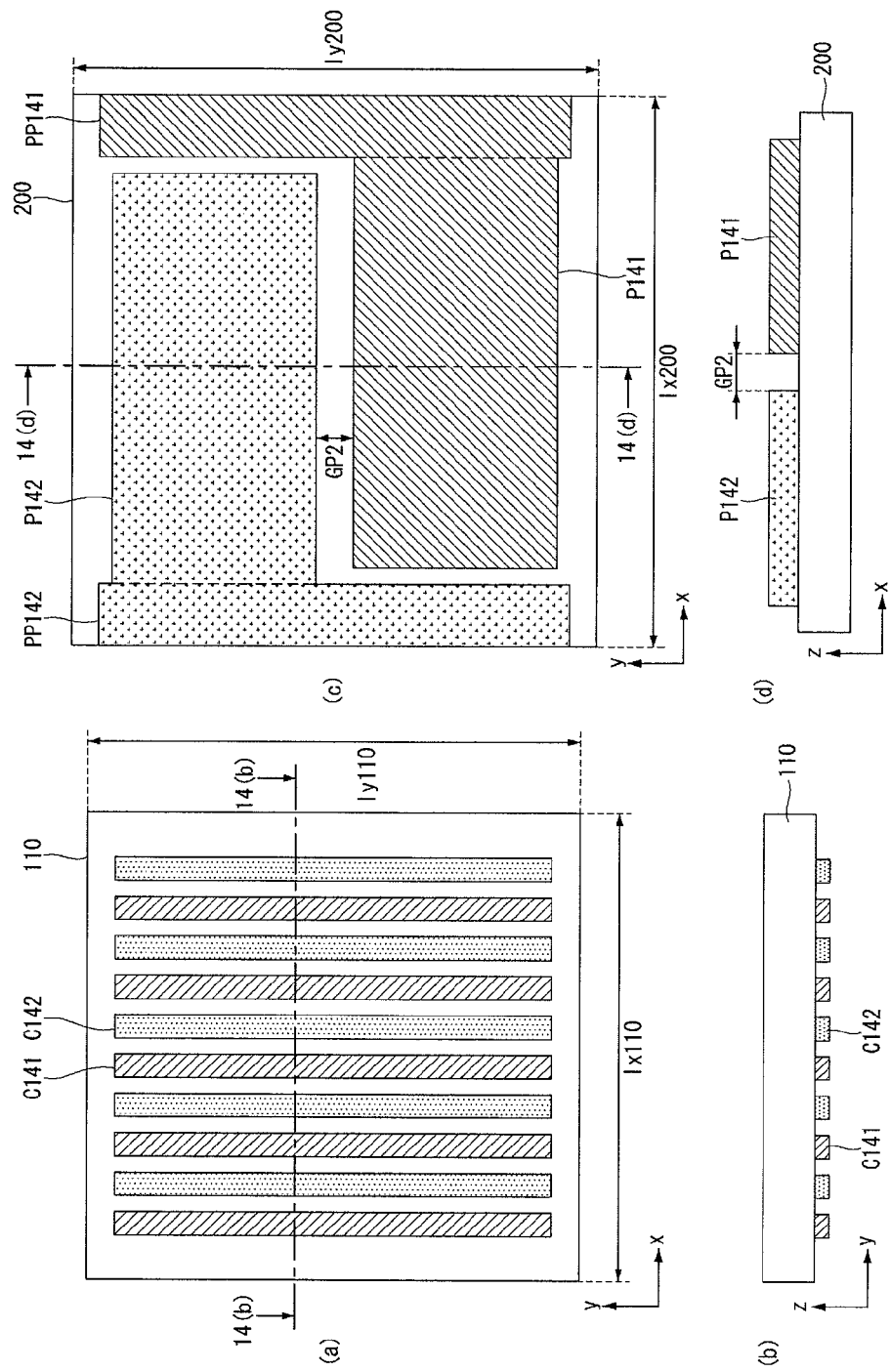
FIGS. 14 to 16B illustrate a fourth embodiment of an individual integrated type element formed by each semiconductor substrate and each insulating member in the solar cell module shown in FIG. 1.

In FIG. 14, (a) and (b) show that first electrodes C141 and second electrodes C142 are formed on a back surface of a semiconductor substrate 110 in the second direction y, and (c) and (d) show that each of a first auxiliary electrode P141 and a second auxiliary electrode P142 are formed on a front surface of an insulating member 200 in the form of a sheet electrode in the first direction x.

Figure 15:
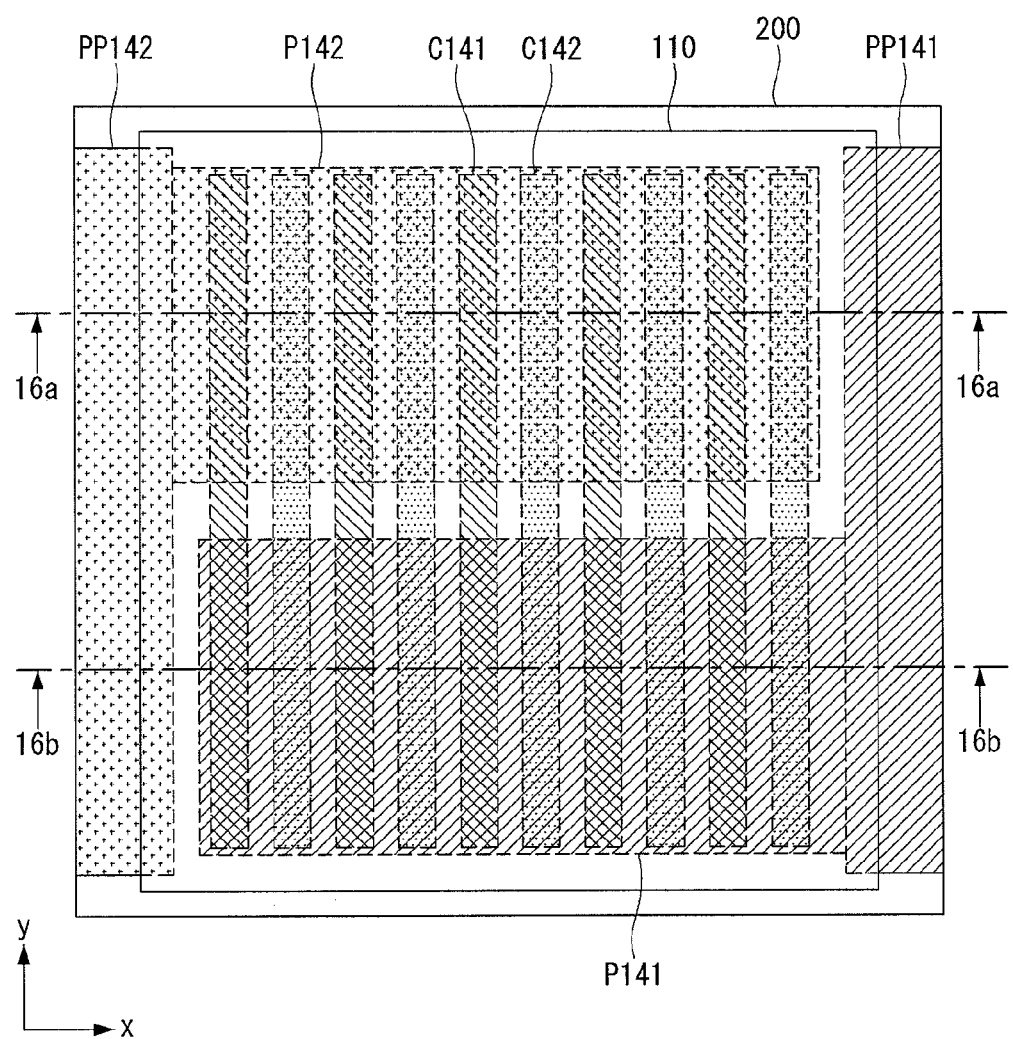
Figure 16A:
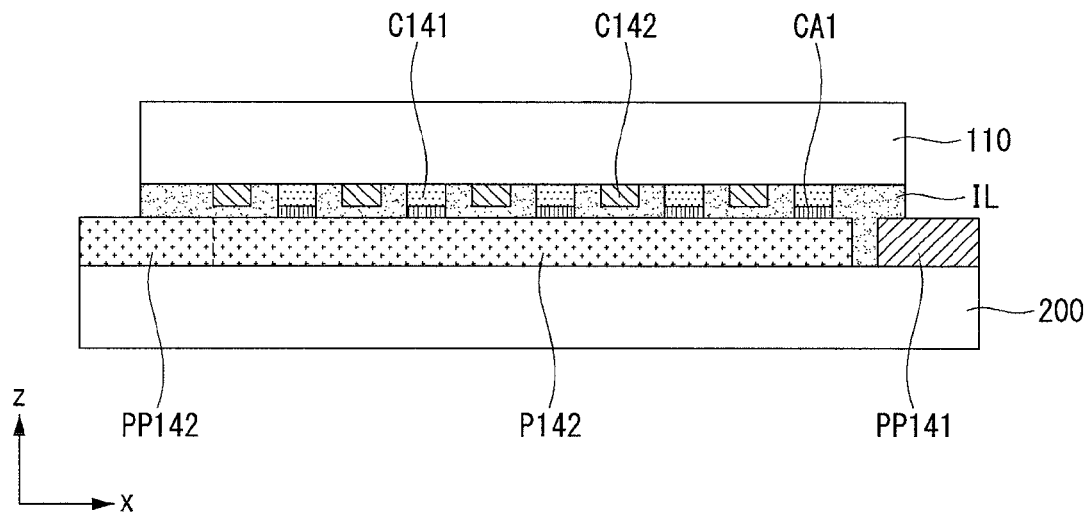
Figure 16B:
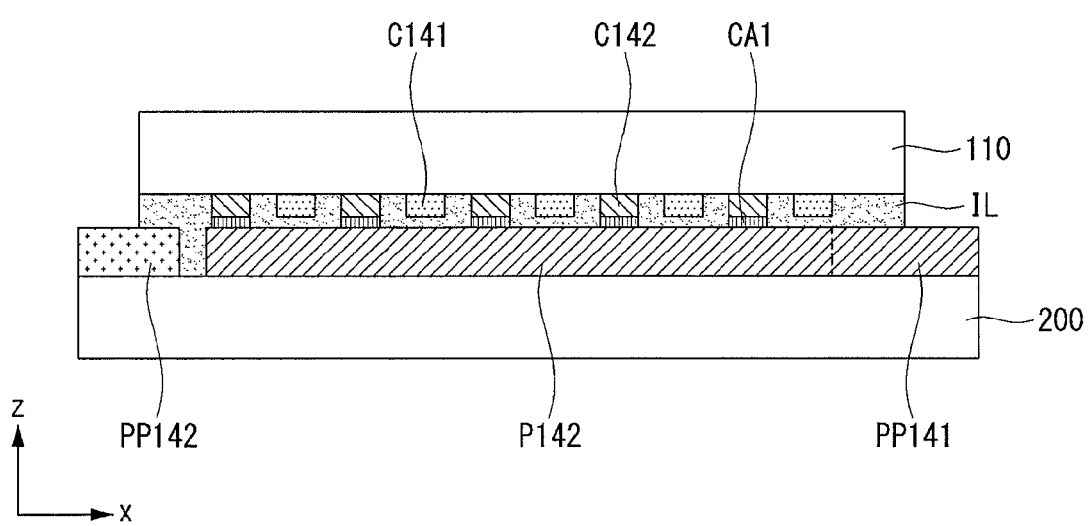

FIG. 15 is a plane view of a solar cell formed by attaching the insulating member 200 to the back surface of the semiconductor substrate 110 shown in FIG. 14. FIG. 16A is a cross-sectional view taken along line 16a-16a on the second auxiliary electrode P142 of FIG. 15 in the first direction x, and FIG. 16B is a cross-sectional view taken along line 16b-16b on the first auxiliary electrode P141 of FIG. 15 in the first direction x.

As shown in (a) and (b) of FIG. 14, the first electrodes C141 and the second electrodes C142 may be formed on the back surface of the semiconductor substrate 110 in the second direction y. As shown in (c) and (d) of FIG. 14, the first electrodes C141 and the second electrodes C142 formed in the second direction y may cross and may be connected to the first auxiliary electrode P141 and the second auxiliary electrode P142 formed in the form of the sheet electrode along the first direction x.

The solar cell according to the embodiment of the invention forming an individual integrated type element by connecting each semiconductor substrate 110 with each insulating member 200 may be formed by attaching the front surface of the insulating member 200, on which the first auxiliary electrode P141 and the second auxiliary electrode P142 are formed in the form of the sheet electrode along the first direction x, as shown in (c) and (d) of FIG. 14 to the back surface of the semiconductor substrate 110, on which the first electrodes C141 and the second electrodes C142 are formed in the second direction y, as shown in (a) and (b) of FIG. 14.

As shown in (c) and (d) of FIG. 14, the first auxiliary electrode P141 and the second auxiliary electrode P142 may be positioned to be separated from each other by a distance GP2 in the direction parallel to the first direction x along the middle of the insulating member 200.

More specifically, as shown in FIG. 15, the insulating member 200 may be attached to the semiconductor substrate 110 in a state where a first conductive adhesive CA1 is applied to the first electrodes C141 and an insulating layer IL is applied to the second electrodes C142 in portions of the first and second electrodes C141 and C142 overlapping the first auxiliary electrode P141 extending in the first direction x, and the first conductive adhesive CA1 is applied to the second electrodes C142 and the insulating layer IL is applied to the first electrodes C141 in portions of the first and second electrodes C141 and C142 overlapping the second auxiliary electrode P142 extending in the first direction x.

FIG. 15 shows the plane of the configuration, in which the insulating member 200 is attached to the semiconductor substrate 110.

As shown in FIG. 16A, the second electrodes C142 may be electrically connected to the second auxiliary electrode P142 through the first conductive adhesive CA1 in overlap portions between the second auxiliary electrode P142 and the second electrodes C142. Further, the second auxiliary electrode P142 may be insulated from the first electrodes C141 through the insulating layer IL.

As shown in FIG. 16B, the first electrodes C141 may be electrically connected to the first auxiliary electrode P141 through the first conductive adhesive CA1 in overlap portions between the first auxiliary electrode P141 and the first electrodes C141. Further, the first auxiliary electrode P141 may be insulated from the second electrodes C142 through the insulating layer IL.

As shown in FIGS. 11 to 16B, when each of the first auxiliary electrode P141 and the second auxiliary electrode P142 is formed as one sheet electrode, an alignment process may be very easily performed because the precise alignment process is not required. Hence, manufacturing time of the solar cell may be further reduced.

A method for connecting the semiconductor substrate 110 and the insulating member 200 using the first conductive adhesive CA1 is described below. In the following description, the first embodiment of the individual integrated type element formed by connecting one semiconductor substrate 110 and one insulating member 200 is used as an example.

Figure 17:
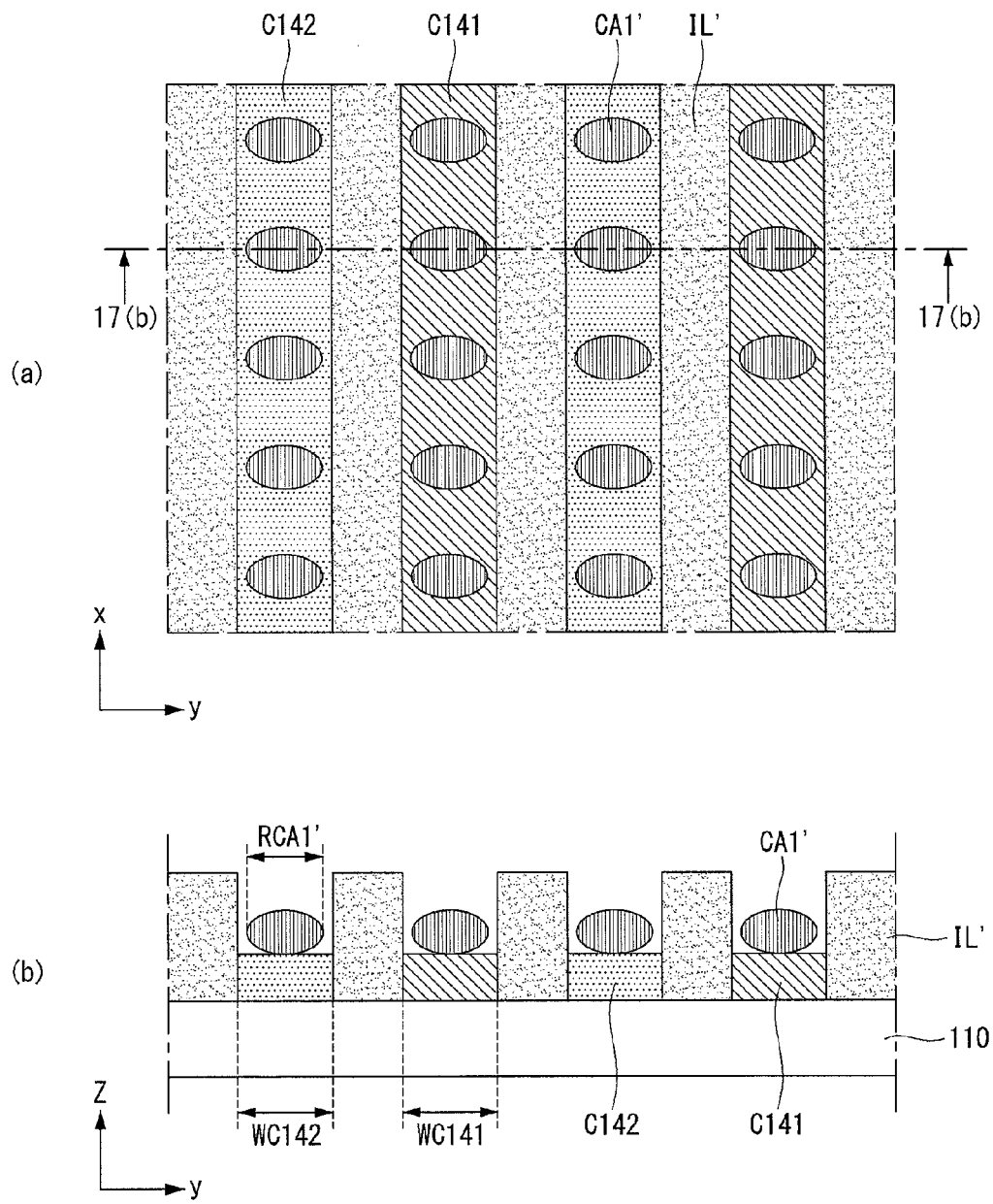
FIGS. 17 to 19 illustrate a first embodiment of a method for connecting a semiconductor substrate and an insulating member to form an individual integrated type element in the solar cell module shown in FIG. 1.
Figure 18:
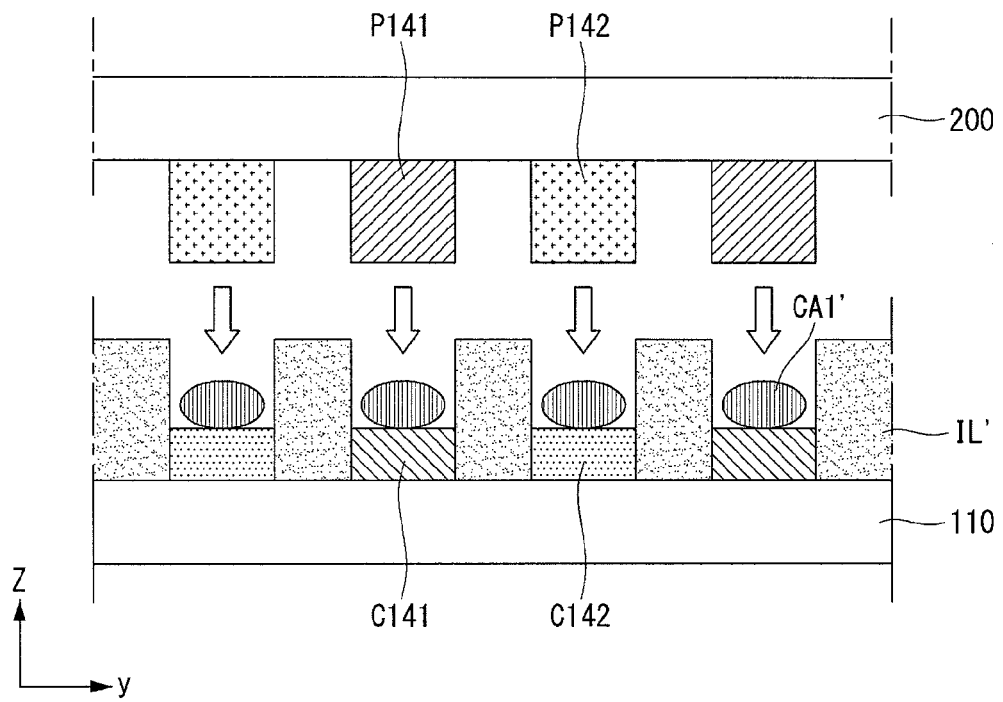
Figure 19:
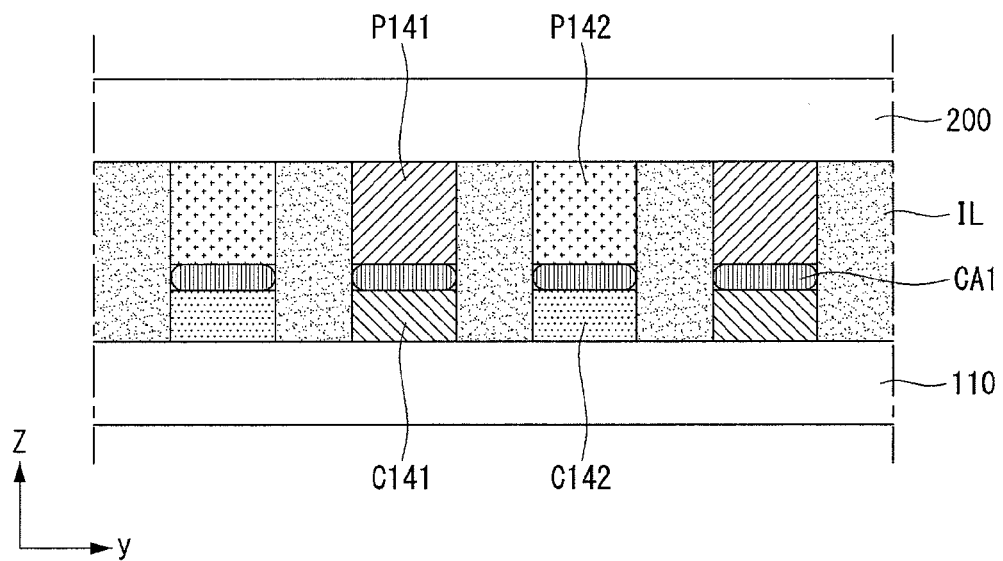

FIGS. 17 to 19 illustrate a first embodiment of a method for connecting a semiconductor substrate and an insulating member to form an individual integrated type element in the solar cell module shown in FIG. 1.

In FIG. 17, (a) shows that a first conductive adhesive CA1 is applied to first and second electrodes C141 and C142 of a semiconductor substrate 110, and (b) is a cross-sectional view taken along line 17(b)-17(b) of (a) of FIG. 17.

A method for manufacturing a solar cell according to the embodiment of the invention formed as an individual integrated type element by connecting one semiconductor substrate 110 and one insulating member 200 is described below.

As shown in (a) and (b) of FIG. 17, an insulating material IL' for forming an insulating layer IL may be applied between the first and second electrodes C141 and C142, which are positioned to be separated from each other in the first direction x, and a plurality of first conductive connection materials CA1' for forming the first conductive adhesive CA1 may be arranged to be separated from one another on back surfaces of the first and second electrodes C141 and C142 in the first direction x. However, on the contrary, the first conductive connection material CA1' is not separated and may be successively applied to the back surfaces of the first and second electrodes C141 and C142.

The first conductive connection material CA1' may have a ball shape or a stud shape and may contain at least one of Sn, Cu, Ag, and Bi. For example, the first conductive connection material CA1' may be formed of a solder ball.

A diameter RCA1' of the first conductive connection material CA1' may be less than a width WC141 of the first electrode C141 or a width WC142 of the second electrode C142. For example, the diameter RCA1' of the first conductive connection material CA1' may be about 5% to 95% of the width WC141 of the first electrode C141 or the width WC142 of the second electrode C142. More specifically, the diameter RCA1' of the first conductive connection material CA1' may be about 5 µm to 100 µm.

A melting point of the first conductive connection material CA1' may be lower than a melting point of the insulating member 200. For example, when the melting point of the first conductive connection material CA1' may be about 130° C. to 250° C., the melting point of the insulating member 200 may be higher than the melting point of the first conductive connection material CA1' and may be equal to or higher than about 300° C.

Further, the insulating material IL' applied between the first and second electrodes C141 and C142 may be an epoxy resin. A melting point of the insulating material IL' may be equal to or lower than the melting point of the first conductive connection material CA1'.

As shown in FIG. 18, the alignment process may be performed to overlap the first electrode C141 and the first auxiliary electrode P141 and to overlap the second electrode C142 and the second auxiliary electrode P142 on the back surface of the semiconductor substrate 110, on which the insulating material IL' and the first conductive connection material CA1' are formed. Then, a soldering process may be performed to attach the front surface of the insulating member 200 to the back surface of the semiconductor substrate 110.

A pressurization process for applying a proper pressure to the insulating member 200 may be performed together while performing a thermal process of about 130° C. to 250° C. on the insulating member 200 in the soldering process.

The thermal process may be performed by continuously applying air of a high temperature to the first conductive connection material CA1', or may be performed in a state where the semiconductor substrate 110 is positioned on a plate, to which the above temperature is applied.

Hence, as shown in FIG. 19, while the first conductive connection material CA1' is widely distributed between the first electrode C141 and the first auxiliary electrode P141 through the soldering process, the first conductive adhesive CA1 connecting the first electrode C141 and the first auxiliary electrode P141 may be formed. Further, the second electrode C142 and the second auxiliary electrode P142 may be connected to each other in the same manner.

The insulating material IL' may be filled in a space between the first electrode C141 and the second electrode C142 and a space between the first auxiliary electrode P141 and the second auxiliary electrode P142 through the soldering process to form the insulating layer IL.

The above-described method may minimize the thermal expansion stress of the semiconductor substrate 110 when the first auxiliary electrode P141 and the second auxiliary electrode P142 are formed on the back surface of the semiconductor substrate 110, and may increase the thickness of the electrodes of the semiconductor substrate 110 to minimize the resistance of the electrodes. Hence, a short circuit current may be further improved.

Figure 20:
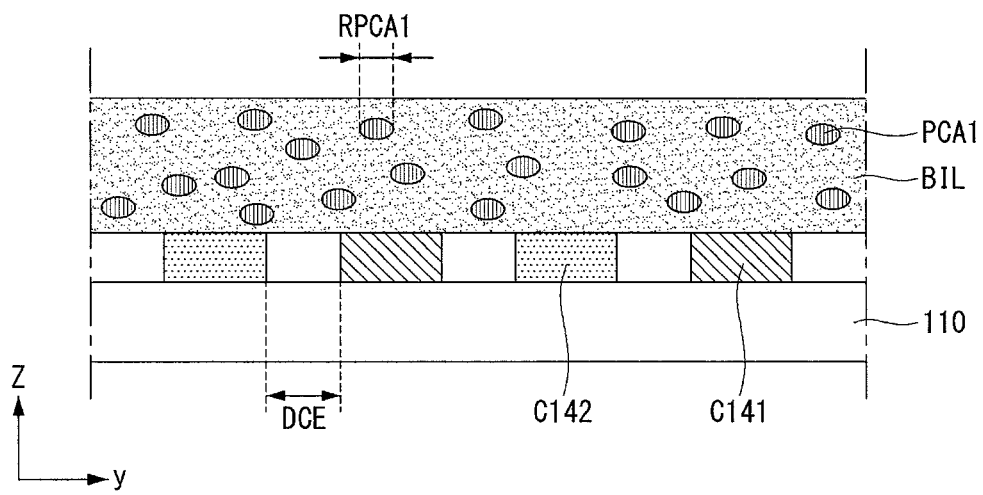
FIGS. 20 to 22 illustrate a second embodiment of a method for connecting a semiconductor substrate and an insulating member to form an individual integrated type element in the solar cell module shown in FIG. 1.
Figure 21:
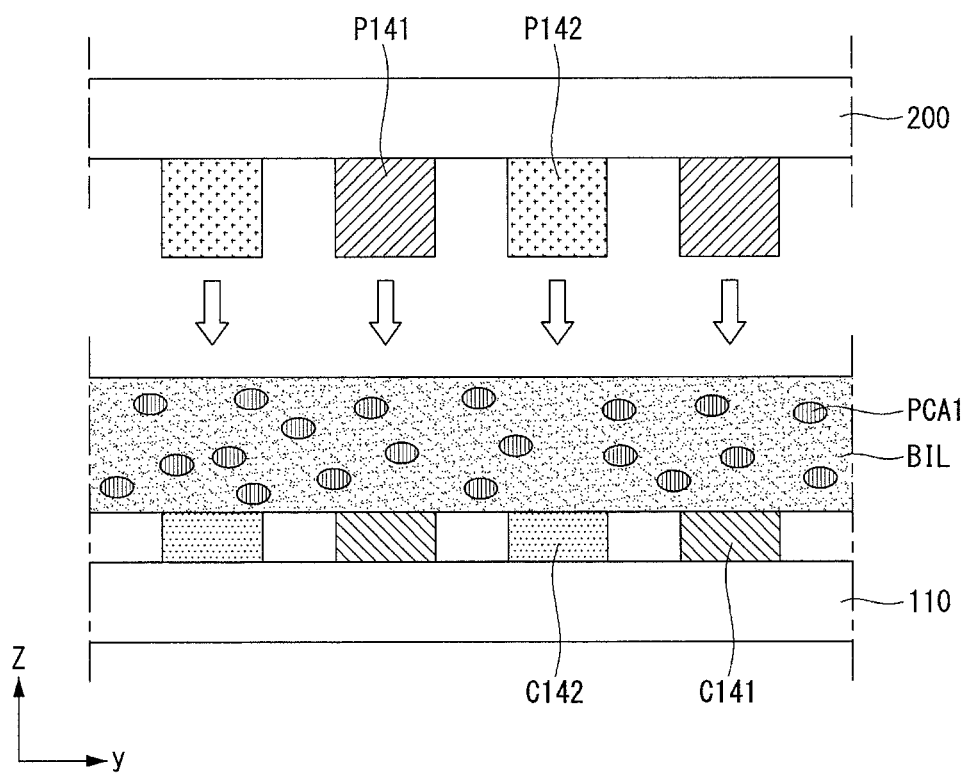
Figure 22:
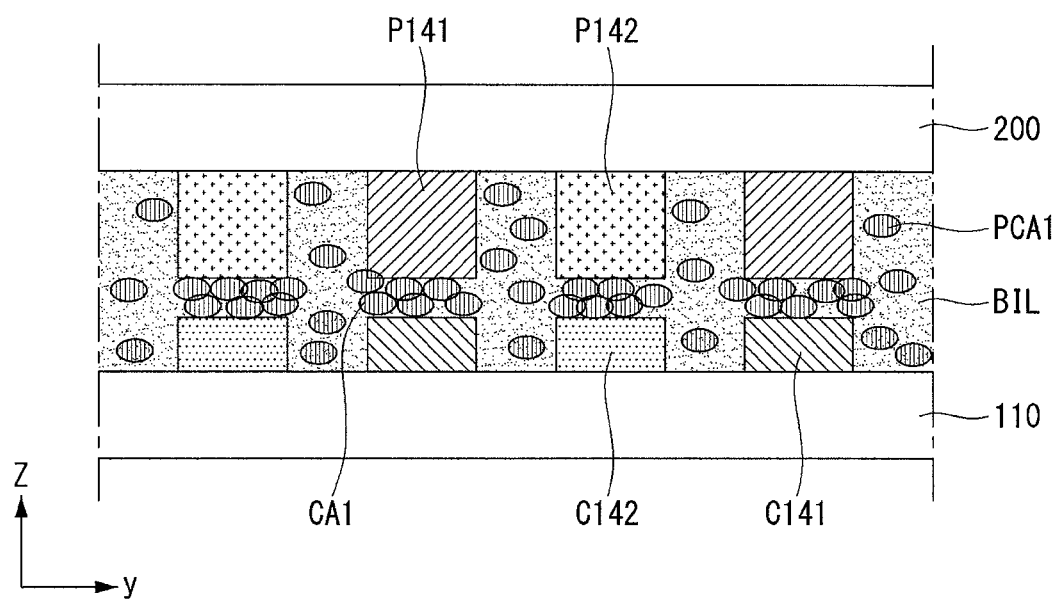

FIGS. 20 to 22 illustrate a second embodiment of a method for connecting a semiconductor substrate and an insulating member to form an individual integrated type element in the solar cell module shown in FIG. 1.

Unlike the above-described method, as shown in FIG. 20, a conductive adhesive layer PCA1+BIL may be used to form a first conductive adhesive CA1.

More specifically, the conductive adhesive layer PCA1+BIL may be obtained by distributing a plurality of conductive metal particles PCA1 in a base BIL of an insulating material. The size (for example, a diameter RPCA1) of the conductive metal particle PCA1 may be less than a distance between the first electrode C141 and the second electrode C142 and/or a distance between the first auxiliary electrode P141 and the second auxiliary electrode P142. For example, the diameter RPCA1 of the conductive metal particle PCA1 may be about 5% to 50% of a distance DCE between the first electrode C141 and the second electrode C142 and/or the distance between the first auxiliary electrode P141 and the second auxiliary electrode P142. However, the embodiment of the invention is not limited thereto.

As shown in FIG. 20, the conductive adhesive layer PCA1+BIL may be applied on the first electrode C141 and the second electrode C142 formed on the back surface of the semiconductor substrate 110.

Next, as shown in FIG. 21, an alignment process may be performed, so that the first auxiliary electrode P141 and the second auxiliary electrode P142 formed on the front surface of the insulating member 200 respectively overlap the first electrode C141 and the second electrode C142. Then, the insulating member 200 may be attached to the back surface of the semiconductor substrate 110 through the proper pressure and heat. In this instance, a temperature of heat may be about 130° C. to 250° C. or may be less than about 130° C.

Hence, as shown in FIG. 22, the conductive metal particles PCA1 may be adhere to one another in an overlap portion between the first electrode C141 and the first auxiliary electrode P141 and an overlap portion between the second electrode C142 and the second auxiliary electrode P142, thereby forming the first conductive adhesive CA1. The conductive metal particles PCA1 may be separated from one another in the base BIL of the insulating material in a non-overlap portion, thereby forming an insulating layer IL.

So far, the various connection structures between each semiconductor substrate 110 and each insulating member 200 and the various methods for connecting each semiconductor substrate 110 and each insulating member 200 were described. Hereinafter, a connection structure and a connection method of the plurality of solar cells through the interconnector IC are described.

Figure 23A:
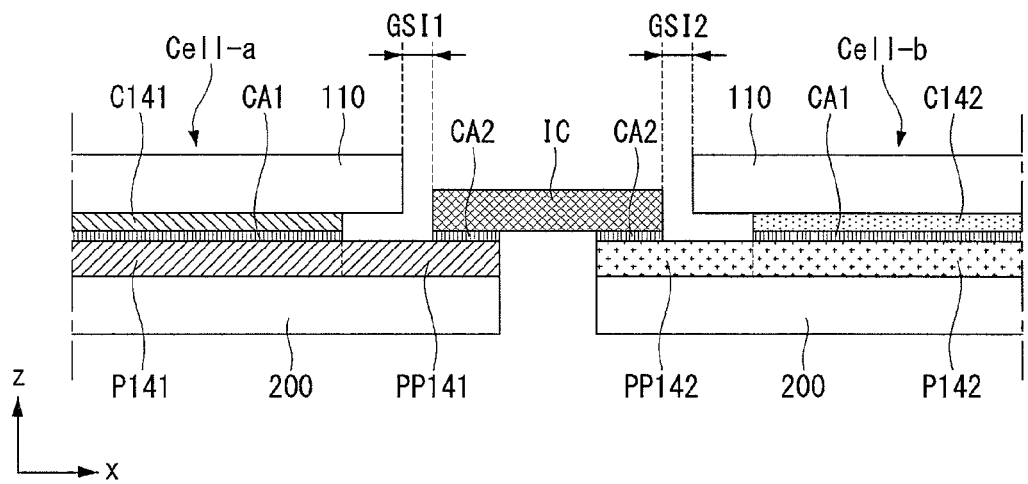
FIGS. 23A to 24 show an example of a connection structure of solar cells, each of which is formed as an individual integrated type element, through an interconnector in the solar cell module shown in FIG. 1.
Figure 23B:
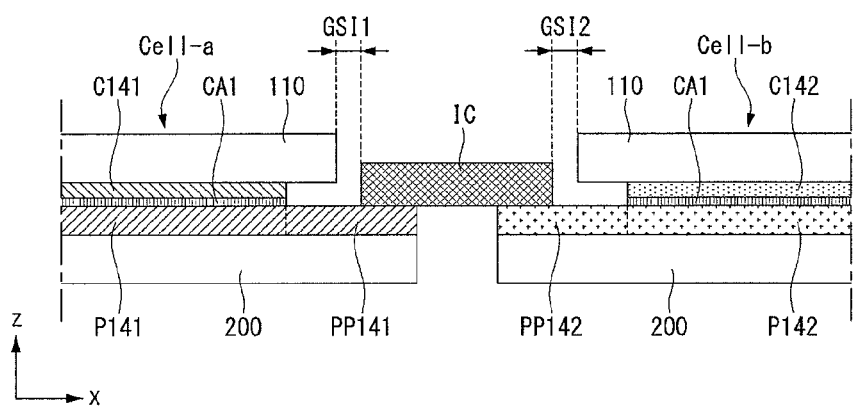
Figure 24:
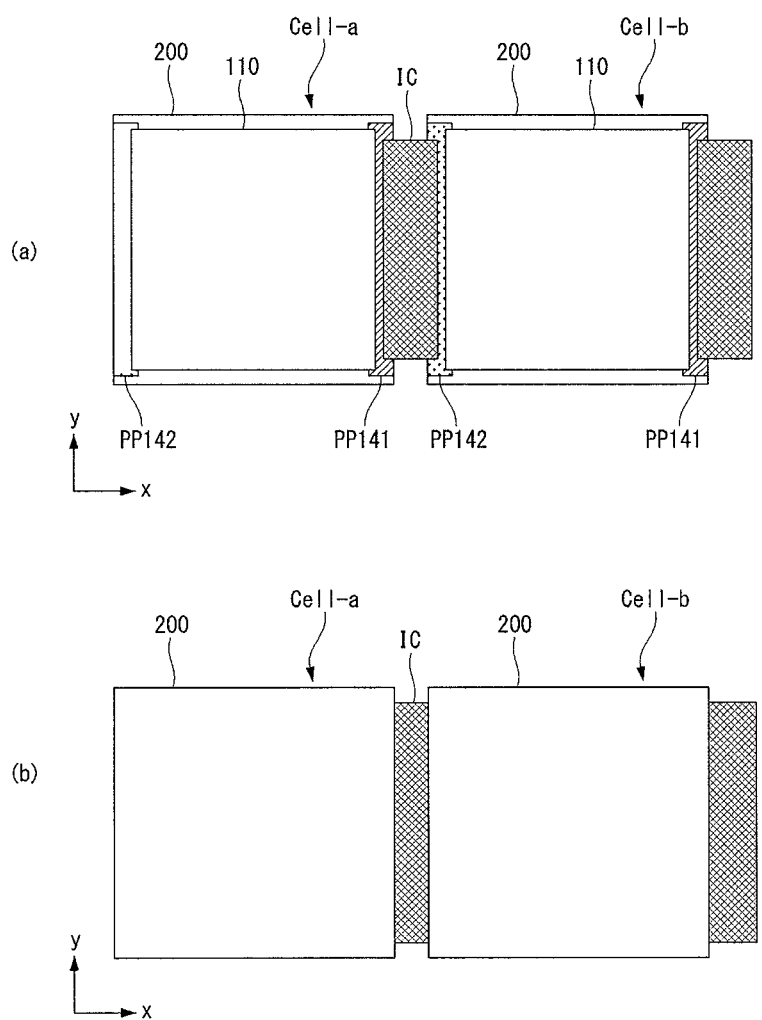

FIGS. 23A to 24 show an example of a connection structure of solar cells, each of which is formed as an individual integrated type element, through an interconnector in the solar cell module shown in FIG. 1.

More specifically, FIG. 23A illustrates a first embodiment of a cell string structure, in which the solar cells formed as the individual integrated type element are connected through the interconnector, and FIG. 23B illustrates a second embodiment of the cell string structure. FIG. 24 shows the connection of the solar cells formed as the individual integrated type element through the interconnector when viewed from an front surface and a back surface, wherein (a) corresponds to the front surface, and (b) corresponds to the back surface.

The first solar cell Cell-a and the second solar cell Cell-b applied to the solar cell module according to the embodiment of the invention may use any one of the above-described solar cells.

Accordingly, each of a first solar cell Cell-a and a second solar cell Cell-b shown in FIGS. 23A and 24 may include a semiconductor substrate 110, an anti-reflection layer 130, an emitter region 121, a back surface field region 172, first electrodes C141, second electrodes C142, a first auxiliary electrode P141, a second auxiliary electrode P142, a first auxiliary electrode pad PP141, a second auxiliary electrode pad PP142, and an insulating member 200.

Further, each of the first auxiliary electrode pad PP141 and the second auxiliary electrode pad PP142 may include a first area overlapping the semiconductor substrate 110 and a second area not overlapping the semiconductor substrate 110.

Further, all of the structures of the solar cell described above may be applicable, if necessary or desired. A further description may be briefly made or may be entirely omitted.

As described above, each of the first solar cell Cell-a and the second solar cell Cell-b applied to the solar cell module according to the embodiment of the invention may be formed as an individual integrated type element formed by connecting one semiconductor substrate 110 and one insulating member 200.

Hence, even if one solar cell is broken or damaged in the manufacturing process of the solar cell module, the embodiment of the invention may replace only the broken or damaged solar cell, compared to a structure of a solar cell, in which several semiconductor substrates 110 are attached to one insulating member 200. As a result, the process yield of the solar cell module may be further improved.

Further, the solar cell module may be easily formed without a limit to the size of the front glass substrate FG.

The insulating member 200 of the first solar cell Cell-a may not overlap the semiconductor substrate 110 of the second solar cell Cell-b, and the insulating member 200 of the second solar cell Cell-b may not overlap the semiconductor substrate 110 of the first solar cell Cell-a.

Accordingly, the first auxiliary electrode pad PP141 included in the first solar cell Cell-a may be separated from the second auxiliary electrode pad PP142 included in the second solar cell Cell-b.

As shown in FIG. 23A, the first solar cell Cell-a and the second solar cell Cell-b may be connected to each other through the interconnector IC to form the solar cell module.

Namely, the interconnector IC may electrically connect the second auxiliary electrode pad PP142 of the first solar cell Cell-a to the first auxiliary electrode pad PP141 of the second solar cell Cell-b or may electrically connect the first auxiliary electrode pad PP141 of the first solar cell Cell-a to the second auxiliary electrode pad PP142 of the second solar cell Cell-b.

More specifically, the insulating member 200 of each of the first solar cell Cell-a and the second solar cell Cell-b may overlap the interconnector IC. One end of the interconnector IC may overlap and may be connected to the second area PP141-S2 of the first auxiliary electrode pad PP141, which is exposed to the outside of the semiconductor substrate 110 of the first solar cell Cell-a among areas of the first auxiliary electrode pad PP141 formed at one end of the insulating member 200 of the first solar cell Cell-a. Further, the other end of the interconnector IC may overlap and may be connected to the second area PP141-S2 of the second auxiliary electrode pad PP142, which is exposed to the outside of the semiconductor substrate 110 of the second solar cell Cell-b among areas of the second auxiliary electrode pad PP142 formed at one end of the insulating member 200 of the second solar cell Cell-b.

In this instance, as shown in FIG. 23A, the interconnector IC and the first auxiliary electrode pad PP141 or the interconnector IC and the second auxiliary electrode pad PP142 may be electrically connected to each other through a second conductive adhesive CA2. The interconnector IC may contain a conductive metal. For example, the interconnector IC may contain at least one of Cu, Au, Ag, and Al. Further, the second conductive adhesive CA2 may be formed of the same material as the first conductive adhesive CA1.

Alternatively, as shown in FIG. 23B, the interconnector IC may physically contact and may be electrically connected to the first auxiliary electrode pad PP141 or the second auxiliary electrode pad PP142 through the heat and the pressure without the separate second conductive adhesive CA2.

As shown in FIGS. 23A and 23B, the interconnector IC may be separated from the semiconductor substrate 110 of the first solar cell Cell-a or the semiconductor substrate 110 of the second solar cell Cell-b. However, the configuration is not indispensable. For example, the interconnector IC and the semiconductor substrate 110 may not be separated from each other.

When the interconnector IC and the semiconductor substrate 110 are separated from each other, the thermal expansion stress of the semiconductor substrate 110 may be minimized. Further, an optical gain of the solar cell module may further increase through the interconnector IC. Hereinafter, the embodiment of the invention is described using the structure, in which the interconnector IC and the semiconductor substrate 110 are separated from each other, as an example.

As shown in FIGS. 23A to 24, when the interconnector IC and the semiconductor substrate 110 are separated from each other in the solar cell module according to the embodiment of the invention, the interconnector IC and the semiconductor substrate 110 of the first solar cell Cell-a may be separated from each other by a first distance GSI1, and the interconnector IC and the semiconductor substrate 110 of the second solar cell Cell-b may be separated from each other by a second distance GSI2.

The interconnector IC may overlap the insulating member 200 of the first solar cell Cell-a and the insulating member 200 of the second solar cell Cell-b.

Accordingly, as shown in (a) of FIG. 24, when viewing the first solar cell Cell-a and the second solar cell Cell-b from the front surface, the interconnector IC maybe attached to the front surface of the insulating member 200 of the first solar cell Cell-a and the front surface of the insulating member 200 of the second solar cell Cell-b. Further, as shown in (b) of FIG. 24, when viewing the first solar cell Cell-a and the second solar cell Cell-b from the back surface, both ends of the interconnector IC may partially overlap the insulating member 200 of the first solar cell Cell-a and the insulating member 200 of the second solar cell Cell-b and may be partially covered with them.

As described above, the interconnector IC is not directly connected to the semiconductor substrate 110 of the first solar cell Cell-a and the semiconductor substrate 110 of the second solar cell Cell-b and is connected to the first solar cell Cell-a and the second solar cell Cell-b through the insulating member 200 while being separated from the semiconductor substrate 110. Therefore, when the interconnector IC is connected to the first solar cell Cell-a and the second solar cell Cell-b, the heat does not need to be directly applied to the semiconductor substrate 110. Hence, the thermal expansion stress of the semiconductor substrate 110 may be minimized.

Further, because a distance between the first solar cell Cell-a and the second solar cell Cell-b may be freely set, a limit to the size of the solar cell module according to the embodiment of the invention may be free.

Further, the solar cell module according to the embodiment of the invention may reflect light incident between the semiconductor substrate 110 of the first solar cell Cell-a and the semiconductor substrate 110 of the second solar cell Cell-b and may allow the reflected light to be again incident on the semiconductor substrate 110 of the first solar cell Cell-a and the semiconductor substrate 110 of the second solar cell Cell-b through the front glass substrate FG, thereby further increasing the optical gain. Hence, the efficiency of the solar cell may further increase.

The first distance GSI1 between the interconnector IC and the semiconductor substrate 110 of the first solar cell Cell-a may be equal to or different from the second distance GSI2 between the interconnector IC and the semiconductor substrate 110 of the second solar cell Cell-b. The first and second distances GSI1 and GSI2 may be freely set depending on a width of the second area PP141-S2 of the first auxiliary electrode pad PP141 exposed to the outside of the semiconductor substrate 110 or a width of the second area PP142-S2 of the second auxiliary electrode pad PP142 exposed to the outside of the semiconductor substrate 110.

FIG. 23A to 24 show that the interconnector IC is connected to the front surface of the first auxiliary electrode pad PP141 and the front surface of the second auxiliary electrode pad PP142, as an example. However, the interconnector IC may be connected to the back surface of the first auxiliary electrode pad PP141 and the back surface of the second auxiliary electrode pad PP142.

Figure 25:
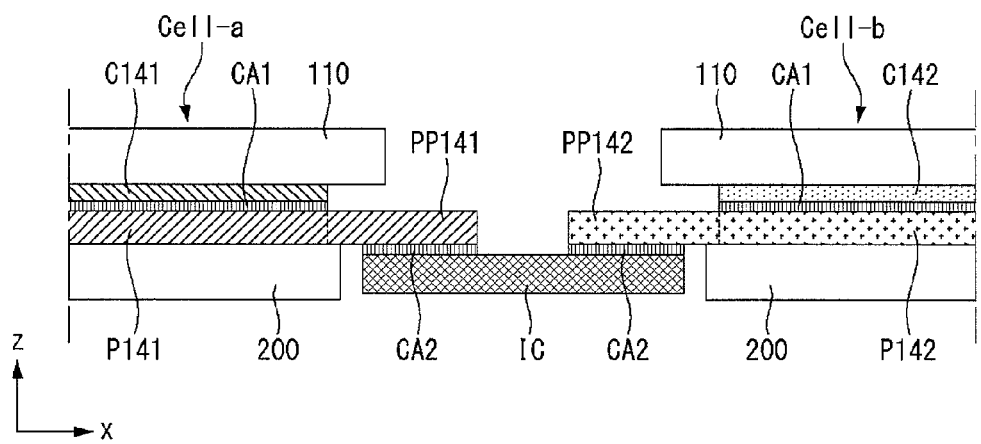
FIG. 25 shows another example of a connection structure of solar cells, each of which is formed as an individual integrated type element, through an interconnector in the solar cell module shown in FIG. 1.

FIG. 25 shows another example of a connection structure of solar cells, each of which is formed as an individual integrated type element, through an interconnector in the solar cell module shown in FIG. 1;

As shown in FIG. 25, the interconnector IC may be connected to the back surface of the first auxiliary electrode pad PP141 and the back surface of the second auxiliary electrode pad PP142.

Further, the solar cell applied to the solar cell module shown in FIG. 1 may use the solar cell, in which an end of each of the first auxiliary electrode pad PP141 and the second auxiliary electrode pad PP142 in the first direction x protrudes further than an end of the insulating member 200.

As described above, when the end of each of the first auxiliary electrode pad PP141 and the second auxiliary electrode pad PP142 protrudes further than the end of the insulating member 200, the back surface of the first auxiliary electrode pad PP141 and the back surface of the second auxiliary electrode pad PP142 may be exposed to the outside. Hence, the interconnector IC may be connected to the back surface of the first auxiliary electrode pad PP141 and the back surface of the second auxiliary electrode pad PP142.

In this instance, when the interconnector IC is connected to the back surface of the first auxiliary electrode pad PP141 and the back surface of the second auxiliary electrode pad PP142, the short circuit between the first auxiliary electrode pad PP141 and the second auxiliary electrode P142 and the short circuit between the second auxiliary electrode pad PP142 and the first auxiliary electrode P141 are not generated due to the second conductive adhesive CA2 even if the second conductive adhesive CA2 is excessively widely spread. Hence, the manufacturing process of the solar cell module may be more easily performed, and the process yield may be further improved. As described above, the structure, in which the end of each of the first auxiliary electrode pad PP141 and the second auxiliary electrode pad PP142 protrudes further than the end of the insulating member 200, may be formed by attaching the insulating member 200 to the semiconductor substrate 110 and then removing the end of the insulating member 200.

The structure, in which the front surface of the interconnector IC has a flat surface, was described in FIGS. 23A to 25 as an example. However, the front surface of the interconnector IC may have an uneven surface having a plurality of uneven portions or having uneven characteristics.

Figure 26:
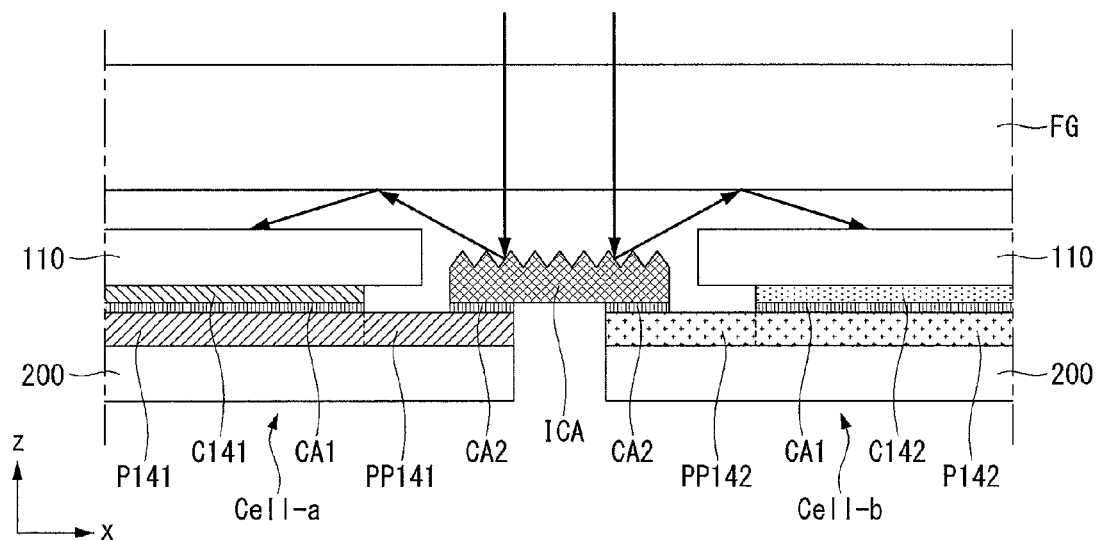
FIG. 26 illustrates a first embodiment of an interconnector for increasing an optical gain in the solar cell module shown in FIG. 1.

FIG. 26 illustrates a first embodiment of the interconnector IC for increasing an optical gain in the solar cell module shown in FIG. 1.

As shown in FIG. 26, a front surface of an interconnector ICA according to the first embodiment of the invention may have uneven portions, and a thickness of the interconnector ICA may be non-uniform. Hence, light incident on a space between the first solar cell Cell-a and the second solar cell Cell-b through the front glass substrate FG of the solar cell module may be reflected by the uneven portions included in the front surface of the interconnector ICA and the front glass substrate FG and may be again incident on the semiconductor substrate 110 of the first solar cell Cell-a and the semiconductor substrate 110 of the second solar cell Cell-b.

As a result, the light incident on the space between the first solar cell Cell-a and the second solar cell Cell-b may be used to produce electric power, and photoelectric conversion efficiency of the solar cell module may be further improved.

Figure 27:
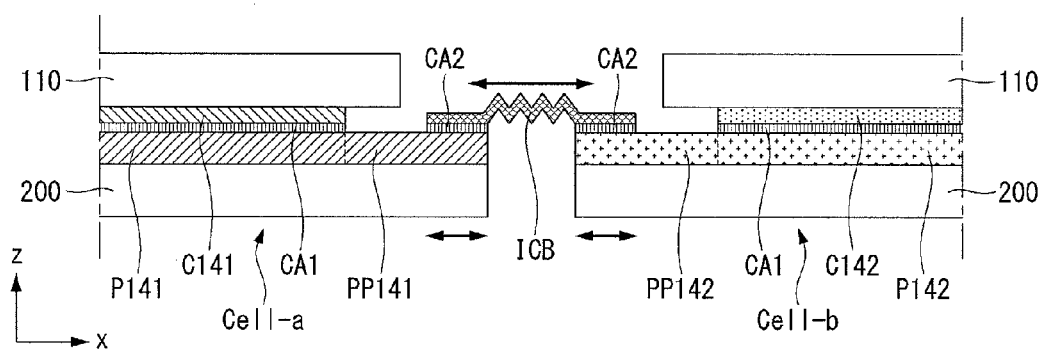
FIG. 27 illustrates a second embodiment of an interconnector corresponding to thermal expansion and thermal contraction of an insulating member along with an increase in an optical gain in the solar cell module shown in FIG. 1.

FIG. 27 illustrates a second embodiment of an interconnector IC corresponding to thermal expansion and thermal contraction of the insulating member along with an increase in the optical gain in the solar cell module shown in FIG. 1.

As shown in FIG. 27, a cross section of an interconnector ICB according to the second embodiment of the invention may have a zigzag shape. In this instance, a cross-sectional thickness of the interconnector ICB may be uniform.

The interconnector ICB according to the second embodiment of the invention may correspond to thermal expansion and thermal contraction of the insulating member 200 of the first solar cell Cell-a and the insulating member 200 of the second solar cell Cell-b as well as a reflection function described in FIG. 26.

More specifically, an internal temperature of the solar cell module may increase during an operation of the solar cell module, and the insulating member 200 of the first solar cell Cell-a and the insulating member 200 of the second solar cell Cell-b may thermally expand or contract in the first direction x.

Accordingly, a distance between the insulating member 200 of the first solar cell Cell-a and the insulating member 200 of the second solar cell Cell-b may decrease or increase. In this instance, as shown in FIG. 27, a length of the interconnector ICB may decrease or increase in the first direction x depending on the thermal expansion and the thermal contraction of the insulating member 200 of the first solar cell Cell-a and the insulating member 200 of the second solar cell Cell-b. Hence, durability of the solar cell module may be further improved.

Figure 28:
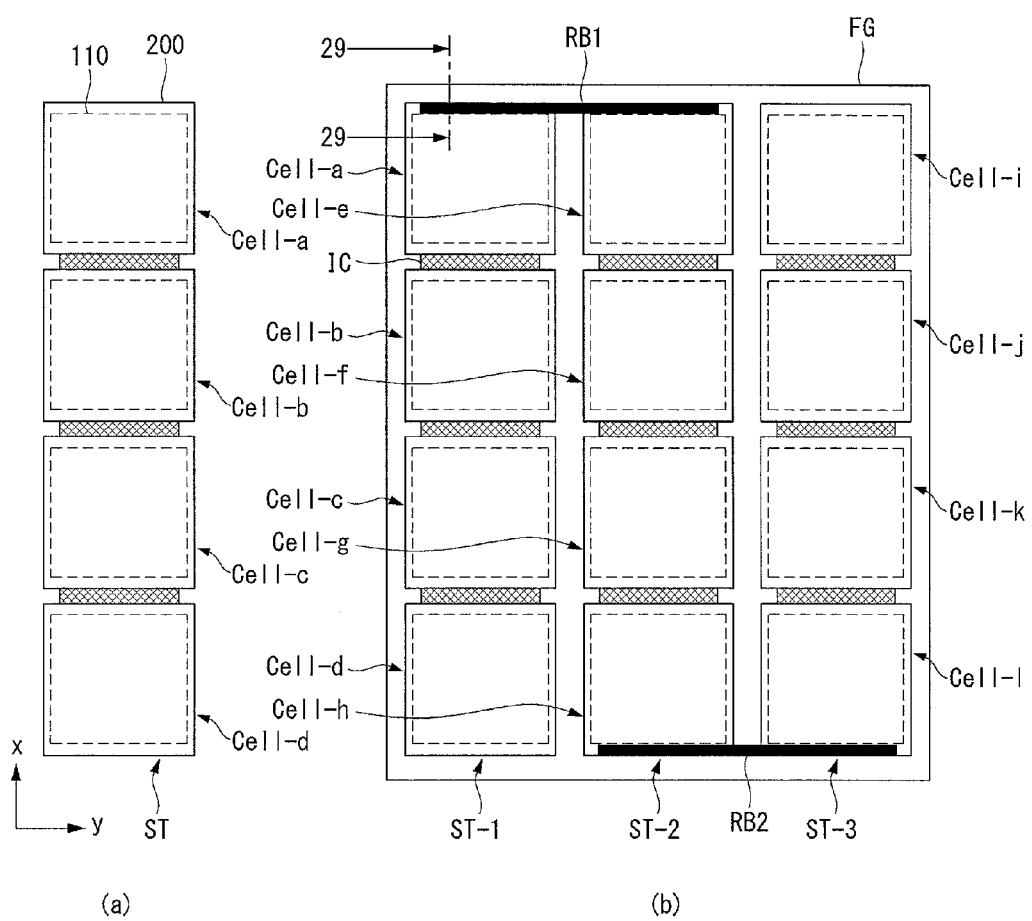
FIG. 28 illustrates an example of an entire plane structure of the solar cell module shown in FIG. 1.

FIG. 28 illustrates an example of an entire plane structure of the solar cell module shown in FIG. 1.

As shown in (a) of FIG. 28, in the solar cell module according to the embodiment of the invention, the plurality of solar cells, each of which is formed as an individual integrated type element formed by connecting each semiconductor substrate 110 and each insulating member 200, may be connected in series in the first direction x to form a cell string, and the cell string may be disposed on a back surface of the front glass substrate FG.

More specifically, the front surface of each semiconductor substrate 110 included in a plurality of cell strings ST-1, ST-2, and ST-3 may be disposed toward the back surface of the front glass substrate FG, and each insulating member 200 included in the plurality of cell strings ST-1, ST-2, and ST-3 may be disposed toward the opposite direction of the front glass substrate FG.

Further, as shown in (b) of FIG. 28, the above-described cell strings may include a first cell string ST-1, a second cell string ST-2, and a third cell string ST-3 and may be disposed on a front surface of the front glass substrate FG.

The solar cell module according to the embodiment of the invention may further include a first conductive ribbon RB1 connecting the first and second cell strings ST-1 and ST-2 extending in the first direction x in series to each other in the second direction y and a second conductive ribbon RB2 connecting the second and third cell strings ST-2 and ST-3 extending in the first direction x in series to each other in the second direction y.

For example, as shown in (b) of FIG. 28, the first conductive ribbon RB1 formed in the second direction y may connect a first auxiliary electrode pad PP141 included in a last solar cell Cell-a of the first cell string ST-1 to a second auxiliary electrode pad PP142 included in a last solar cell Cell-e at one end of the second cell string ST-2.

The second conductive ribbon RB2 may connect a first auxiliary electrode pad PP141 included in a last solar cell Cell-h at other end of the second cell string ST-2 to a second auxiliary electrode pad PP142 included in a last solar cell Cell-1 of the third cell string ST-3.

In this instance, as shown in (a) of FIG. 28, because each cell string is disposed so that the semiconductor substrates 110 of the cell string are disposed toward the front glass substrate FG, the first auxiliary electrode pad PP141 or the second auxiliary electrode pad PP142 formed on the front surface of the insulating member 200 may not be seen. Hence, the manufacturing process of the solar cell module may be relatively difficult.

However, the embodiment of the invention may change the partial structure of the first auxiliary electrode pad PP141 or the second auxiliary electrode pad PP142 or the insulating member 200 included in the last solar cell of the cell string, thereby more easily connecting the conductive ribbons RB1 and RB2 to the cell strings in the manufacturing process of the solar cell module.

The structure of the last solar cell, which can make the connection of the plurality of cell strings ST-1, ST-2, and ST-3 using the conductive ribbons easier, is described below.

Figure 29:
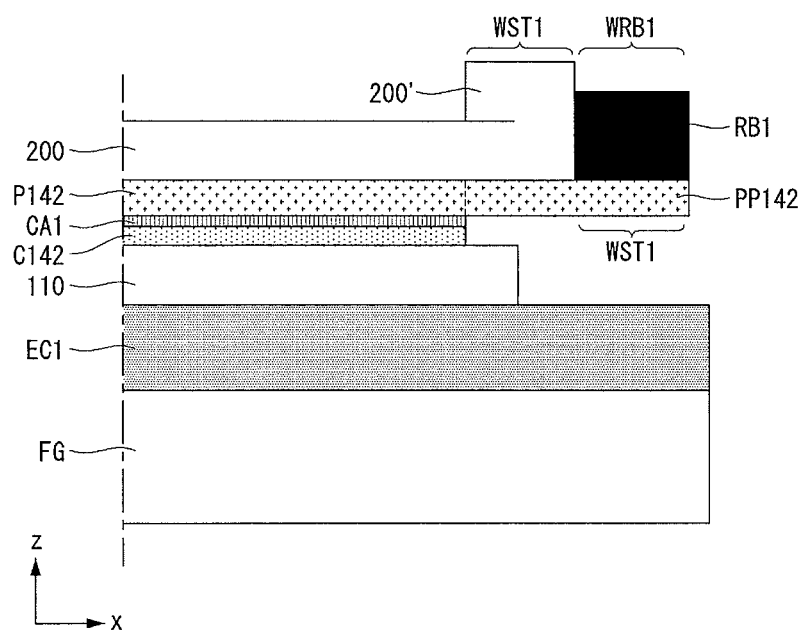
FIGS. 29 to 31 are cross-sectional views taken along line 29-29 of FIG. 28 and illustrate first to third embodiments of changes in a structure of a last solar cell of a cell string for connection of a conductive ribbon.
Figure 30:
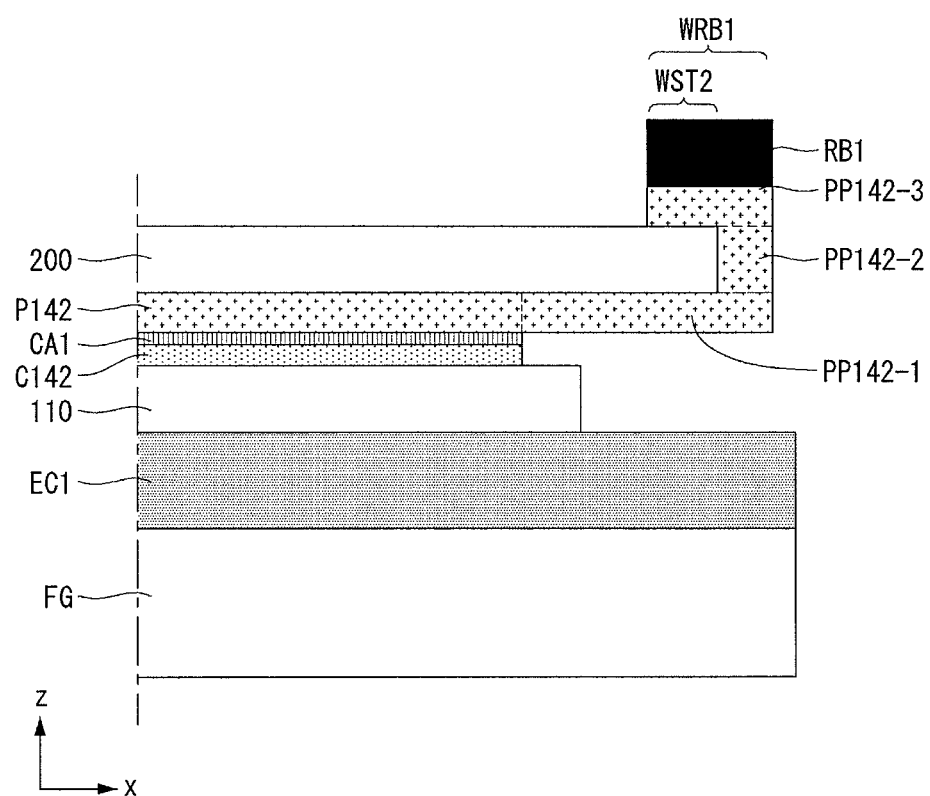
Figure 31:
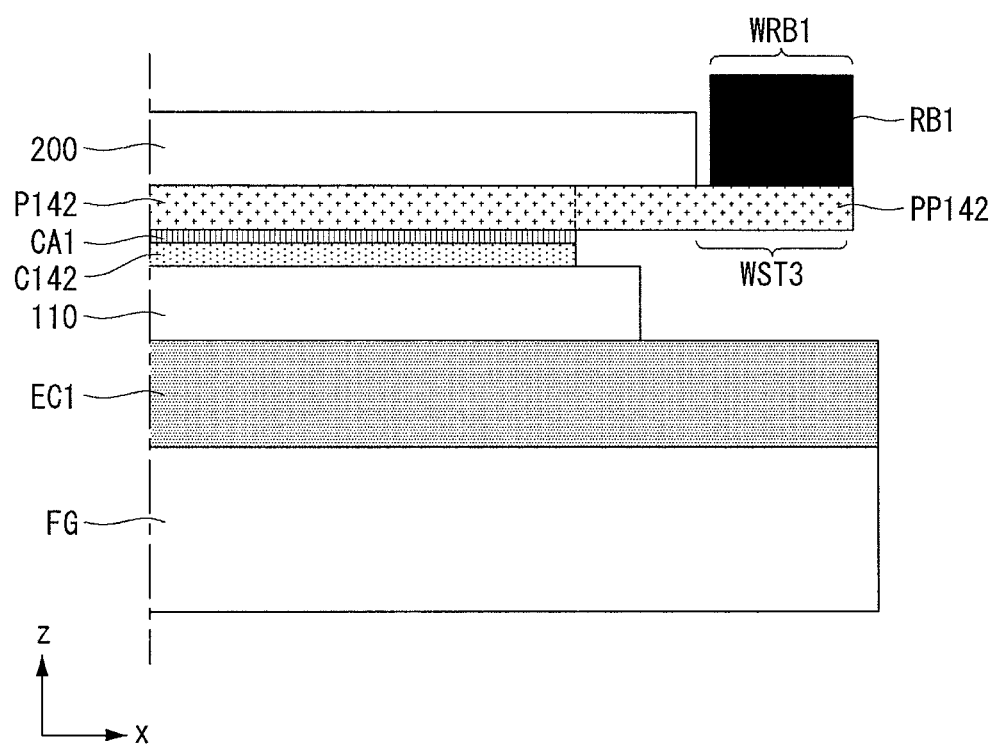

FIGS. 29 to 31 are cross-sectional views taken along line 29-29 of FIG. 28 and illustrate first to third embodiments of changes in a structure of a last solar cell of a cell string for the connection of a conductive ribbon.

FIG. 29 illustrates the first embodiment of the invention connecting the plurality of cell strings ST-1, ST-2, and ST-3 to one another using the conductive ribbons RB1 and RB2.

In the last solar cell of each of the cell strings ST-1, ST-2, and ST-3, a partial area of the insulating member 200 overlapping the first auxiliary electrode pad PP141 or the second auxiliary electrode pad PP142 may include a folded portion 200' for exposing the first auxiliary electrode pad PP141 or the second auxiliary electrode pad PP142. The conductive ribbon may be attached to a portion of the first auxiliary electrode pad PP141 or a portion of the second auxiliary electrode pad PP142 exposed by folding the insulating member 200.

For example, as shown in FIG. 29, in the last solar cell Cell-a of the first cell string ST-1, a portion WST1 of the back surface of the second auxiliary electrode pad PP142 may be exposed to the outside by folding a portion WST1 of the insulating member 200 overlapping the second auxiliary electrode pad PP142.

The first conductive ribbon RB1 may be easily connected to the portion WST1 of the back surface of the second auxiliary electrode pad PP142 exposed to the outside. Further, the last solar cell Cell-e of the second cell string ST-2 shown in FIG. 28 may have the structure, in which a portion of the back surface of the first auxiliary electrode pad PP141 is exposed to the outside.

In the embodiment of the invention, a width of the exposed portion WST1 of the back surface of the second auxiliary electrode pad PP142 may be substantially the same as a width of the folded portion WST1 of the insulating member 200. Further, as shown in FIG. 29, the width of the exposed portion WST1 of the back surface of the second auxiliary electrode pad PP142 may be substantially the same as a width WRB1 of the first conductive ribbon RB1. However, the embodiment of the invention is not limited thereto. For example, the width WRB1 of the first conductive ribbon RB1 may be greater or less than the width of the exposed portion WST1 of the back surface of the second auxiliary electrode pad PP142.

The second embodiment of changes in the structure of the last solar cell of each cell string for the easy connection of the conductive ribbon is described below.

In FIG. 28, the first auxiliary electrode pad PP141 or the second auxiliary electrode pad PP142 included in the last solar cell of each of the cell strings ST-1, ST-2, and ST-3 may include a portion which is extended to cover a portion of the back surface of the insulating member 200. Further, the conductive ribbons RB1 and RB2 may be connected to the first auxiliary electrode pad PP141 or the second auxiliary electrode pad PP142 formed on the portion of the back surface of the insulating member 200.

For example, as shown in FIG. 30, the second auxiliary electrode pad PP142 included in the last solar cell Cell-a of the first cell string ST-1 may further include a first portion PP142-1 formed on the front surface of the insulating member 200 disposed toward the front glass substrate FG, a second portion PP142-2 formed on the side of the insulating member 200, and a third portion PP142-3 formed on a partial area WST2 of the back surface of the insulating member 200.

Hence, even if the front surface of the insulating member 200 is disposed toward the front glass substrate FG in the last solar cell Cell-a of the first cell string ST-1, the third portion PP142-3 of the second auxiliary electrode pad PP142 may be exposed in the partial area WST2 of the back surface of the insulating member 200. As a result, the conductive ribbon RB1 may be easily connected to the exposed third portion PP142-3.

The third embodiment of changes in the structure of the last solar cell of each cell string for the easy connection of the conductive ribbon is described below.

In FIG. 28, the first auxiliary electrode pad PP141 or the second auxiliary electrode pad PP142 included in the last solar cell of each of the cell strings ST-1, ST-2, and ST-3 may include a portion more projecting than an end of the insulating member 200. Further, the conductive ribbons RB1 and RB2 may be connected to the portion of the first auxiliary electrode pad PP141 or the second auxiliary electrode pad PP142 more projecting than the end of the insulating member 200.

For example, as shown in FIG. 31, the first auxiliary electrode pad PP141 or the second auxiliary electrode pad PP142 may be longer than the length of the insulating member 200 by removing a partial area WST3 of the insulating member 200 overlapping the second auxiliary electrode P142 in the last solar cell Cell-a of the first cell string ST-1.

A method for removing the partial area WST3 of the insulating member 200 is described below.

In the process for manufacturing the solar cell, the last solar cell of the cell string may be arbitrarily selected, and high-temperature thermal processing (for example, a laser is usable) may be locally performed on an end WST3 of the insulating member 200 overlapping the first auxiliary electrode pad PP141 or the second auxiliary electrode pad PP142 of the selected solar cell. Hence, the portion WST3 of the back surface of the first auxiliary electrode pad PP141 or the second auxiliary electrode pad PP142 may be exposed.

As described above, the conductive ribbons RB1 and RB2 may be easily connected to the exposed portion WST3 of the back surface of the first auxiliary electrode pad PP141 or the second auxiliary electrode pad PP142 by configuring the solar cell, in which the portion WST3 of the back surface of the first auxiliary electrode pad PP141 or the second auxiliary electrode pad PP142 is exposed, as the last solar cell of each cell string, thereby connecting the cells strings in series.

Figure 32A:
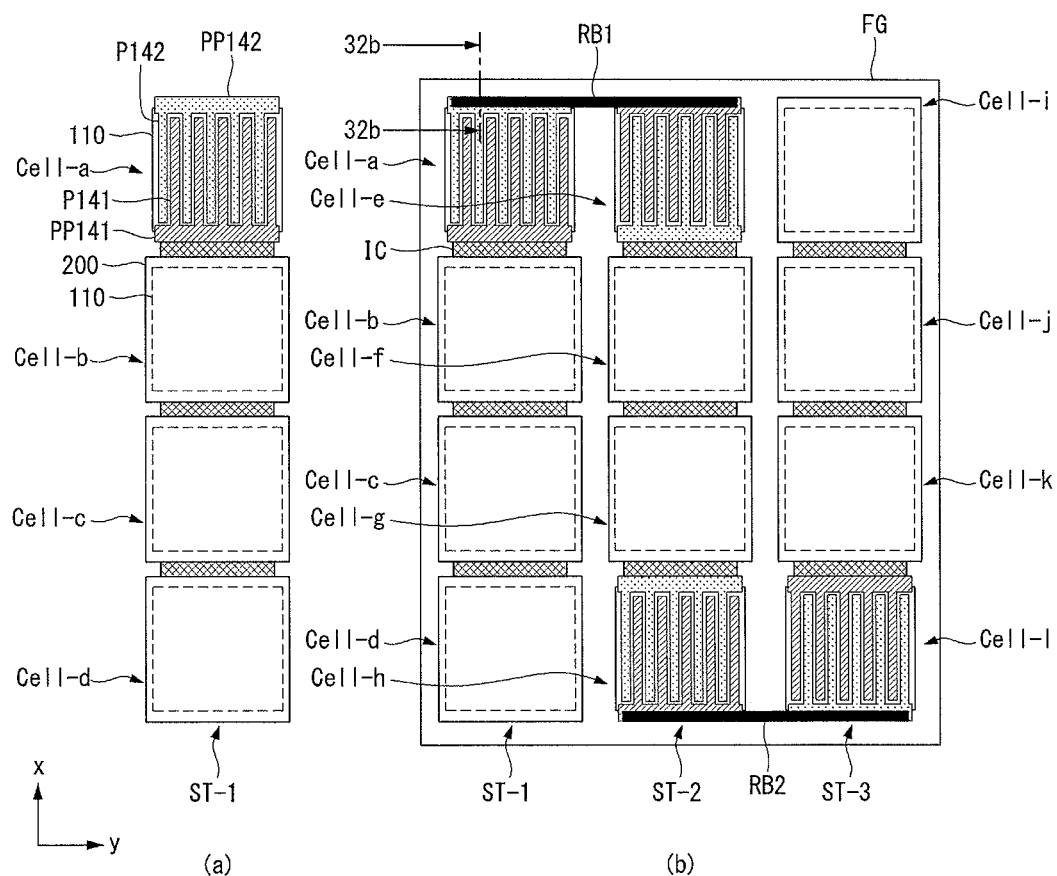
FIGS. 32A and 32B illustrate a fourth embodiment, in which an insulating member included in a last solar cell of a cell string is removed for the connection of a conductive ribbon, in the solar cell module shown in FIG. 28.
Figure 32B:
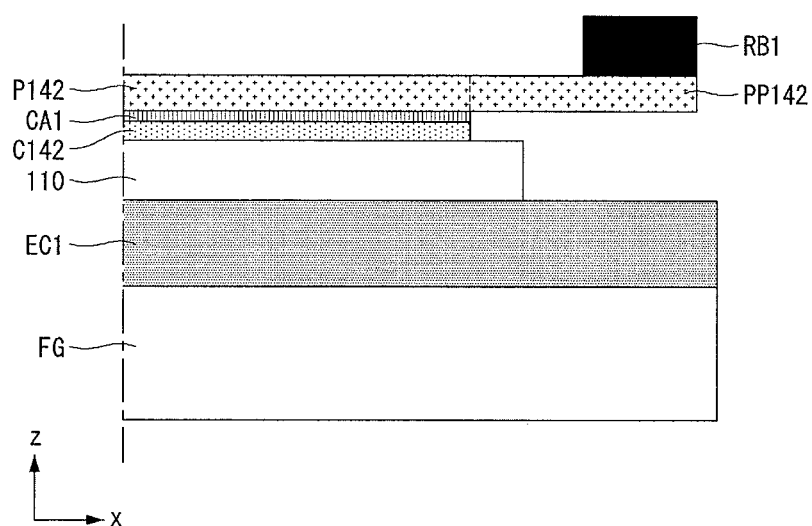

FIGS. 32A and 32B illustrate a fourth embodiment, in which an insulating member included in a last solar cell of a cell string is removed for the connection of the conductive ribbon, in the solar cell module shown in FIG. 28.

As shown in FIG. 32A, in the fourth embodiment of the changes in the structure of the last solar cell, an insulating member of a last solar cell of each cell string may be removed unlike the above-described solar cells.

Accordingly, because the last solar cell of each cell string has no insulating member 200, the back surface of the first auxiliary electrode pad PP141 or the back surface of the second auxiliary electrode pad PP142 may be exposed to the outside. Further, the conductive ribbons RB1 and RB2 may be attached to the exposed back surface of the first auxiliary electrode pad PP141 or the exposed back surface of the second auxiliary electrode pad PP142 and may connect the cell strings in series.

More specifically, as shown in (a) of FIG. 32A, the insulating member 200 of the last solar cell of each cell string according to the embodiment of the invention may be removed. In this instance, when the last solar cell of the cell string is disposed on the front glass substrate FG as shown in (b) of FIG. 32A, the back surface of the first auxiliary electrode pad PP141 or the back surface of the second auxiliary electrode pad PP142 disposed toward the opposite direction of the front glass substrate FG may be exposed as shown in FIG. 32B, which is a cross-sectional view taken along line 32b-32b of FIG. 32A.

In this instance, the exposed back surface of the first auxiliary electrode pad PP141 or the exposed back surface of the second auxiliary electrode pad PP142 in the last solar cell of each cell string may be easily connected to each other using the conductive ribbons RB1 and RB2.

So far, the embodiment of the invention described the examples of changes in the structure of the last solar cell of each cell string, so that at least a portion of the back surface of the first auxiliary electrode pad PP141 or at least a portion of the back surface of the second auxiliary electrode pad PP142 included in the last solar cell of each cell string is exposed, for the easy connection of the conductive ribbons. However, on the contrary, even if the structure of the last solar cell is not changed, the conductive ribbons may be more easily connected through changes in a method for manufacturing the solar cell module.

An example where the structure of the last solar cell is not changed is described below.

Figure 33A:
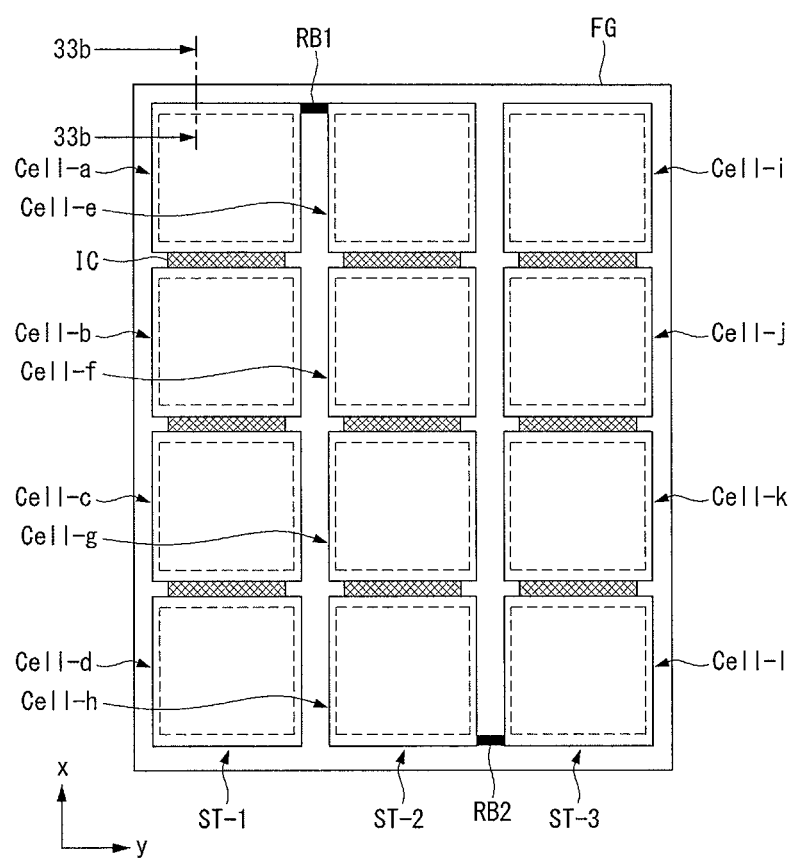
FIGS. 33A and 33B illustrate a fifth embodiment, in which a structure of a last solar cell is not changed, in the solar cell module shown in FIG. 28.
Figure 33B:
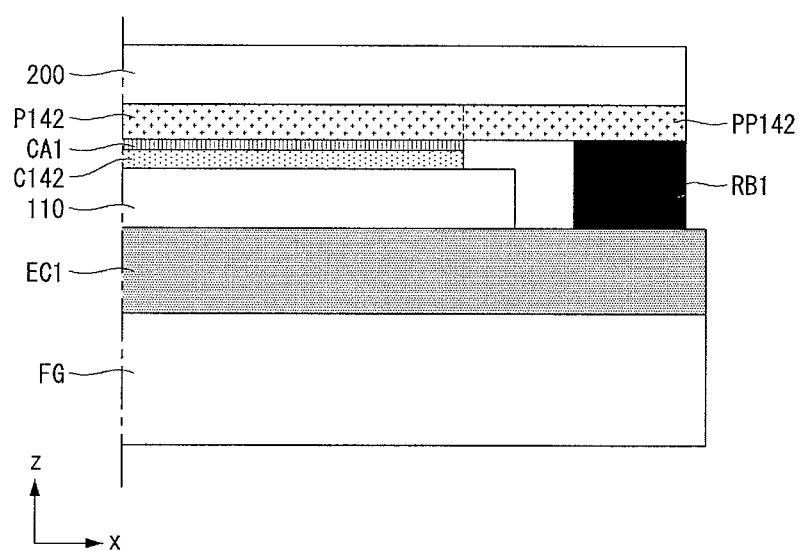

FIGS. 33A and 33B illustrate a fifth embodiment, in which a structure of a last solar cell is not changed, in the solar cell module shown in FIG. 28.

As shown in FIG. 33A, the back surface of the first auxiliary electrode pad PP141 or the second auxiliary electrode pad PP142 included in the last solar cell of each cell string is not exposed. When the conductive ribbons RB1 and RB2 are connected to the front surface of the first auxiliary electrode pad PP141 or the second auxiliary electrode pad PP142, the conductive ribbons RB1 and RB2 are covered with the insulating member 200 of the last solar cell of each cell string when viewing a state, where the plurality of cell strings ST-1, ST-2, and ST-3 are disposed on the front glass substrate FG, from the back surface.

Accordingly, as shown in FIG. 33B, which is a cross-sectional view taken along line 33b-33b of FIG. 33A, the conductive ribbons RB1 and RB2 may be positioned between the front surface of the second auxiliary electrode pad PP142 and the back surface of the front glass substrate FG. A method for forming such a structure of the solar cell will be described later through second and third embodiments of a method for manufacturing the solar cell module.

So far, the embodiment of the invention described the structures of the solar cell and the solar cell module. Hereinafter, methods for manufacturing the solar cell and the solar cell module according to the embodiment of the invention are described.

FIGS. 34A to 34G illustrate an example of a method for manufacturing a solar cell as an individual integrated type element and an example of a method for manufacturing a cell string.

Figure 34A:
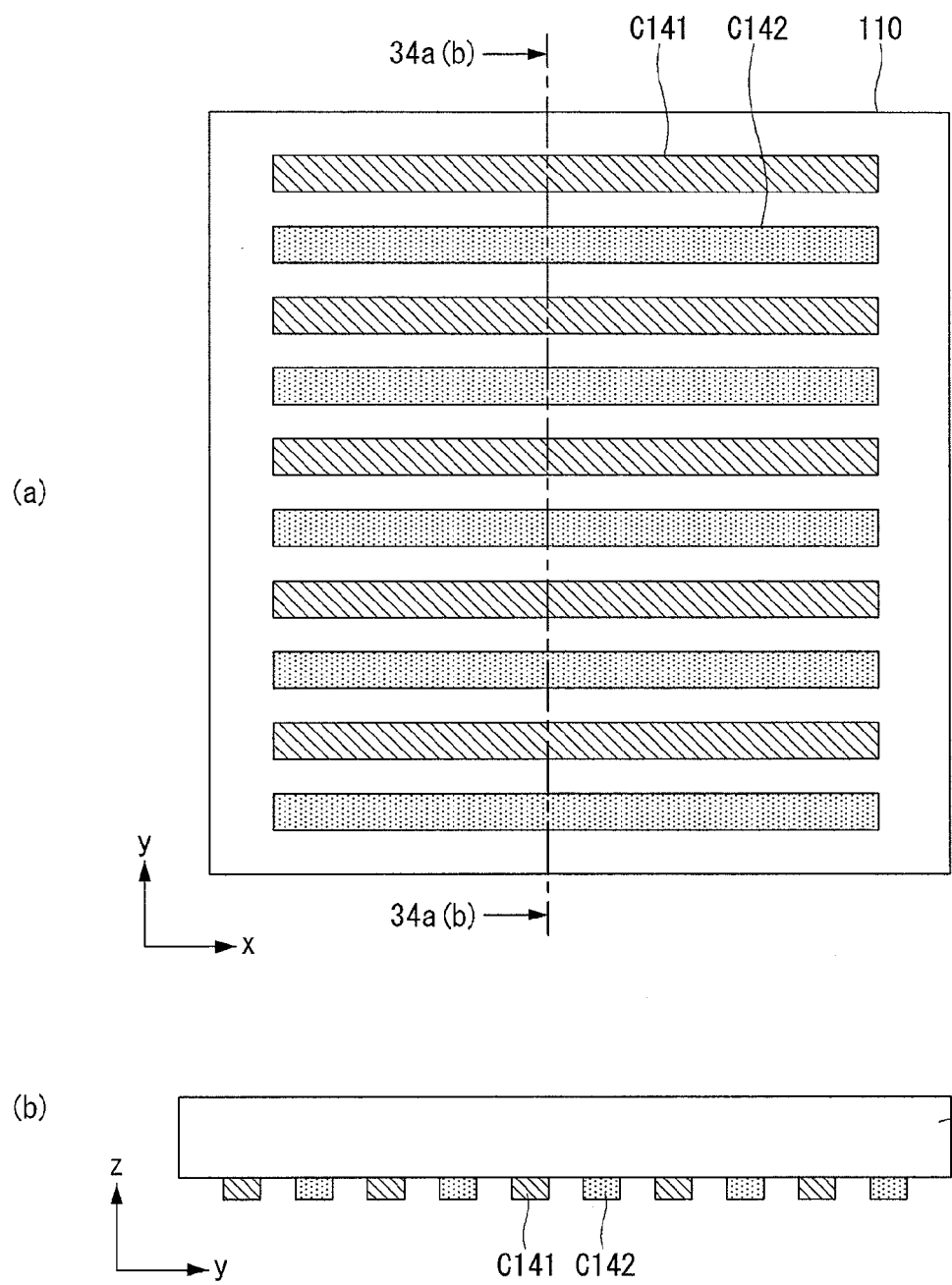

First, as shown in (a) and (b) of FIG. 34A, first electrodes C141 and second electrodes C142 may be formed on a back surface of a semiconductor substrate 110 through a semiconductor manufacturing process.

A method for manufacturing an emitter region 121, a back surface field region 172, and an anti-reflection layer 130 formed on the semiconductor substrate 110 is not particularly limited. Since structures of the emitter region 121, the back surface field region 172, and the anti-reflection layer 130 were described above with reference to FIGS. 2 to 6, a further description may be briefly made or may be entirely omitted.

Figure 34B:
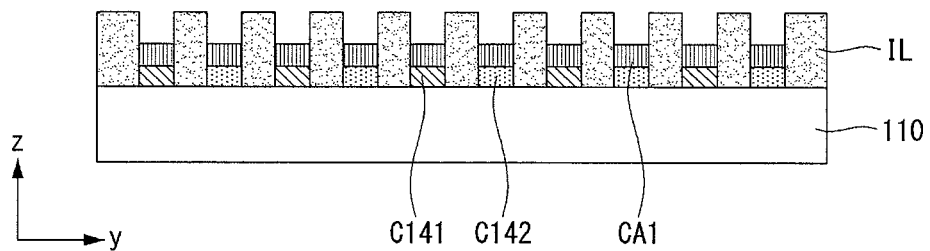

Next, as shown in FIG. 34B, a front surface of the semiconductor substrate 110 may be positioned downwardly, a first conductive adhesive CA1 may be applied to back surfaces of the first electrodes C141 and back surfaces of the second electrodes C142, and an insulating layer IL may be applied to the back surface of the semiconductor substrate 110, on which the first electrodes C141 and the second electrodes C142 are separated from each other and exposed, so as to attach the back surface of the semiconductor substrate 110, on which the first electrodes C141 and the second electrodes C142 are formed, to a front surface of an insulating member 200, on which first auxiliary electrodes P141 and second auxiliary electrodes P142 are formed. However, a process for forming the first conductive adhesive CA1 and the insulating layer IL is not limited thereto and may be changed.

In this instance, as shown in FIG. 34B, an application thickness of the insulating layer IL may be greater than an application thickness of the first conductive adhesive CA1.

Figure 34C:
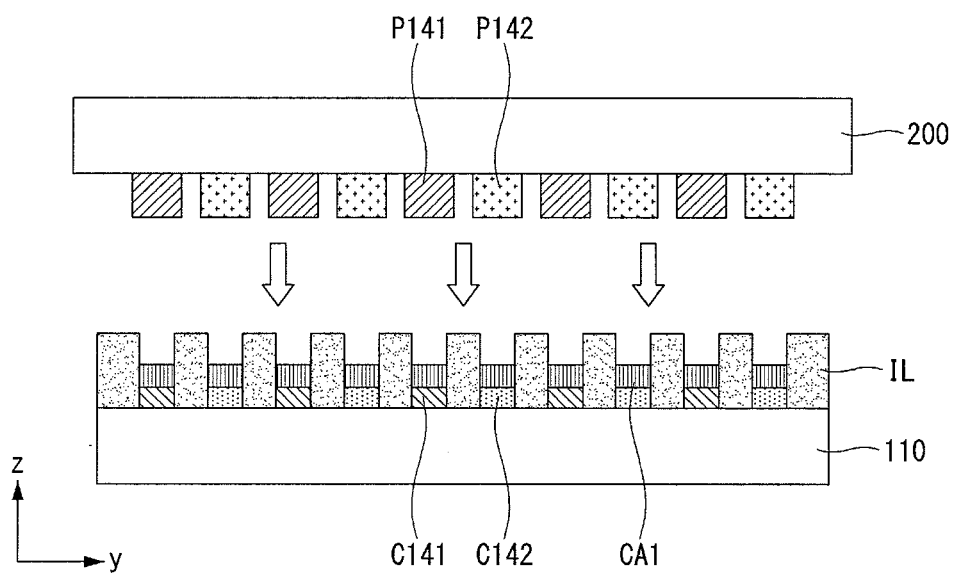

Next, as shown in FIG. 34C, a pressure and thermal process may be performed in a state where the first auxiliary electrode P141 and the second auxiliary electrode P142 are aligned to overlap each other on the insulating member 200, and thus the front surface of the insulating member 200 may be attached to the back surface of the semiconductor substrate 110 in an arrow direction.

Figure 34D:
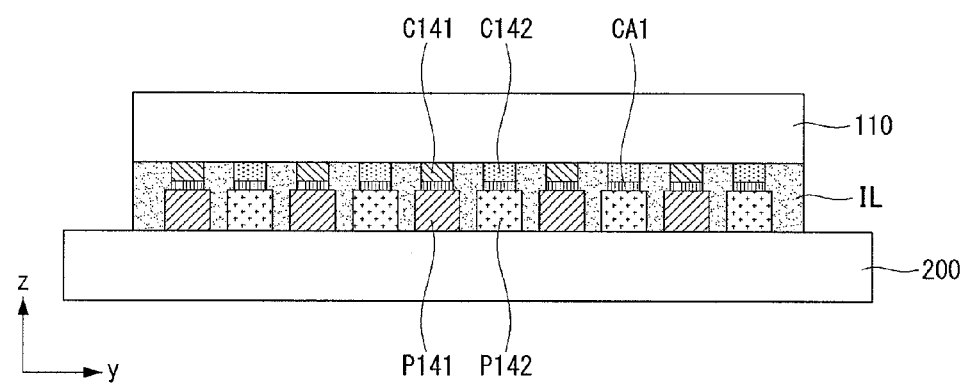

Hence, as shown in FIG. 34D, each semiconductor substrate 110 and each insulating member 200 may be connected to manufacture a solar cell formed as an individual integrated type element.

Afterwards, as shown in FIG. 34D, the front surface of the semiconductor substrate 110 and the front surface of the insulating member 200 may be disposed upwardly, so as to connect the plurality of solar cells, each of which is formed as the individual integrated type element, through interconnector IC.

Namely, the solar cell, which is formed to attach the semiconductor substrate 110 to the insulating member 200 through the processes up until FIG. 34C, may be reversed as shown in FIG. 34D.

Figure 34E:
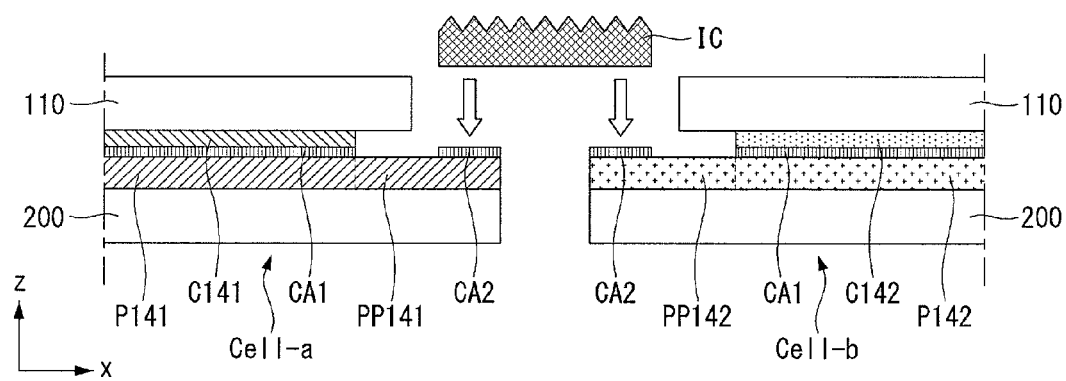

Next, as shown in FIG. 34E, in each solar cell formed as the individual integrated type element, a second conductive adhesive CA2 may be entirely applied to a second area of a first auxiliary electrode pad PP141 and a second area of a second auxiliary electrode pad PP142 exposed to the outside of the semiconductor substrate 110.

Figure 34F:
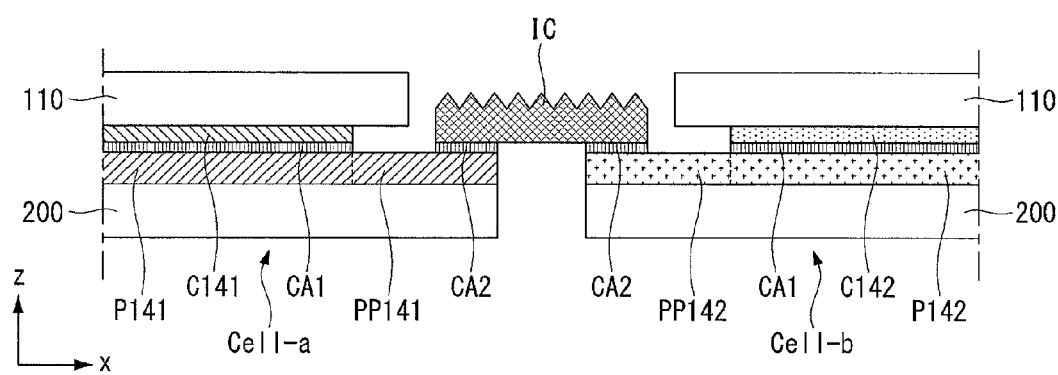

Next, as shown in FIG. 34F, a pressure and thermal process is properly performed in a state where the plurality of solar cells, each of which is formed as the individual integrated type element, are positioned adjacent to one another in series in the first direction x and the interconnector IC is attached to the plurality of solar cells in an arrow direction of FIG. 34E. Hence, the first auxiliary electrode pad PP141 and the second auxiliary electrode pad PP142 of each solar cell may be connected to each other.

Next, as shown in FIG. 34G, the above-described processes may be repeatedly performed to form a cell string ST by connecting in series the plurality of solar cells, each of which is formed as the individual integrated type element.

More specifically, as shown in (a) of FIG. 34G, the interconnector IC and first auxiliary electrode pads PP141 and second auxiliary electrode pads PP142 of solar cells Cell-a to Cell-d belonging to the cell string ST may be exposed when viewing the cell string ST from the front surface. Further, as shown in (b) of FIG. 34G, the first auxiliary electrode pads PP141 and the second auxiliary electrode pads PP142 of the solar cells Cell-a to Cell-d may be covered with the insulating members 200 when viewing the cell string ST from the back surface.

If the last solar cells Cell-a and Cell-d of the cell string ST are configured as shown in FIG. 30 considering that the two cell strings ST are connected in series to each other using conductive ribbons RB1 and RB2, a third portion PP142-3 of the second auxiliary electrode pad PP142 of one (for example, the solar cell Cell-a) of the last solar cells Cell-a and Cell-d positioned at both ends of the cell string ST may be formed on the back surface of the insulating members 200. A third portion PP141-3 of the first auxiliary electrode pads PP141 of the other last solar cell Cell-d may be formed on a portion of the back surface of the insulating members 200.

The method for manufacturing the cell string ST illustrated in FIGS. 34A to 34G was described using the second embodiment of the structure of the last solar cell of the cell string as an example, but may be equally applied to the first, third, fourth, and fifth embodiments of the structure of the last solar cell of the cell string. Only, the structure of the last solar cell of the cell string may be configured as the solar cell according to each embodiment.

Hereinafter, various embodiments of a method for manufacturing the solar cell module are described.

FIGS. 35A to 35G illustrate a first embodiment of a method for manufacturing the solar cell module shown in FIGS. 1 to 28.

Figure 35A:
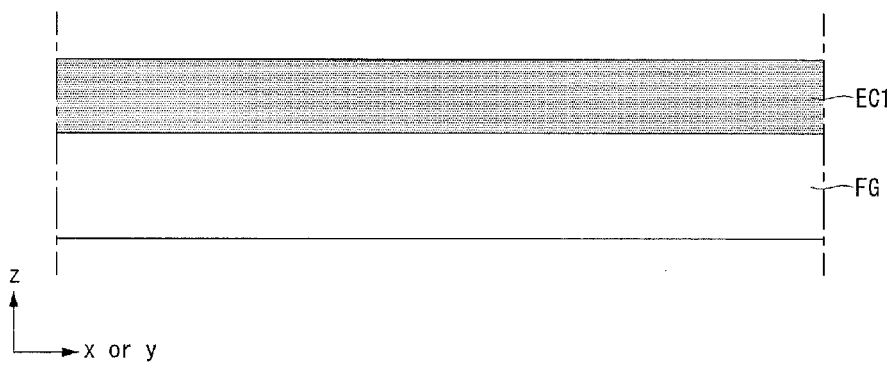
FIGS. 35A to 35G illustrate a first embodiment of a method for manufacturing the solar cell module shown in FIGS. 1 to 28.

First, as shown in FIG. 35A, in the first embodiment of the method for manufacturing the solar cell module, an upper encapsulant EC1 may be applied to the back surface of the front glass substrate FG in a state where the front glass substrate FG is disposed.

Figure 35B:
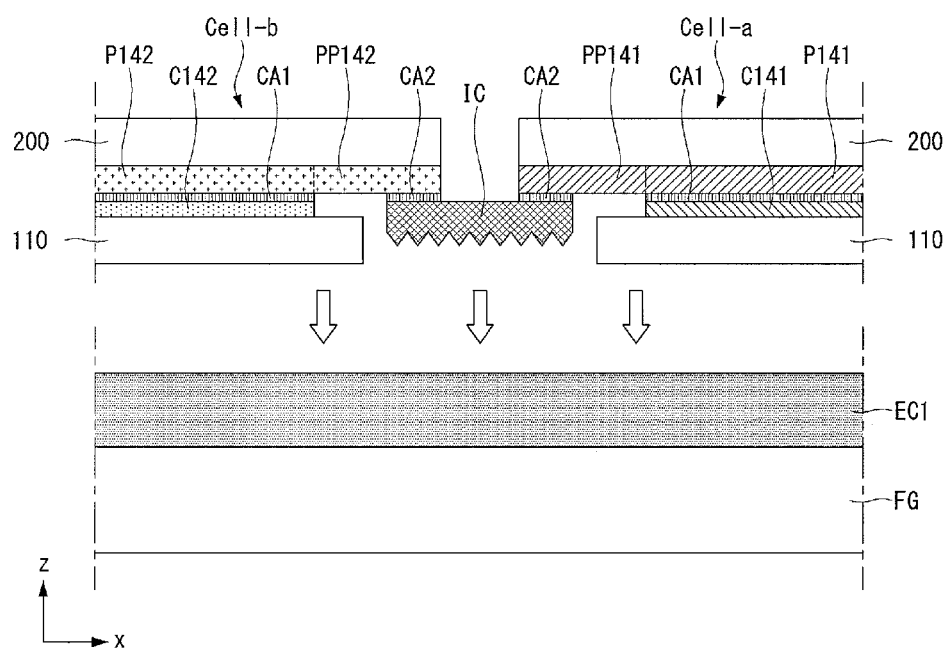

Next, as shown in FIG. 35B, the cell string ST illustrated in FIG. 34G may be disposed on the upper encapsulant EC1. In this instance, the front surfaces of the semiconductor substrates 110 of the first solar cell Cell-a and the second solar cell Cell-b included in the cell string ST may be positioned opposite the back surface of the front glass substrate FG.

Figure 35C:
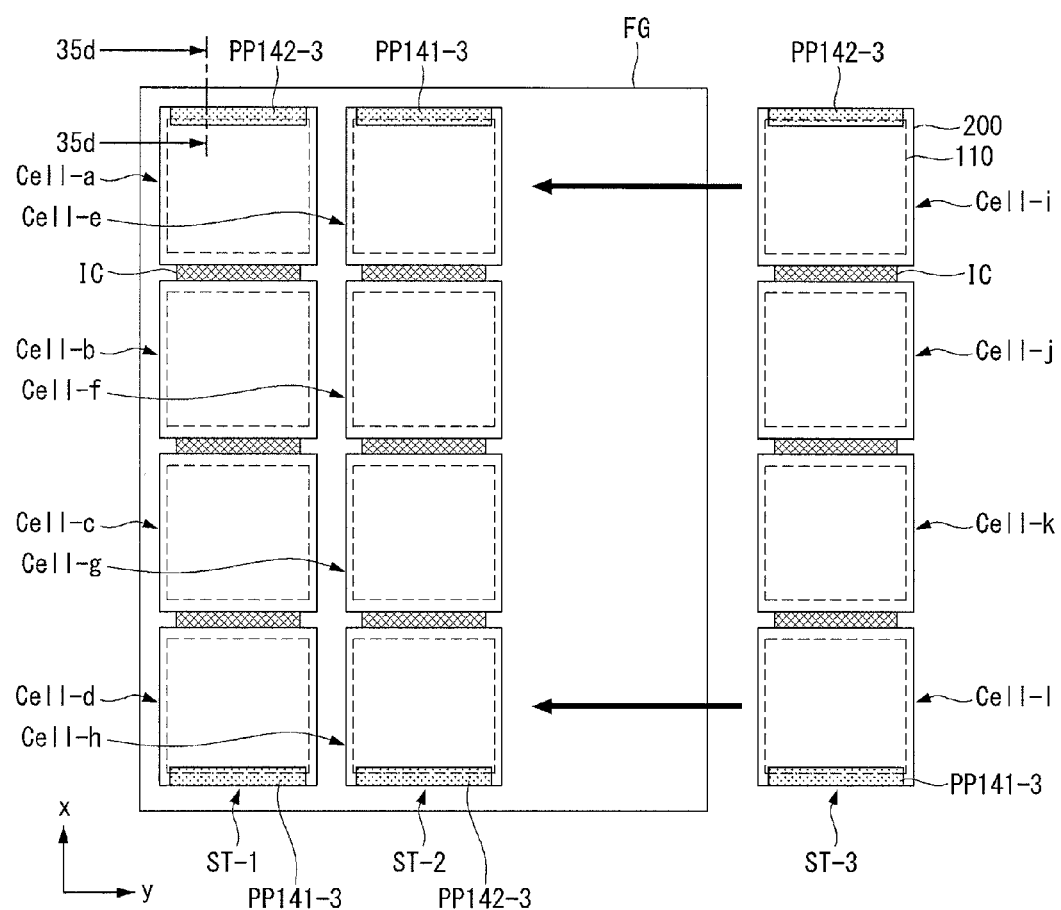

Hence, as shown in FIG. 35C, a plurality of cell strings ST-1, ST-2, and ST-3 are positioned to fall down on the back surface of the front glass substrate FG, and the back surfaces of the insulating members 200 may be disposed upwardly.

Figure 35D:
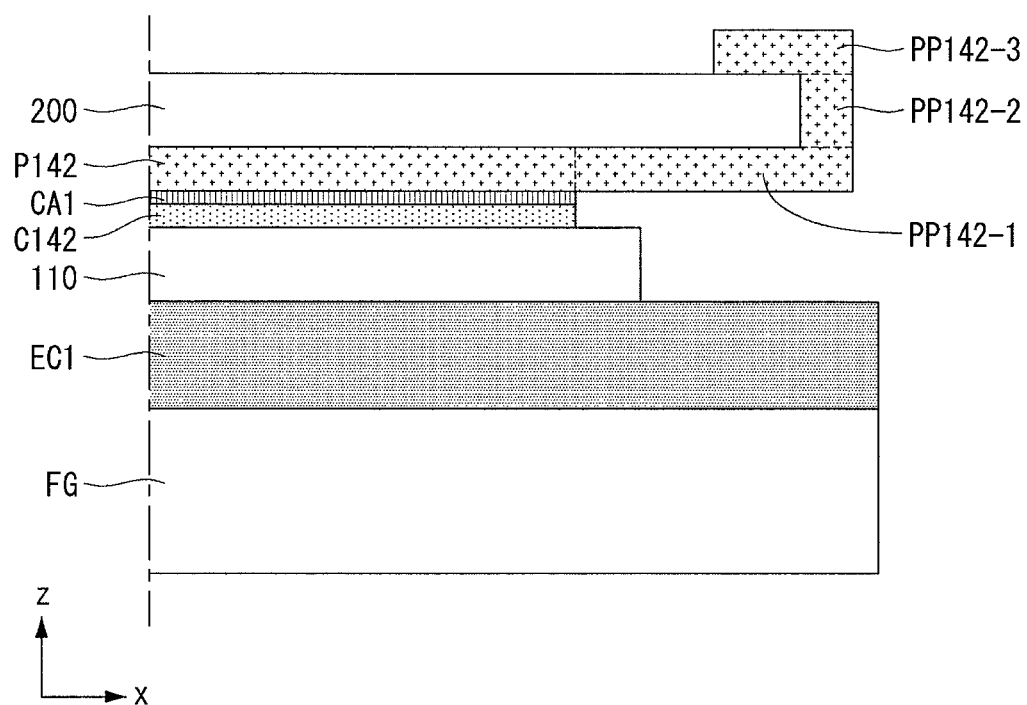

Hence, as shown in FIGS. 35C and 35D, in the last solar cell of each of the cell strings ST-1, ST-2, and ST-3, the third portions PP141-3 and PP142-3 of the first auxiliary electrode pad PP141 or the second auxiliary electrode pad PP142 formed on the back surface of the insulating member 200 may be exposed to the outside.

Figure 35E:
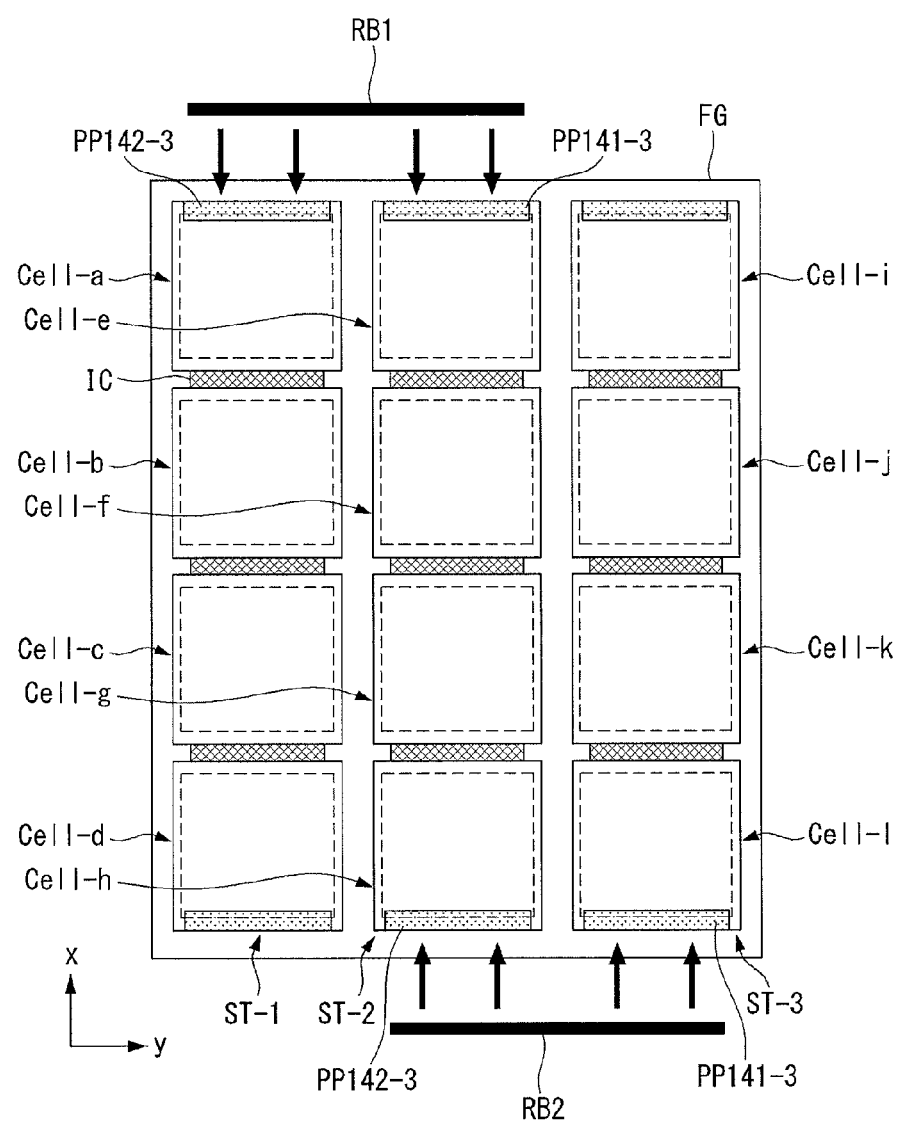

Next, as shown in FIG. 35E, in the last solar cells of the cell strings ST-1, ST-2, and ST-3, the third portion PP141-3 of the first auxiliary electrode pad PP141 and the third portion PP142-3 of the second auxiliary electrode pad PP142 may be connected using the conductive ribbons RB1 and RB2.

Figure 35F:
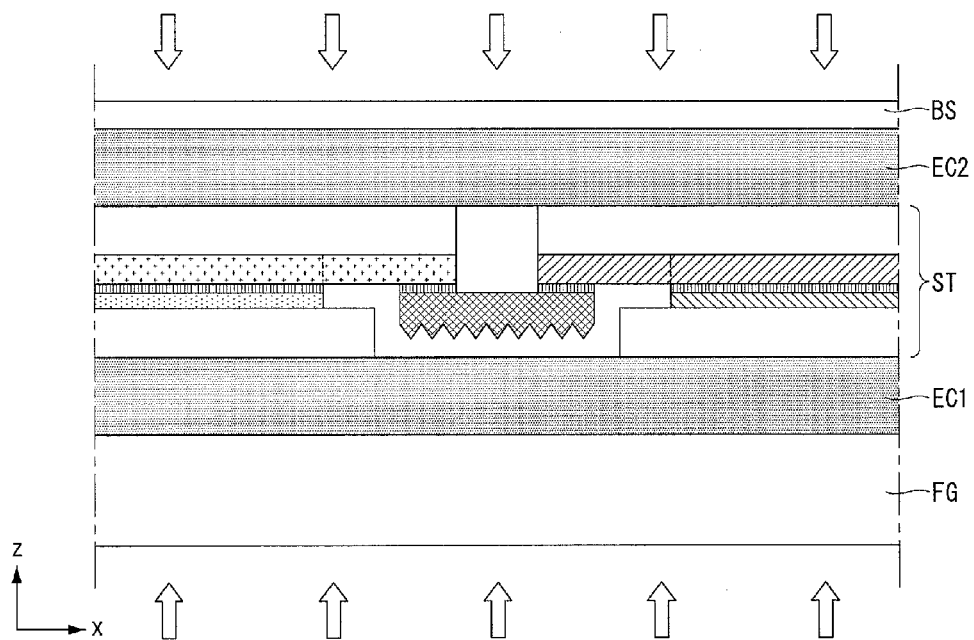

Next, as shown in FIG. 35F, a lower encapsulant EC2 and a back sheet BS may be disposed on a back surface of the cell string ST in a state where the cell strings ST are connected using the conductive ribbons RB1 and RB2, and then a lamination process may be performed to manufacture the solar cell module. In the lamination process, the upper encapsulant EC1 and the lower encapsulant EC2 may be filled in a space between the solar cells and a space between the cell strings.

So far, the embodiment of the invention described the method for manufacturing the solar cell module, in which the conductive ribbons RB1 and RB2 are used on the back surface of the insulating member 200 included in the last solar cell. However, the conductive ribbons RB1 and RB2 may be used on the front surface of the insulating member 200 included in the last solar cell.

Figure 36A:
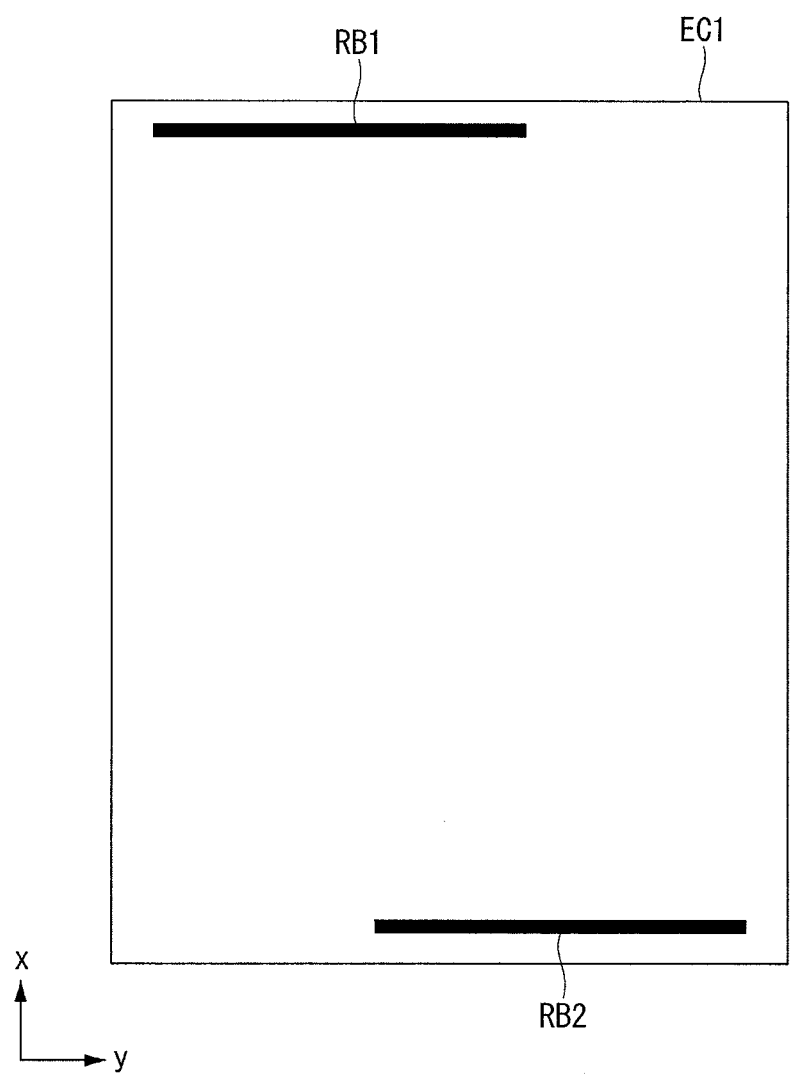
FIGS. 36A and 36B illustrate a second embodiment of a method for manufacturing the solar cell module shown in FIGS. 1 to 28.
Figure 36B:
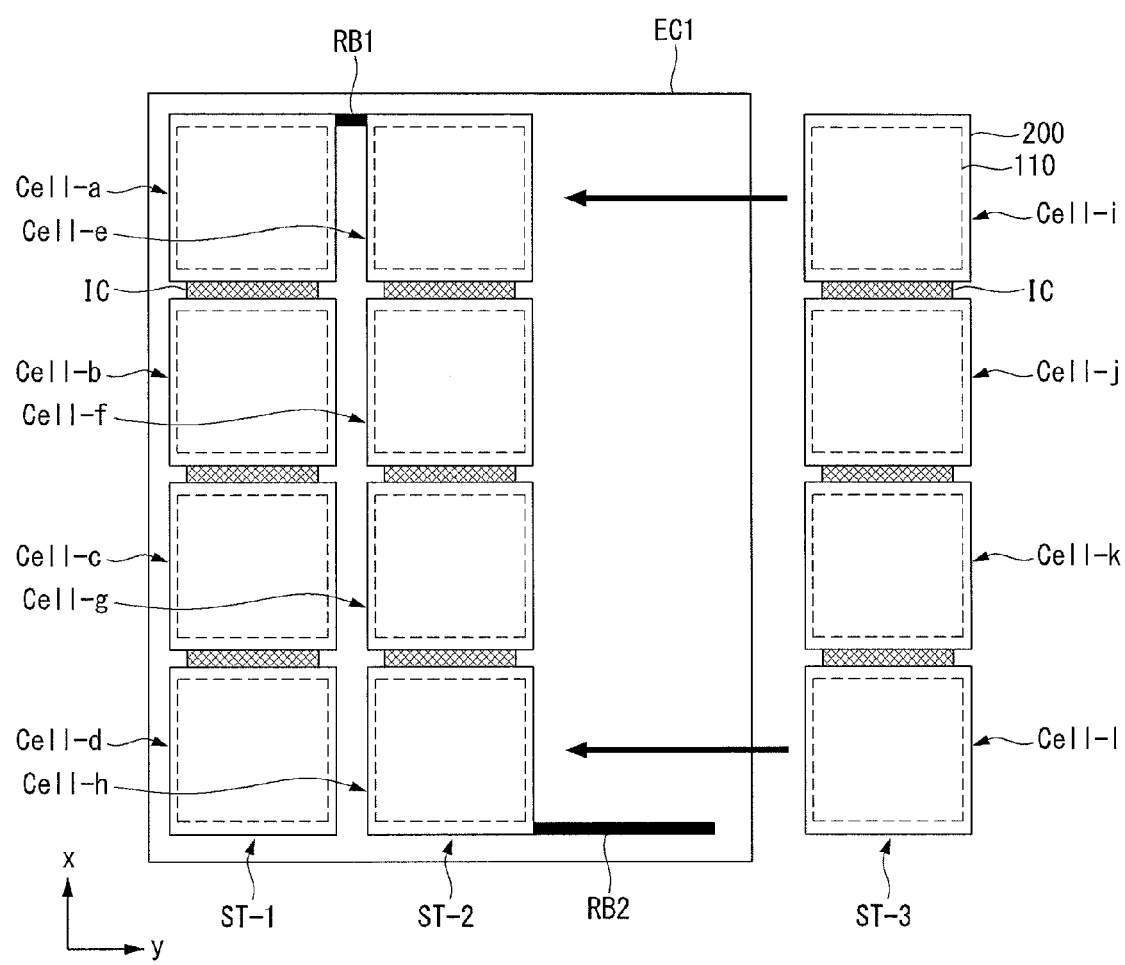

FIGS. 36A and 36B illustrate a second embodiment of a method for manufacturing the solar cell module shown in FIGS. 1 to 28.

First, as shown in FIG. 36A, in the second embodiment of the method for manufacturing the solar cell module, the conductive ribbons RB1 and RB2 connecting the plurality of cell strings ST-1, ST-2, and ST-3 may be disposed on the upper encapsulant EC1 in a state where the upper encapsulant EC1 is applied to the back surface of the front glass substrate FG as in the operation of FIG. 35A.

The conductive ribbons RB1 and RB2 may be disposed to overlap the first auxiliary electrode pad PP141 or the second auxiliary electrode pad PP142 included in the last solar cell of each of the cell strings ST-1, ST-2, and ST-3.

Next, as shown in FIG. 36B, the first auxiliary electrode pad PP141 or the second auxiliary electrode pad PP142 included in the last solar cell of each of the cell strings ST-1, ST-2, and ST-3 may be aligned to overlap the conductive ribbons RB1 and RB2.

Figure 35G:
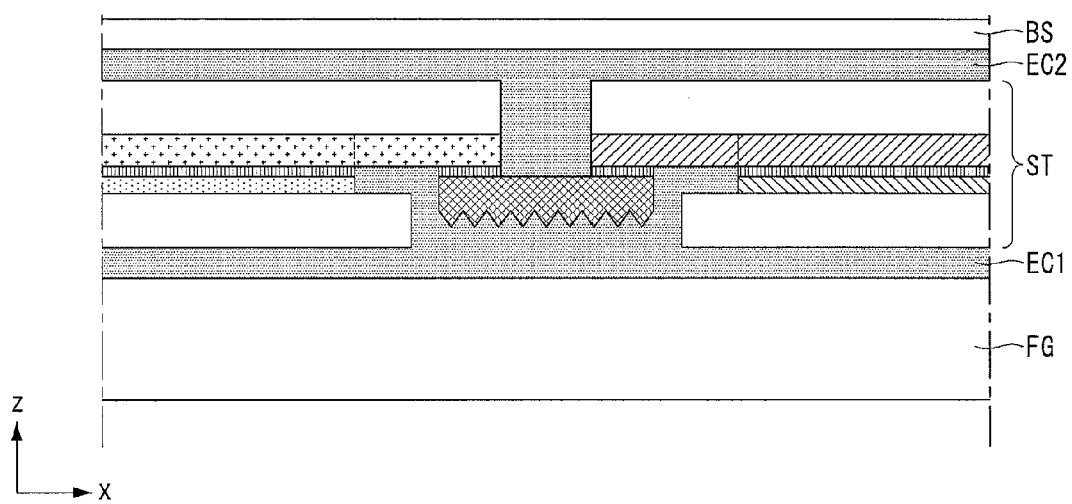

Since the operations subsequent to FIG. 36B are substantially the same as those described in FIGS. 35F and 35G, a further description may be briefly made or may be entirely omitted. In this instance, the last solar cells of the cell strings ST-1, ST-2, and ST-3 need to be particularly manufactured, so as to connect the cell strings ST-1, ST-2, and ST-3 using the conductive ribbons RB1 and RB2. Therefore, the method for manufacturing the solar cell and the solar cell module may be further simplified.

So far, the embodiment of the invention described the method for manufacturing the solar cell module, in which the front glass substrate FG is disposed and then the cell strings ST-1, ST-2, and ST-3 are disposed on the back surface of the front glass substrate FG. However, on the contrary, the front surfaces of the cell strings ST-1, ST-2, and ST-3 may be disposed upwardly in a state where the lower encapsulant EC2 and the back sheet BS are first disposed. This is described in detail below.

FIGS. 37A to 37G illustrate a third embodiment of a method for manufacturing the solar cell module shown in FIGS. 1 to 28.

The third embodiment describes a method for manufacturing the solar cell module, in which the back sheet BS is formed in the form of sheet, as an example. However, the third embodiment may be equally applied to the solar cell module, in which the back sheet BS is formed in the form of plate.

Figure 37A:
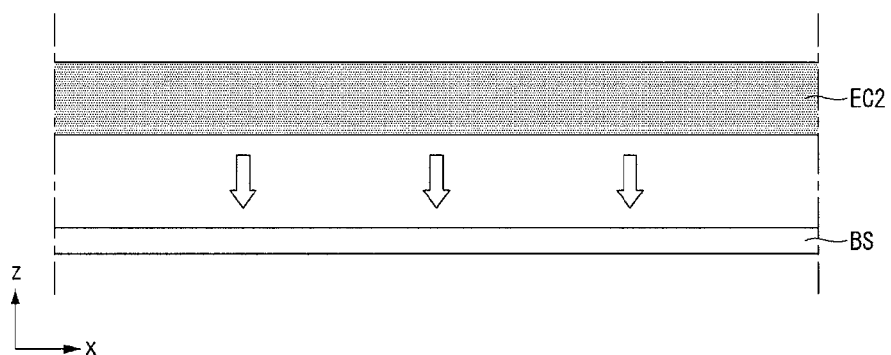
FIGS. 37A to 37G illustrate a third embodiment of a method for manufacturing the solar cell module shown in FIGS. 1 to 28.

First, as shown in FIG. 37A, in the third embodiment of the method for manufacturing the solar cell module, the lower encapsulant EC2 may be applied to the front surface of the back sheet BS in a state where the back sheet BS is first disposed.

Figure 37B:
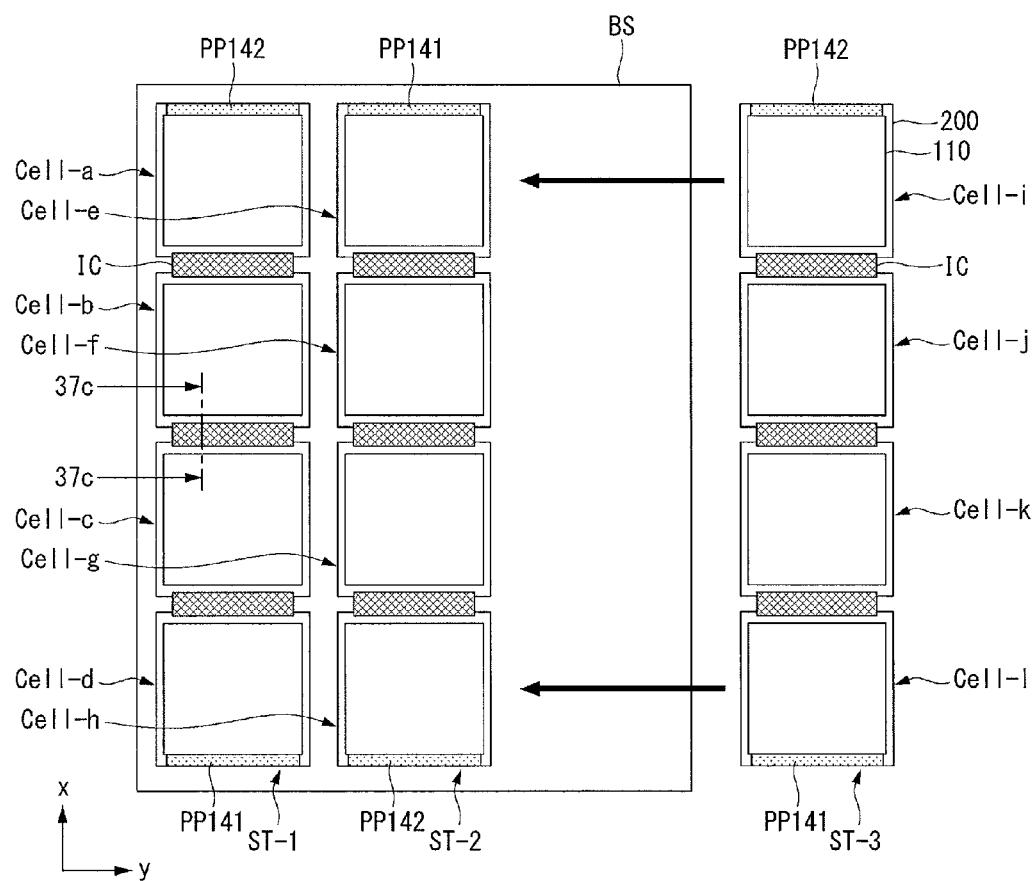
Figure 37C:
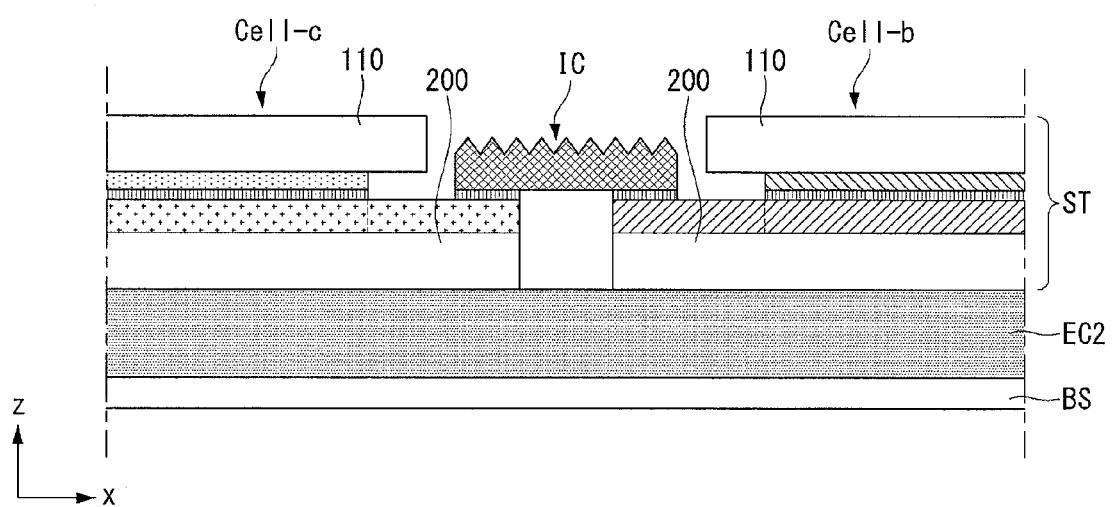

Next, as shown in FIGS. 37B and 37C, the front surfaces of the semiconductor substrates 110 of the solar cells included in each of the cell strings ST-1, ST-2, and ST-3 may be disposed upwardly.

Hence, as shown in FIG. 37B, in each of the plurality of solar cells included in each of the cell strings ST-1, ST-2, and ST-3, the front surface of the semiconductor substrate 110 and the front surface of the insulating member 200 may be exposed. The second area of the first auxiliary electrode pad PP141 and the second area of the second auxiliary electrode pad PP142 of the last solar cell included in each of the cell strings ST-1, ST-2, and ST-3 may be naturally exposed to the outside.

Accordingly, the second auxiliary electrode pad PP142 of the last solar cell Cell-a of the first cell string ST-1 and the second auxiliary electrode pad PP142 of the last solar cell Cell-e of the second cell string ST-2 may be naturally exposed to the outside.

Figure 37D:
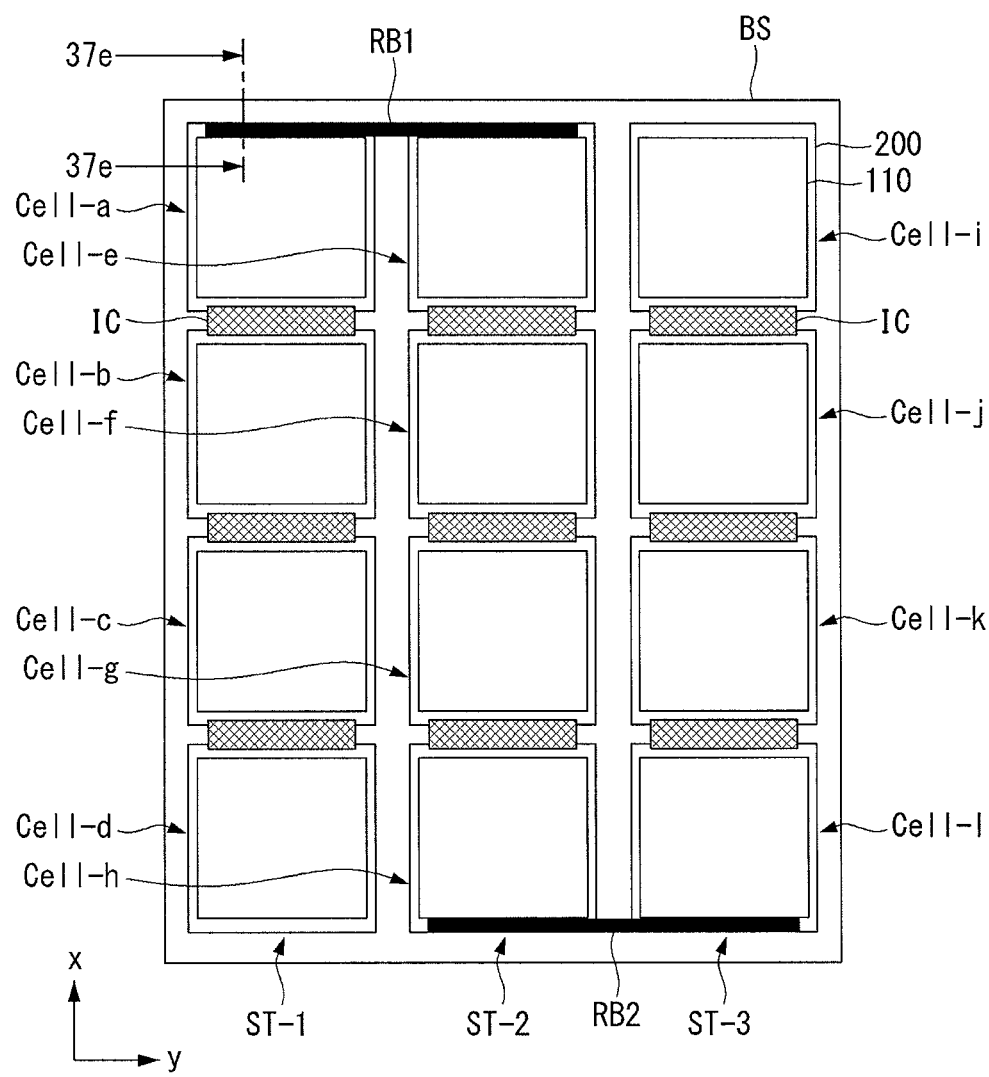

Accordingly, as shown in FIG. 37D, in the last solar cell included in each of the cell strings ST-1, ST-2, and ST-3, the first auxiliary electrode pad PP141 and the second auxiliary electrode pad PP142 exposed to the outside may be easily connected using the conductive ribbon RB1.

Figure 37E:
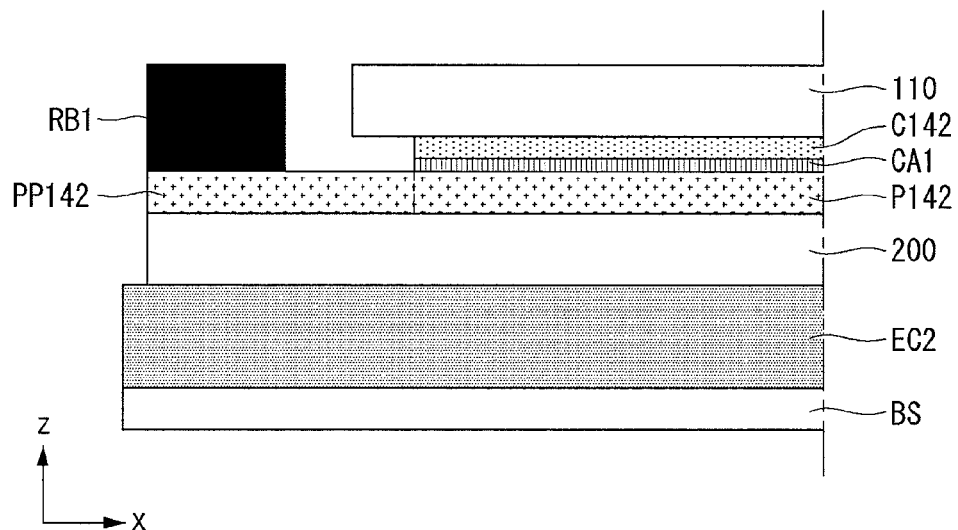

In this instance, a cross section of the last solar cell of the first string, to which the conductive ribbons RB1 and RB2 are connected, is shown in FIG. 37E.

Figure 37F:
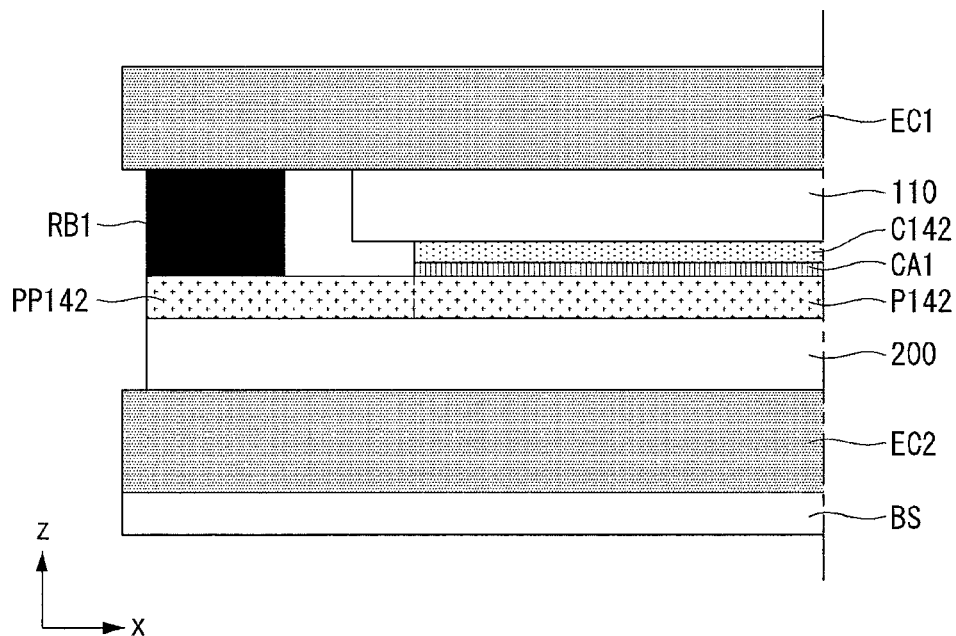
Figure 37G:
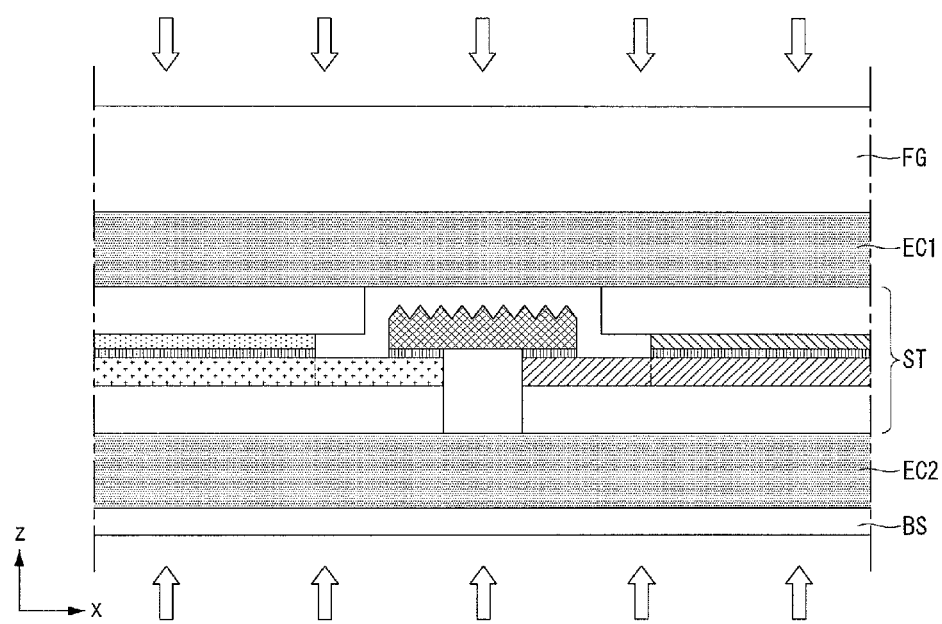

Next, as shown in FIG. 37F, the upper encapsulant EC1 may be applied to the front surfaces of the conductive ribbons RB1 and RB2 and the front surfaces of the cell strings ST-1, ST-2, and ST-3. As shown in FIG. 37G, the front glass substrate FG may be disposed on the upper encapsulant EC1, and then the solar cell module may be completed through the lamination process.

As described above, because the first auxiliary electrode pads PP141 and the second auxiliary electrode pads PP142 of the cell strings ST-1, ST-2, and ST-3 are exposed to the outside in the manufacturing process in the third embodiment of the method for manufacturing the solar cell module, the connection of the conductive ribbons RB1 and RB2 may be easily performed. Hence, the method for manufacturing the solar cell module may be more easily performed.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
   a first solar cell and a second solar cell, each of the first solar cell and the second solar cell including:
   a semiconductor substrate,
   a plurality of first electrodes formed on a back surface of the semiconductor substrate,
   a plurality of second electrodes formed on the back surface of the semiconductor substrate,
   a first auxiliary electrode connected to the plurality of first electrodes,
   a second auxiliary electrode connected to the plurality of second electrodes, and
   an insulating member positioned on back surfaces of the first auxiliary electrode and the second auxiliary electrode; and
   an interconnector configured to electrically connect the first solar cell and the second solar cell,
   wherein the insulating member includes a first insulating member included in the first solar cell and a second insulating member included in the second solar cell, and the first and second insulating members are separated from each other,
   the interconnector is positioned between the first solar cell and the second solar cell, and electrically connected to the first solar cell and the second solar cell, and
   a portion of the interconnector is overlapped and connected with a front face of the first auxiliary electrode of the first solar cell, and is overlapped and connected with a front face of the second auxiliary electrode of the second solar cell.

2. The solar cell module of claim 1, further comprising:
   a front glass substrate positioned on a front surface of a cell string formed by electrically connecting the first solar cell and the second solar cell through the interconnector;
   an upper encapsulant positioned between the front glass substrate and the cell string;
   a lower encapsulant positioned on a back surface of the cell string; and
   a back sheet positioned on a back surface of the lower encapsulant.

3. The solar cell module of claim 1, wherein the interconnector and the semiconductor substrate of the first solar cell or the second solar cell do not overlap each other and are separated from each other.

4. The solar cell module of claim 1, wherein the insulating member of the first solar cell does not overlap the semiconductor substrate of the second solar cell, and the insulating member of the second solar cell does not overlap the semiconductor substrate of the first solar cell.

5. The solar cell module of claim 1, wherein in each of the first solar cell and the second solar cell, an area of the insulating member is equal to or greater than an area of the semiconductor substrate and is less than two times the area of the semiconductor substrate.

6. The solar cell module of claim 1, wherein in each of the first solar cell and the second solar cell, each of the first auxiliary electrode and the second auxiliary electrode extends in a first direction,
   the first auxiliary electrode has a first auxiliary electrode pad extending in a second direction crossing the first direction at an end extending in the first direction, and
   the second auxiliary electrode has a second auxiliary electrode pad extending in the second direction at an end extending in the first direction.

7. The solar cell module of claim 6, wherein in each of the first solar cell and the second solar cell,
   each of the first auxiliary electrode pad and the second auxiliary electrode pad includes a first area overlapping the semiconductor substrate and a second area not overlapping the semiconductor substrate.

8. The solar cell module of claim 6, wherein the first auxiliary electrode pad included in the first solar cell and the second auxiliary electrode pad included in the second solar cell are separated from each other.

9. The solar cell module of claim 7, wherein the interconnector electrically connects the first auxiliary electrode pad of the first solar cell to the second auxiliary electrode pad of the second solar cell, or electrically connects the second auxiliary electrode pad of the first solar cell to the first auxiliary electrode pad of the second solar cell.

10. The solar cell module of claim 9, wherein in each of the first solar cell and the second solar cell, the second area of the first auxiliary electrode pad and the second area of the second auxiliary electrode pad overlap the interconnector and are connected to the interconnector.

11. The solar cell module of claim 10, wherein in each of the first solar cell and the second solar cell,
    the interconnector and the first auxiliary electrode are electrically connected to each other by a conductive adhesive, or
    the interconnector and the second auxiliary electrode pad are electrically connected to each other by the conductive adhesive.

12. The solar cell module of claim 10, wherein the interconnector and the first auxiliary electrode pad physically contact each other and are electrically connected to each other, or the interconnector and the second auxiliary electrode pad physically contact each other and are electrically connected to each other.

13. The solar cell module of claim 1, wherein a front surface of the interconnector is formed as an uneven surface, and a thickness of the interconnector is non-uniform.

14. The solar cell module of claim 1, wherein a thickness of the interconnector is uniform, and the interconnector has a zigzag shape.

15. The solar cell module of claim 1, further comprising:
    a first cell string and a second string, each of which is formed by connecting a plurality of solar cells, each of which is formed as the individual integrated type element, in series in a first direction through the interconnector; and a conductive ribbon configured to connect the first cell string and the second string in series in a second direction crossing the first direction.

16. The solar cell module of claim 15, wherein a first auxiliary electrode pad of a last solar cell of the first cell string is connected to a second auxiliary electrode pad of a last solar cell of the second cell string through the conductive ribbon, or a second auxiliary electrode pad of the last solar cell of the first cell string is connected to a first auxiliary electrode pad of the last solar cell of the second cell string through a conductive ribbon.

17. The solar cell module of claim 16, wherein the conductive ribbon is connected to the front face of the first auxiliary electrode pad or the front face of the second auxiliary electrode pad of the last solar cell of the first cell string or the second string.

18. The solar cell module of claim 16, wherein the first auxiliary electrode pad or the second auxiliary electrode pad of the last solar cell of the first cell string or the second string covers a portion of a back surface of the insulating member, and the conductive ribbon is connected to the first auxiliary electrode pad or the second auxiliary electrode pad formed on the portion of the back surface of the insulating member.

19. The solar cell module of claim 16, wherein in the last solar cell of the first cell string or the second string, the first auxiliary electrode pad or the second auxiliary electrode pad, to which the conductive ribbon is connected, includes a portion more projecting than an end of the insulating member, and the conductive ribbon is connected to the portion.

20. The solar cell module of claim 16, wherein the last solar cell of each of the first cell string and the second string is a solar cell, in which the insulating member is removed in each of the first solar cell and the second solar cell, and wherein the conductive ribbon is connected to a back face of the first auxiliary electrode pad or a back face of the second auxiliary electrode pad of the last solar cell.

* * * * *